US012720972B2

(12) United States Patent
Son et al.

(10) Patent No.: US 12,720,972 B2
(45) Date of Patent: Aug. 25, 2026

(54) ELECTRONIC DEVICE

(71) Applicant: Samsung Display Co., Ltd., Yongin-si (KR)

(72) Inventors: Donghyun Son, Yongin-si (KR); Sola Lee, Yongin-si (KR); Kyung Hyun Choi, Yongin-si (KR); Kiyoung Kim, Yongin-si (KR); Jongseok Kim, Yongin-si (KR)

(73) Assignee: Samsung Display Co., LTD., Gyeonggi-do (KR)

(*) Notice: Subject to any disclaimer, the term of this patent is extended or adjusted under 35 U.S.C. 154(b) by 414 days.

(21) Appl. No.: 18/350,823

(22) Filed: Jul. 12, 2023

(65) Prior Publication Data

US 2024/0023387 A1 Jan. 18, 2024

(30) Foreign Application Priority Data

Jul. 14, 2022 (KR) ........................ 10-2022-0086901

(51) Int. Cl.

| | |
|---|---|
| ***H10K 59/126*** | (2023.01) |
| ***H10D 86/40*** | (2025.01) |
| ***H10D 86/60*** | (2025.01) |
| ***H10K 59/121*** | (2023.01) |
| ***H10K 59/122*** | (2023.01) |
| ***H10K 59/123*** | (2023.01) |
| ***H10K 59/124*** | (2023.01) |
| ***H10K 59/131*** | (2023.01) |

(Continued)

(52) U.S. Cl.
CPC .................................. *H10K 59/126* (2023.02)

(58) Field of Classification Search
CPC .... H10K 59/126; H10K 59/131; H10K 59/38; H10K 59/50; H10K 50/8428; H10K 50/844; H10K 2102/351; H10D 86/40
See application file for complete search history.

(56) References Cited

U.S. PATENT DOCUMENTS

| | | | |
|---|---|---|---|
| 9,658,145 | B2 | 5/2017 | Jeong et al. |
| 10,840,317 | B2 | 11/2020 | Oh et al. |

(Continued)

FOREIGN PATENT DOCUMENTS

| | | |
|---|---|---|
| KR | 10-2019-0108224 A | 9/2019 |
| KR | 10-2020-0102580 | 9/2020 |

(Continued)

*Primary Examiner* — Mohsen Ahmadi
(74) *Attorney, Agent, or Firm* — Harness, Dickey & Pierce, P.L.C.

(57) ABSTRACT

An electronic device includes a display panel including a first area and a second area. The display panel includes a barrier layer including a first lower light blocking layer disposed in the first area and a second lower light blocking layer disposed in the second area, the first lower light blocking layer and the second lower light blocking layer disposed on a same layer and a circuit layer including a first pixel circuit disposed in the first area and a second pixel circuit disposed in the second area. The first pixel circuit includes a plurality of first-type transistors, the second pixel circuit includes a plurality of second-type transistors, the first lower light blocking layer entirely overlaps the first-type transistors, and the second lower light blocking layer overlaps some of the second-type transistors and does not overlap the other of the second-type transistors.

16 Claims, 32 Drawing Sheets

(51) Int. Cl.

| | |
|---|---|
| ***H10K 59/35*** | (2023.01) |
| ***H10K 59/38*** | (2023.01) |
| ***H10K 59/50*** | (2023.01) |
| ***H10K 59/80*** | (2023.01) |
| ***H10K 102/00*** | (2023.01) |

(56) References Cited

U.S. PATENT DOCUMENTS

| | | | | |
|---|---|---|---|---|
| 11,587,999 | B2 | 2/2023 | Bok et al. | |
| 2017/0148856 | A1* | 5/2017 | Choi | H10K 59/873 |
| 2020/0273927 | A1* | 8/2020 | Oh | H10K 59/121 |
| 2020/0365674 | A1 | 11/2020 | Jeon et al. | |
| 2021/0191552 | A1* | 6/2021 | Bok | G09G 3/32 |
| 2021/0193773 | A1* | 6/2021 | Park | H10K 59/131 |
| 2021/0305521 | A1* | 9/2021 | Han | C08G 73/1071 |
| 2021/0359047 | A1* | 11/2021 | Yoon | H10K 59/122 |
| 2021/0376279 | A1* | 12/2021 | Jeon | H10D 86/481 |
| 2021/0389845 | A1* | 12/2021 | Han | G06F 3/0448 |
| 2022/0052129 | A1* | 2/2022 | Kim | H10K 59/121 |
| 2022/0059633 | A1* | 2/2022 | Kang | H10K 59/121 |
| 2022/0069255 | A1* | 3/2022 | You | H10K 59/80517 |
| 2022/0181593 | A1* | 6/2022 | Kim | G06F 3/0446 |
| 2022/0367772 | A1* | 11/2022 | Oh | H10W 90/00 |
| 2022/0399407 | A1* | 12/2022 | Cha | H10K 59/352 |
| 2023/0030096 | A1* | 2/2023 | Lee | H10K 59/124 |
| 2023/0071577 | A1* | 3/2023 | Woo | G09G 3/3241 |

FOREIGN PATENT DOCUMENTS

| | | |
|---|---|---|
| KR | 10-2021-0078649 A | 6/2021 |
| KR | 10-2021-0142808 | 11/2021 |
| KR | 10-2022-0020484 | 2/2022 |

* cited by examiner

XX'
DR3
DR2
DR1
AM
A1
A2
PDL
PDL2
PDL1
HSPC
UHSPC
USPC
TP
PX1r
EP
PX1b
PX1g
PXU1
PXU1n
PXA1r
PXA1g
PXA1b
PXA3g
PXCg
PXA3r
PXCr
PXCb
PXA3b
AEcn
PXA2b
PXA2g
PXA2r
SPC
PX2r
PX2g
PX2b
PXU2
PXU2a
PXU2b
PX3b
PX3r
PX3g
II
II'
III
III'

ACT1 : AC11, ACD

CDL1 : C11, C12, C13, C14, C15, C16, C17

CDL2 : C210, C211, C212, C213

ACT2 : AC21

CDL3 : C31, C32, C33, C34, C35, C36

CDL4 : C41, C42, C43, C44, C45,
C46, C47, C48, C49,
C410, C411, C412, C413

CDL5 : C51, C52, C53, C54, C55, C56, C57

CDL5 : C58, C59, C510

ELECTRONIC DEVICE

This application claims priority to and benefits of Korean Patent Application No. 10-2022-0086901 under 35 U.S.C. § 119, filed on Jul. 14, 2022, the entire contents of which are incorporated hereby by reference.

BACKGROUND

1. Technical Field

Embodiments relate to an electronic device including a display panel with a transmission area.

2. Description of the Related Art

An electronic device includes various electronic parts such as a display panel, an electronic module, and the like. The electronic module includes a camera, an infrared sensor, or a proximity sensor. The electronic module is disposed under the display panel. A portion of the display panel has a transmittance higher than that of another portion of the display panel. The electronic module receives external inputs or provides outputs through the portion of the display panel with high transmittance.

SUMMARY

Embodiments provide an electronic device including a display panel that is capable of improving transmittance of a transmission area thereof and is implemented by simplified manufacturing process and with reduced manufacturing cost.

However, embodiments of the disclosure are not limited to those set forth herein. The above and other embodiments will become more apparent to one of ordinary skill in the art to which the disclosure pertains by referencing the detailed description of the disclosure given below.

In an embodiment, an electronic device may include a display panel including a first area including a transmission area and an element area and a second area spaced apart from the first area. The display panel may include a base layer, a barrier layer disposed on the base layer and including a first lower light blocking layer disposed in the first area and a second lower light blocking layer disposed in the second area, the first lower light blocking layer and the second lower light blocking layer disposed on a same layer, a circuit layer disposed on the barrier layer and including a first pixel circuit disposed in the first area and a second pixel circuit disposed in the second area, an element layer disposed on the circuit layer and including a first light emitting element electrically connected to the first pixel circuit and a second light emitting element electrically connected to the second pixel circuit, and an encapsulation layer disposed on the element layer. The first pixel circuit may include a plurality of first-type transistors, the second pixel circuit may include a plurality of second-type transistors, the first lower light blocking layer may entirely overlap the plurality of first-type transistors, and the second lower light blocking layer may overlap some of the second-type transistors and may not overlap the other of the second-type transistors.

The first lower light blocking layer may be electrically insulated from the second lower light blocking layer.

A constant voltage having a certain voltage level may be provided to the first lower light blocking layer, and a power source voltage provided to the second pixel circuit may be provided to the second lower light blocking layer.

The barrier layer may further include a plurality of sub-barrier layers including an upper sub-barrier layer closest to the circuit layer, and the upper sub-barrier layer of the plurality of sub-barrier layers may have a thickness greater than a thickness of each of the other sub-barrier layers of the plurality of sub-barrier layers.

The first lower light blocking layer and the second lower light blocking layer may be disposed under the upper sub-barrier layer.

The barrier layer may further include a first sub-barrier layer disposed on the base layer, a second sub-barrier layer disposed on the first sub-barrier layer, a third sub-barrier layer disposed on the second sub-barrier layer, a fourth sub-barrier layer disposed on the third sub-barrier layer, and a fifth sub-barrier layer disposed on the fourth sub-barrier layer. The first lower light blocking layer and the second lower light blocking layer may be disposed between the fourth sub-barrier layer and the fifth sub-barrier layer.

The fifth sub-barrier layer has a thickness greater than a sum of a thickness of the first sub-barrier layer, a thickness of the second sub-barrier layer, a thickness of the third sub-barrier layer, and a thickness of the fourth sub-barrier layer.

Each of the first lower light blocking layer and the second lower light blocking layer may include molybdenum.

Each of the first lower light blocking layer and the second lower light blocking layer may include a first sub-lower light blocking layer including titanium and a second sub-lower light blocking layer disposed on the first sub-lower light blocking layer and including molybdenum.

The display panel may further include an intermediate area defined between the first area and the second area, the circuit layer may further include a third pixel circuit disposed in the intermediate area, the element layer may further include a third light emitting element electrically connected to the third pixel circuit and a copy light emitting element electrically connected to the third pixel circuit, and the first lower light blocking layer and the second lower light blocking layer may not overlap the copy light emitting element.

The copy light emitting element may include a pixel electrode that is connected to a pixel electrode of the third light emitting element and is integral with the pixel electrode of the third light emitting element.

The copy light emitting element may be disposed closer to the first light emitting element than the third light emitting element is.

The circuit layer may further include a plurality of conductive layers, a plurality of inorganic layers, and a plurality of organic layers, the plurality of organic layers may include a common organic layer commonly disposed in the transmission area and the element area, and a first thickness of the common organic layer in the transmission area may be smaller than a second thickness of the common organic layer in the element area.

The first thickness of the common organic layer in the transmission area may be equal to or greater than about 40% and smaller than about 100% of the second thickness of the common organic layer in the element area.

The first thickness of the common organic layer in the transmission area may be equal to or greater than about 6,000 angstroms and equal to or smaller than about, 10,000 angstroms, and the second thickness of the common organic layer in the element area may be about 15,000 angstroms.

The plurality of inorganic layers may not overlap the transmission area.

The electronic device may further include a buffer layer disposed between the base layer and the circuit layer, and the buffer layer may not overlap the transmission area.

The display panel may further include an intermediate area defined between the first area and the second area, a pixel definition layer disposed on the circuit layer and including a plurality of pixel definition openings defined therethrough to define a plurality of light emitting areas, a first spacer disposed on the pixel definition layer and disposed in the second area and the intermediate area, a plurality of first protruded spacers disposed on the first spacer and disposed in the second area, a second spacer disposed on the pixel definition layer and disposed in the first area, and a second protruded spacer disposed on the second spacer, and the plurality of first protruded spacers may not overlap the intermediate area.

In an embodiment, an electronic device may include a display panel including a first area including a transmission area and an element area and a second area spaced apart from the first area. The display panel may include a base layer, a barrier layer disposed on the base layer and including a plurality of sub-barrier layers, a first lower light blocking layer disposed in the first area, and a second lower light blocking layer disposed in the second area, a circuit layer disposed on the barrier layer and including a plurality of pixel circuits, an element layer disposed on the circuit layer and including a plurality of light emitting elements electrically connected to the plurality of pixel circuits, and an encapsulation layer disposed on the element layer. The first lower light blocking layer and the second lower light blocking layer may be covered by an upper sub-barrier layer of the plurality of sub-barrier layers that is closest to the circuit layer among the plurality of sub-barrier layers, and the upper sub-barrier layer of the plurality of sub-barrier layers may have a thickness greater than a thickness of each of the other sub-barrier layers of the plurality of sub-barrier layers.

The circuit layer may further include a plurality of conductive layers, a plurality of inorganic layers, and a plurality of organic layers, the plurality of organic layers may include a common organic layer commonly disposed in the transmission area and the element area, and a first thickness of the common organic layer in the transmission area may be equal to or greater than about 40% and smaller than about 100% of a second thickness of the common organic layer in the element area.

The display panel may further include an intermediate area defined between the first area and the second area, the plurality of pixel circuits may include an intermediate pixel circuit disposed in the intermediate area, the plurality of light emitting elements may include an intermediate light emitting element and a copy light emitting element, which are electrically connected to the intermediate pixel circuit, and a pixel electrode of the copy light emitting element may be connected to a pixel electrode of the intermediate light emitting element and may be integral with the pixel electrode of the intermediate light emitting element.

The copy light emitting element may be disposed to be closer to the first area than the intermediate light emitting element is, and the first lower light blocking layer and the second lower light emitting layer may not overlap the copy light emitting element.

In an embodiment, an electronic device may include a display panel including a first area including a transmission area and an element area and a second area spaced apart from the first area. The display panel may include a base layer, a barrier layer disposed on the base layer and including a first lower light blocking layer disposed in the first area and a second lower light blocking layer disposed in the second area, the first lower light blocking layer and the second lower light blocking layer disposed on a same layer, a circuit layer disposed on the barrier layer and including a plurality of conductive layers, a plurality of inorganic layers, and a plurality of organic layers, an element layer disposed on the circuit layer and including a light emitting element, and an encapsulation layer disposed on the element layer. The plurality of organic layers may include a common organic layer commonly disposed in the transmission area and the element area, and a first thickness of the common organic layer in the transmission area may be equal to or greater than about 40% and smaller than about 100% of a second thickness of the common organic layer in the element area.

The circuit layer may further include a pixel circuit electrically connected to the light emitting element, a constant voltage having a certain voltage level may be provided to the first lower light blocking layer, and a power source voltage provided to the pixel circuit may be provided to the second lower light blocking layer.

The barrier layer may further include a plurality of sub-barrier layers including an upper sub-barrier layer closest to the circuit layer among the plurality of sub-barrier layers, the upper sub-barrier layer of the plurality of sub-barrier layers may have a thickness greater than a thickness of each of the other sub-barrier layers, and the first lower light blocking layer and the second lower light blocking layer may be disposed under the upper sub-barrier layer and may be directly in contact with the upper sub-barrier layer.

According to the above, the first lower light blocking layer disposed in the first area and the second lower light blocking layer disposed in the second area may be disposed on the same layer as each other and may be substantially simultaneously formed by the same process. Thus, compared with a manufacturing process of the first lower light blocking layer and the second lower light blocking layer that are disposed on different layers from each other, a mask process may be omitted one time. Accordingly, the manufacturing process of the display panel may be simplified, and the cost of manufacturing the display panel may be reduced.

The common organic layer may be provided to both the transmission area and the element area. A portion of the common organic layer overlapping the transmission area may be removed in a thickness direction. The first thickness of the common organic layer overlapping the transmission area may be smaller than the second thickness of the common organic layer overlapping the element area. The first thickness may be determined within a certain range by taking into account an improvement of transmittance in the transmission area, diffraction relaxation, and reliability of conductive layer patterning process on the common organic layer.

The upper sub-barrier layer covering the first and second lower light blocking layers among the sub-barrier layers has the greatest thickness. Accordingly, the degree of change in characteristics of the transistors due to the voltages provided to the first and second lower light blocking layers may be reduced.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1A:
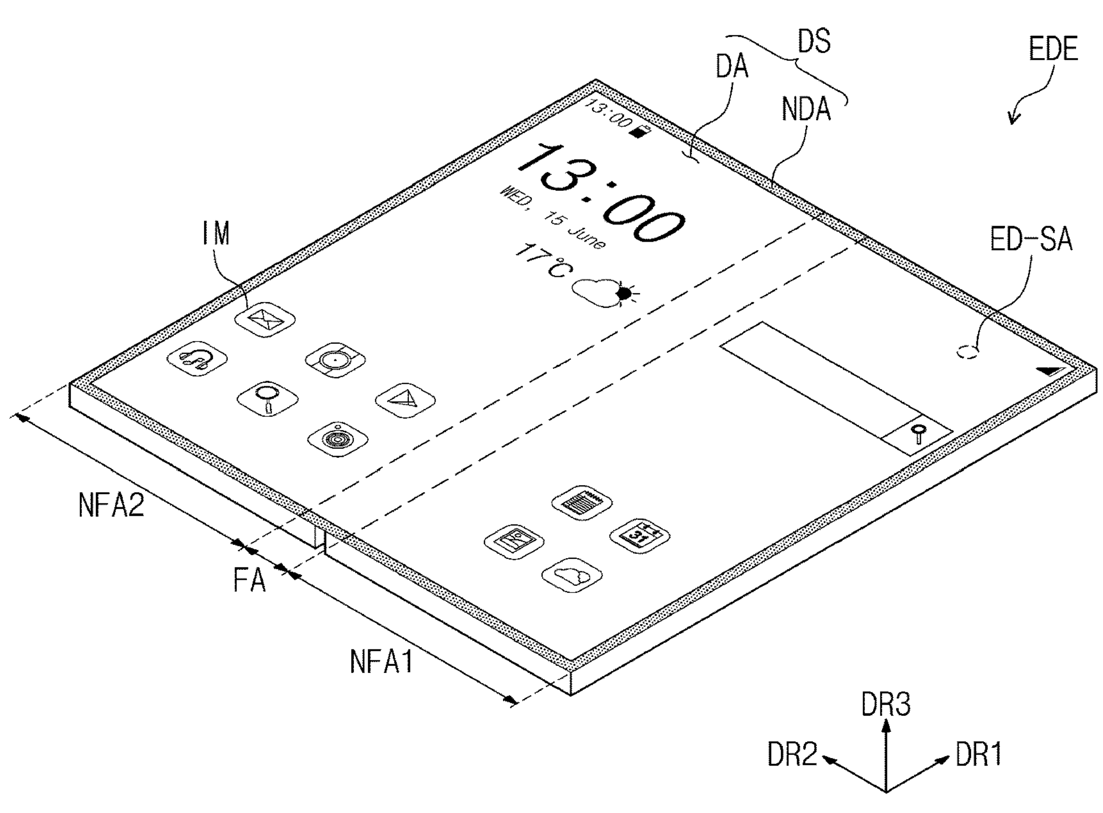
FIGS. 1A and 1B are schematic perspective views showing an electronic device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Hereinafter, embodiments will be described with reference to accompanying drawings.

Figure 1B:
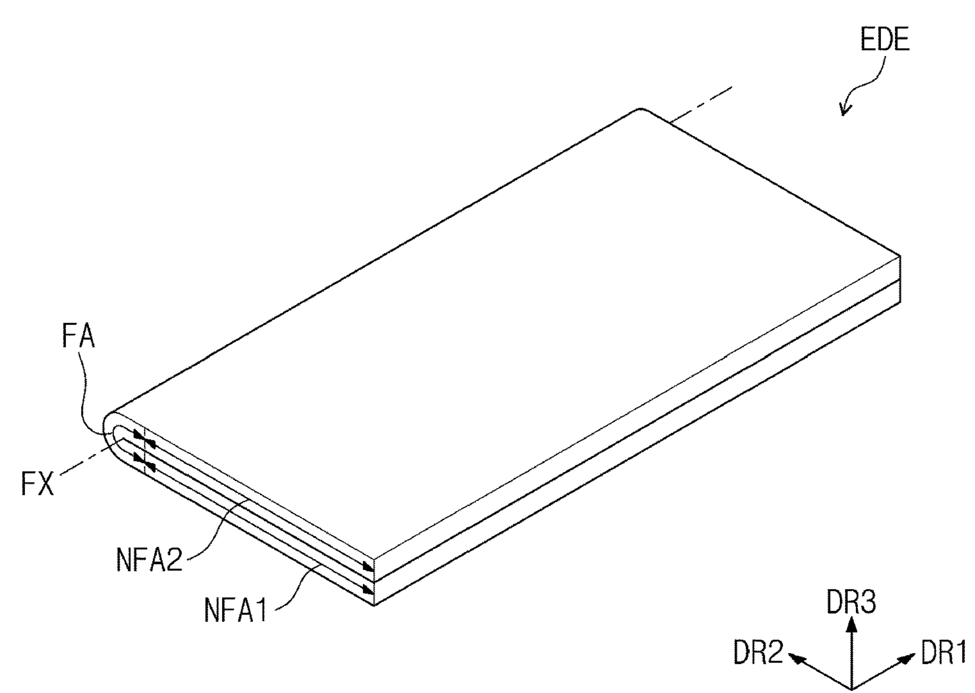

FIGS. 1A and 1B are schematic perspective views showing an electronic device EDE according to an embodiment. FIG. 1A shows an unfolded state of the electronic device EDE, and FIG. 1B shows a folded state of the electronic device EDE.

Referring to FIGS. 1A and 1B, the electronic device EDE may include a display surface DS defined by a first direction DR1 and a second direction DR2 intersecting the first direction DR1. The electronic device EDE may display an image IM to a user through the display surface DS.

The display surface DS may include a display area DA and a non-display area NDA around the display area DA. The image IM may be displayed through the display area DA and may not be displayed through the non-display area NDA. The non-display area NDA may surround the display area DA, however, embodiments are not limited thereto or thereby, and the shape of the display area DA and the shape of the non-display area NDA may be changed.

Hereinafter, a direction substantially perpendicular to a plane defined by the first direction DR1 and the second direction DR2 may be referred to as a third direction DR3. In the disclosure, the expression "when viewed in a plane" may mean a state of being viewed in the third direction DR3.

A sensing area ED-SA may be defined in the display area DA of the electronic device EDE. FIG. 1A shows one sensing area ED-SA as a representative example, however, the number of the sensing areas ED-SA should not be limited thereto or thereby. The sensing area ED-SA may be a portion of the display area DA. Accordingly, the electronic device EDE may display the image through the sensing area ED-SA.

The electronic device EDE may include an electronic module disposed in an area overlapping the sensing area ED-SA. The electronic module may receive an external input provided from the outside through the sensing area ED-SA or may output a signal through the sensing area ED-SA. As an example, the electronic module may be a camera module, a sensor that measures a distance, such as a proximity sensor, a sensor that recognizes (or senses) a part of a user's body, e.g., a fingerprint, an iris, or a face, or a small lamp that outputs a light, however, embodiments are not limited thereto. Hereinafter, the camera module will be described as the electronic module overlapping the sensing area ED-SA.

The electronic device EDE may include a folding area FA and non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA may be referred to as a foldable area, and the first and second non-folding areas NFA1 and NFA2 may be referred to as first and second non-foldable areas, respectively.

As shown in FIG. 1B, the folding area FA may be folded with respect to a folding axis FX substantially parallel to the first direction DR1. The folding area FA may have a certain curvature and a radius of curvature in case that the electronic device EDE is in the folded state. The electronic device EDE may be inwardly folded (e.g., by an inner-folding operation). Thus, the first non-folding area NFA1 may face the second non-folding area NFA2, and the display surface DS may not be exposed to the outside.

According to an embodiment, the electronic device EDE may be outwardly folded (e.g., by an outer-folding operation) such that the display surface DS may be exposed to the outside. According to an embodiment, the electronic device EDE may perform the inner-folding operation and an unfolding operation or may perform the outer-folding operation and the unfolding operation. According to an embodiment, the electronic device EDE may perform any one of the unfolding operation, the inner-folding operation, and the outer-folding operation. According to an embodiment, folding axes may be defined in the electronic device EDE, and the electronic device EDE may be inwardly or outwardly folded with respect to each folding axis.

FIGS. 1A and 1B show the foldable electronic device EDE as a representative example, however, embodiments are not limited to the foldable electronic device EDE. As an example, the disclosure may be applied to a rigid electronic device, e.g., an electronic device that does not include the folding area FA.

Figure 2A:
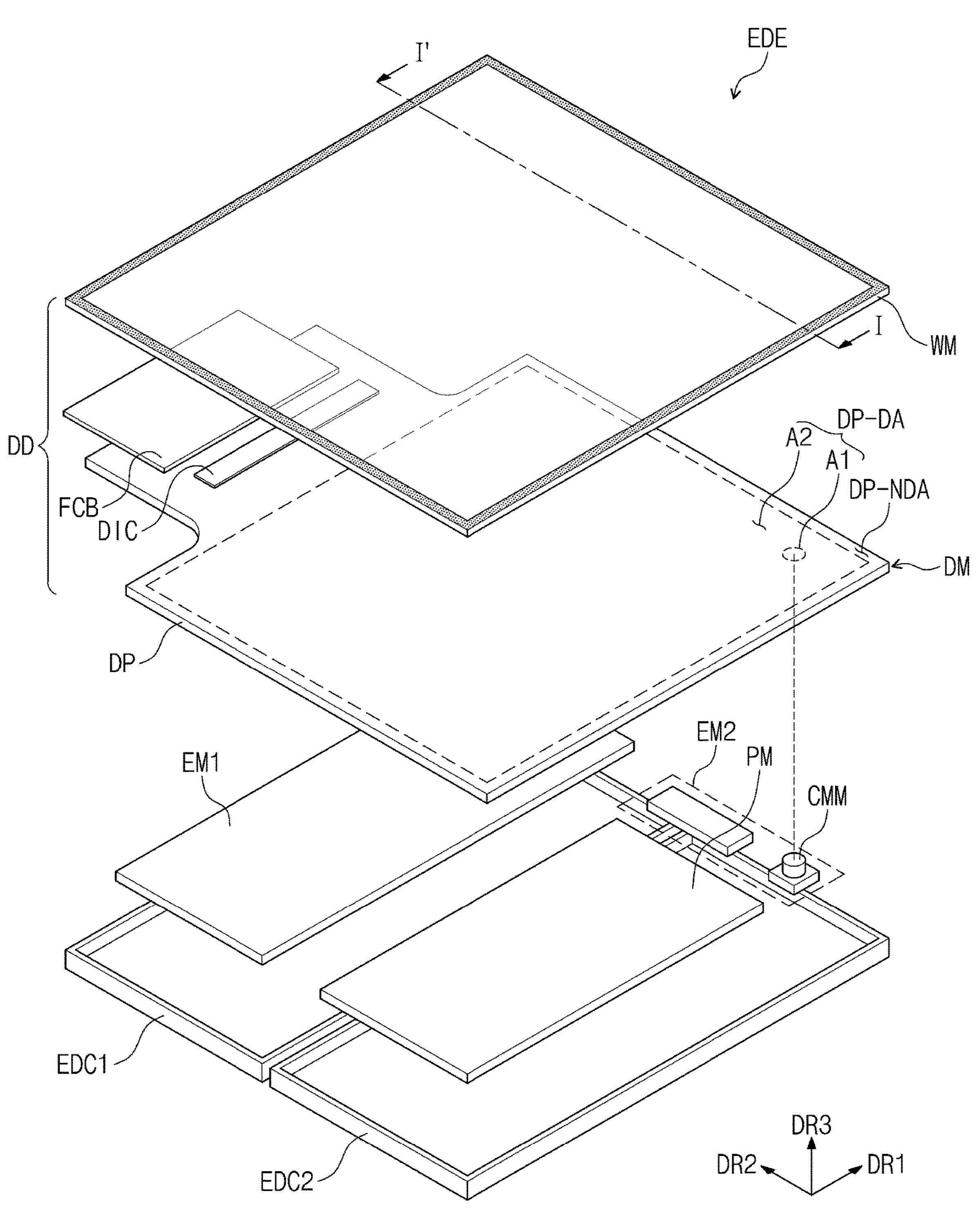
FIG. 2A is a schematic exploded perspective view showing an electronic device according to an embodiment.
Figure 2B:
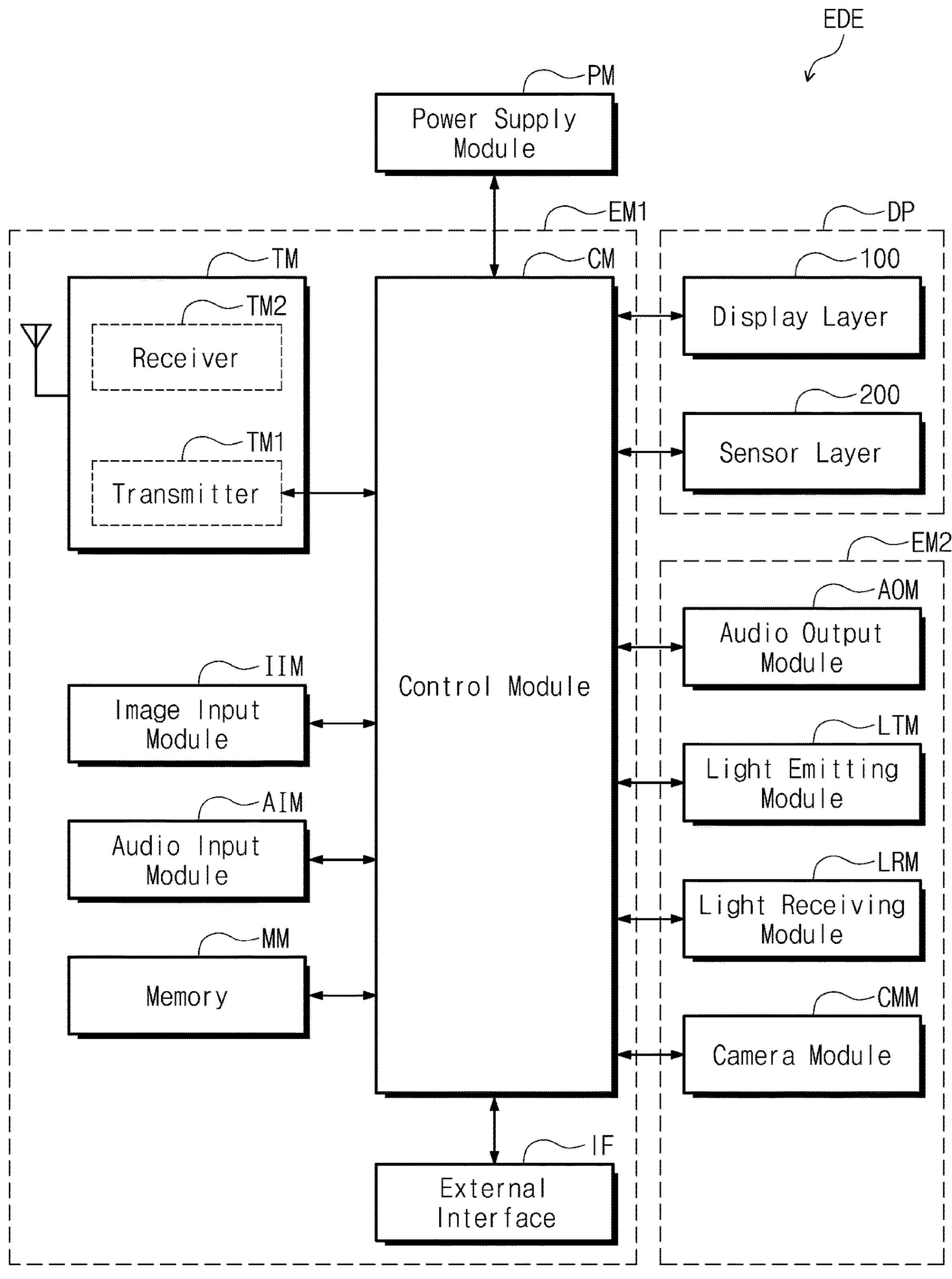
FIG. 2B is a block diagram showing an electronic device according to an embodiment.

FIG. 2A is a schematic exploded perspective view showing the electronic device EDE according to an embodiment. FIG. 2B is a block diagram showing the electronic device EDE according to an embodiment.

Referring to FIGS. 2A and 2B, the electronic device EDE may include a display device DD, a first electronic module EM1, a second electronic module EM2, a power supply module PM, and housings EDC1 and EDC2. For example, the electronic device EDE may further include a mechanical structure to control a folding operation of the display device DD.

The display device DD may include a window module WM and a display module DM. The window module WM may form a front surface of the electronic device EDE. The display module DM may include at least a display panel DP. The display module DM may generate the image and may sense the external input.

Although the display module DM is shown to be the same as the display panel DP in FIG. 2A, the display module DM may have a stack structure in which a plurality of components including the display panel DP are stacked each other. Detailed descriptions on the stack structure of the display module DM will be described below.

The display panel DP may include a display area DP-DA and a non-display area DP-NDA, which respectively correspond to (or overlap) the display area DA (refer to FIG. 1A) and the non-display area NDA (refer to FIG. 1A) of the electronic device EDE. In the disclosure, the expression "an area/portion corresponds to another area/portion" means that "an area/portion overlaps another area/portion", however, the "areas and portions" should not be limited to having the same size as each other.

The display area DP-DA may include a first area A1 and a second area A2. The first area A1 may overlap or correspond to the sensing area ED-SA (refer to FIG. 1A) of the electronic device EDE. In an embodiment, the first area A1 is shown as a circular shape, however, the shape of the first area A1 should not be limited thereto or thereby. The first area A1 may have a variety of shapes, such as a polygonal shape, an oval shape, a figure having at least one curved side, or an irregular shape. The first area A1 may be referred to as a component area, and the second area A2 may be referred to as a main display area or a normal display area.

The first area A1 may have a transmittance higher than that of the second area A2. For example, the first area A1 may have a resolution lower than that of the second area A2, however, embodiments are not limited thereto or thereby. As an example, the first area A1 may have the transmittance higher than that of the second area A2, however, the resolution of the first area A1 and the resolution of the second area A2 may be substantially the same as each other.

The display panel DP may include a display layer 100 and a sensor layer 200.

The display layer 100 may generate the image. The display layer 100 may be a light emitting type display layer. For example, the display layer 100 may be an organic light emitting display layer, an inorganic light emitting display layer, an organic-inorganic light emitting display layer, a quantum dot display layer, a micro-LED display layer, or a nano-LED display layer.

The sensor layer 200 may sense an external input applied thereto from the outside. For example, the external input may be a user input. The user input may include a variety of external inputs, such as a part of user's body, light, heat, pen, or pressure.

The display module DM may include a driving chip DIC disposed in the non-display area DP-NDA. The display module DM may further include a flexible circuit film FCB mounted on the non-display area DP-NDA.

The driving chip DIC may include driving elements, e.g., a data driving circuit, to drive pixels of the display panel DP. FIG. 2A shows a structure in which the driving chip DIC is mounted on the display panel DP, however, embodiments are not limited thereto or thereby. As an example, the driving chip DIC may be mounted on the flexible circuit film FCB.

The power supply module PM may supply a power source for an overall operation of the electronic device EDE. The power supply module PM may include a module.

The first electronic module EM1 and the second electronic module EM2 may include a variety of functional modules to drive the electronic device EDE. Each of the first electronic module EM1 and the second electronic module EM2 may be mounted (e.g., directly mounted) on a mother board, which is electrically connected to the display panel DP, or may be electrically connected to the mother board via a connector after being mounted on a separate substrate.

The first electronic module EM1 may include a control module CM, a wireless communication module TM, an image input module IIM, an audio input module AIM, a memory MM, and an external interface IF.

The control module CM may control an overall operation of the electronic device EDE. The control module CM may be a microprocessor. However, embodiments are not limited thereto. For example, the control module CM may activate or deactivate the display panel DP. The control module CM may control other modules, such as the image input module IIM or the audio input module AIM, based on a touch signal provided from the display panel DP.

The wireless communication module TM may communicate with an external electronic device through a first network, for example, a short-range communication network such as Bluetooth, WiFi direct, or infrared data association (IrDA), or a second network, for example, a long-range communication network such as a cellular network, an internet, or a computer network (e.g., LAN or WAN). Communication modules included in the wireless communication module TM may be integrated into one component, for example, a single chip, or may be implemented as a plurality of components separated from each other, for example, a plurality of chips. The wireless communication module TM may transmit/receive a voice signal by using a general communication line. The wireless communication module TM may include a transmitter TM1 that modulates a signal to be transmitted and transmits the modulated signal and a receiver TM2 that demodulates a signal applied thereto.

The image input module IIM may process an image signal and may convert the image signal into image data that may be displayed through the display panel DP. The audio input module AIM may receive an external sound signal through a microphone in a record mode or a voice recognition mode and may convert the external sound signal to electrical voice data.

The external interface IF may include a connector that physically connects the electronic device EDE to an external electronic device. For example, the external interface IF may function as an interface between the control module CM and external devices, such as an external charger, a wired/wireless data port, a card socket (e.g., a memory card and a SIM/UIM card), etc.

The second electronic module EM2 may include an audio output module AOM, a light emitting module LTM, a light receiving module LRM, and the camera module CMM. The audio output module AOM may convert audio data provided from the wireless communication module TM or audio data stored in the memory MM and may output the converted audio data to the outside.

The light emitting module LTM may generate and emit a light. The light emitting module LTM may emit an infrared light. The light emitting module LTM may include an LED element. The light receiving module LRM may sense the infrared light. The light receiving module LRM may be activated in case that the infrared light above a certain level is sensed. The light receiving module LRM may include a CMOS sensor. The infrared light generated and emitted from the light emitting module LTM may be reflected by an external object, e.g., a user's finger or face, and the reflected infrared light may be incident into the light receiving module LRM.

The camera module CMM may take a photo or video. The camera module CMM may be provided in plural. Among them, some camera modules CMM may overlap the first area A1. The external input, for example, a light, may be provided to the camera module CMM via the first area A1. As an example, the camera module CMM may receive a natural light through the first area A1 to take a picture of an external object.

The housings EDC1 and EDC2 may accommodate the display module DM, the first and second electronic modules EM1 and EM2, and the power supply module PM. The housings EDC1 and EDC2 may protect components accommodated therein, e.g., the display module DM, the first and second electronic modules EM1 and EM2, and the power supply module PM. FIG. 2A shows two housings EDC1 and EDC2 separated from each other as a representative example, however, embodiments are not limited thereto or thereby. For example, the electronic device EDE may further include a hinge structure to connect the two housings EDC1 and EDC2. The housings EDC1 and EDC2 may be coupled to the window module WM.

Figure 3:
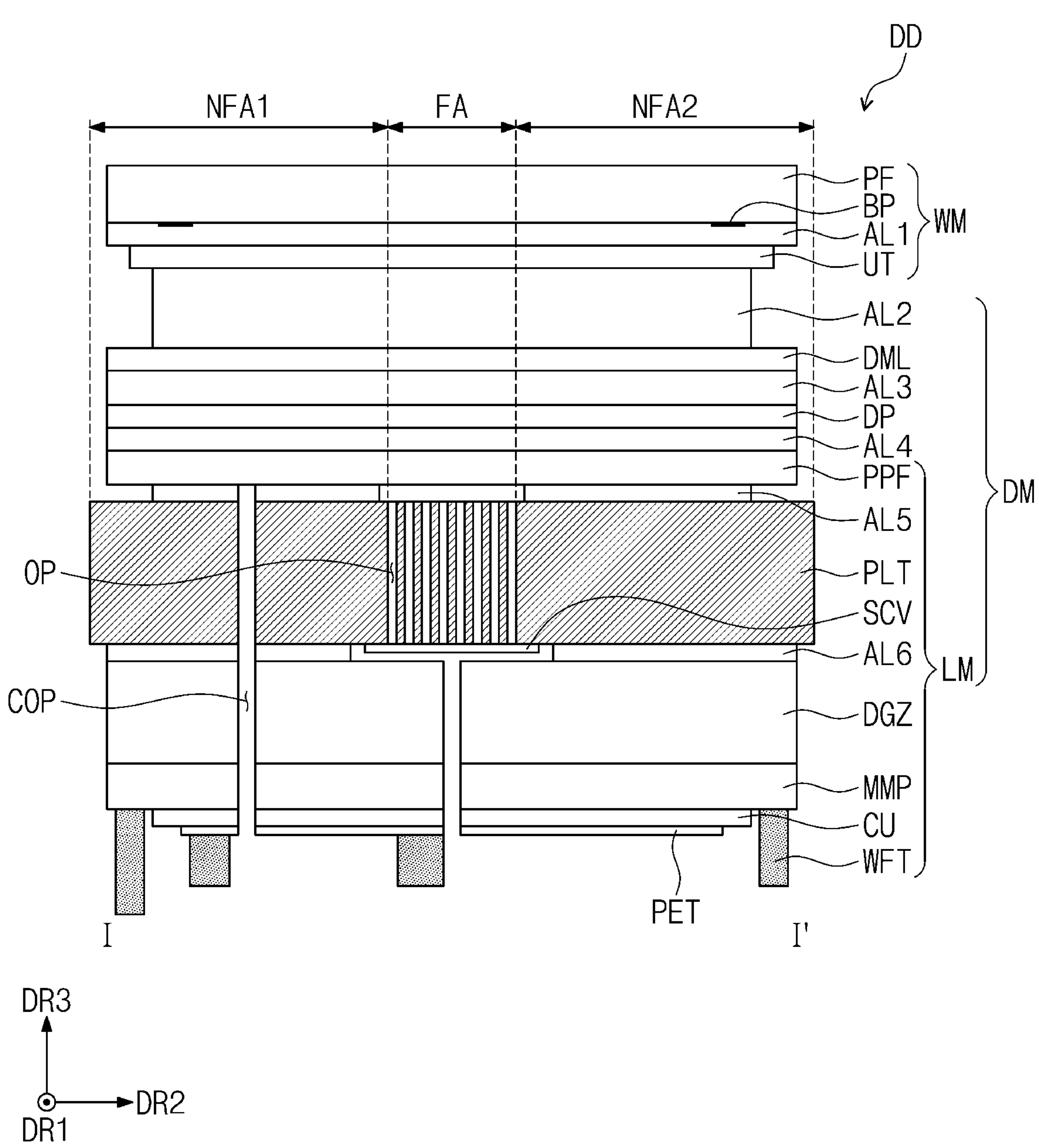
FIG. 3 is a schematic cross-sectional view of a display device according to an embodiment.

FIG. 3 is a schematic cross-sectional view of the display device DD according to an embodiment. FIG. 3 is a schematic cross-sectional view of the display device DD taken along a line I-I' of FIG. 2A according to an embodiment.

Referring to FIG. 3, the display device DD may include the window module WM and the display module DM.

The window module WM may include a window UT, a protective film PF disposed on the window UT, and a bezel pattern layer BP.

The window UT may be a chemically strengthened glass. As the window UT is applied to the display device DD, the occurrence of crease (or wrinkles) may be minimized even though the folding and unfolding operations are repeatedly performed.

The protective film PF may include polyimide, polycarbonate, polyamide, triacetylcellulose, polymethylmethacrylate, or polyethylene terephthalate. For example, at least one of a hard coating layer, an anti-fingerprint layer, and an anti-reflective layer may be disposed on an upper surface of the protective film PF.

The bezel pattern layer BP may overlap the non-display area NDA shown in FIG. 1A. The bezel pattern layer BP may be disposed on a surface of the window UT or a surface of the protective film PF. FIG. 3 shows the structure in which the bezel pattern layer BP is disposed on a lower surface of the protective film PF, however, embodiments are not limited thereto or thereby. According to an embodiment, the bezel pattern layer BP may be disposed on an upper surface of the protective film PF, an upper surface of the window UT, or a lower surface of the window UT. The bezel pattern layer BP may be a colored light blocking layer and may be formed by a coating process. The bezel pattern layer BP may include a base material and a pigment or a dye mixed with the base material. The bezel pattern layer BP may have a closed line shape when viewed in a plane.

A first adhesive layer AL1 may be disposed between the protective film PF and the window UT. The first adhesive layer AL1 may be a pressure sensitive adhesive (PSA) film or an optically clear adhesive (OCA). Adhesive layers described hereinafter may include the same adhesive as the first adhesive layer AL1 and may include an adhesive.

The first adhesive layer AL1 may have a thickness enough to cover the bezel pattern layer BP. As an example, the bezel pattern layer BP may have a thickness from about 3 micrometers to about 8 micrometers, and the first adhesive layer AL1 may have a thickness enough to prevent air bubbles from occurring around the bezel pattern layer BP.

The first adhesive layer AL1 may be separated from the window UT. Since a strength of the protective film PF is lower than that of the window UT, scratches may occur on the protective film PF. After the first adhesive layer AL1 and the scratched protective film PF are separated from the window UT, another protective film PF may be attached to the window UT.

The display module DM may include an impact absorbing layer DML, the display panel DP, and a lower member LM.

The impact absorbing layer DML may be disposed above the display panel DP. The impact absorbing layer DML may be a functional layer to protect the display panel DP from the external impact. The impact absorbing layer DML may be coupled to the window UT by a second adhesive layer AL2 and may be coupled to the display panel DP by a third adhesive layer AL3.

The lower member LM may be disposed under the display panel DP. The lower member LM may include a panel protective layer PPF, a support layer PLT, a cover layer SCV, a digitizer DGZ, a shielding layer MMP, a heat dissipation layer CU, a protective layer PET, and a waterproof tape WFT. According to an embodiment, the lower member LM may not include some of the above-mentioned components or may further include other components. For example, the stacking order shown in FIG. 3 is an example, and the stacking order of the components may be changed.

The panel protective layer PPF may be disposed under the display panel DP. The panel protective layer PPF may be attached to a rear surface of the display panel DP by a fourth adhesive layer AL4. The panel protective layer PPF may protect a lower portion of the display panel DP. The panel protective layer PPF may include a flexible plastic material. The panel protective layer PPF may prevent scratches from occurring on the rear surface of the display panel DP during a manufacturing process of the display panel DP. The panel protective layer PPF may be a colored polyimide film. For example, the panel protective layer PPF may be an opaque yellow film, however, embodiments are not limited thereto or thereby.

The support layer PLT may be disposed under the panel protective layer PPF. The support layer PLT may support components disposed on the support layer PLT and may maintain the unfolded state and the folded state of the display device DD. According to an embodiment, the support layer PLT may include a first support portion corresponding to at least the first non-folding area NFA1, a second support portion corresponding to the second non-folding area NFA2, and a folding portion corresponding to the folding area FA. The first support portion and the second support portion may be spaced apart from each other in the second direction DR2. The folding portion may be disposed between the first support portion and the second support portion and may include openings OP defined therethrough. Due to the openings OP, a flexibility of a portion of the support layer PLT may be improved. The flexibility of the portion of the support layer PLT, which overlaps the folding area FA, may be improved by the openings OP.

The support layer PLT may include a carbon fiber reinforced plastic (CFRP), however, embodiments are not limited thereto or thereby. According to an embodiment, the first and second support portions may include a non-metallic material, a plastic material, a glass fiber reinforced plastic, or a glass material. The plastic material may include polyimide, polyethylene, or polyethylene terephthalate, however, embodiments are not limited thereto. The first support portion and the second support portion may include the same material as each other. The folding portion, the first support portion, and the second support portion may include the same material or may include different materials. As an example, the folding portion may include a material having an elastic modulus equal to or greater than about 60 GPa and may include a metal material such as a stainless steel. For example, the folding portion may include SUS 304, however, embodiments are not limited thereto or thereby. The folding portion may include a variety of metal materials.

The support layer PLT may be attached to the panel protective layer PPF by a fifth adhesive layer AL5. The fifth adhesive layer AL5 may be provided in plural, and the fifth adhesive layers AL5 may be spaced apart from each other with the folding area FA interposed therebetween. The fifth adhesive layer AL5 may not overlap the openings OP. For example, the fifth adhesive layer AL5 may be spaced apart from the openings OP when viewed in the plane (or in a plan view). As the fifth adhesive layer AL5 is not disposed in an area corresponding to the folding area FA, the flexibility of the support layer PLT may be improved.

In the area overlapping the folding area FA, the panel protective layer PPF may be spaced apart from the support layer PLT. For example, an empty space may be defined between the support layer PLT and the panel protective layer PPF in the area overlapping the folding area FA. Since the empty space is defined between the panel protective layer PPF and the support layer PLT, the openings OP defined (or formed) through the support layer PLT may not be viewed from the outside of the electronic device EDE (refer to FIG. 1A).

The fifth adhesive layer AL5 may have a thickness smaller than a thickness of the fourth adhesive layer AL4. As an example, the thickness of the fourth adhesive layer AL4 may be about 25 micrometers, and the thickness of the fifth adhesive layer AL5 may be about 16 micrometers. As the thickness of the fifth adhesive layer AL5 decreases, a step difference caused by the fifth adhesive layer AL5 may decrease. In case that the step difference decreases, there is an advantage in that a deformation of the stack structure due to the folding and unfolding operations of the electronic device EDE (refer to FIG. 1A) is reduced, but the openings OP may be viewed or the fifth adhesive layer AL5 may be detached due to the repeated folding operations. As the thickness of the fifth adhesive layer AL5 increases, the openings OP may not be viewed and reliability with respect to an adhesive force of the fifth adhesive layer AL5 may be improved in spite of the repeated folding operations, however, the step difference may increase. Accordingly, the thickness of the fifth adhesive layer AL5 may be determined to be within an appropriate range in consideration of a folding reliability, an adhesion reliability, and a visibility of the openings OP.

The cover layer SCV may be disposed under the support layer PLT. The cover layer SCV may be coupled to the support layer PLT by an adhesive layer. The cover layer SCV may cover the openings OP defined (or formed) through the support layer PLT. Accordingly, the cover layer SCV may prevent a foreign substance from entering (or permeating) the openings OP. The cover layer SCV may have an elastic modulus smaller than that of the support layer PLT. As an example, the cover layer SCV may include thermoplastic polyurethane, rubber, or silicone, however, embodiments are not limited thereto or thereby.

The digitizer DGZ may be disposed under the support layer PLT. The digitizer DGZ may be provided in plural. As an example, the digitizers DGZ may be spaced apart from each other in the second direction DR2. When viewed in a plane, a portion of each of the digitizers DGZ may overlap the non-folding area NFA1 or NFA2, and the others of each of the digitizers DGZ may overlap the folding area FA. When viewed in the plane, a portion of each of the digitizers DGZ may overlap a portion of the openings OP.

Each of the digitizers DGZ may include loop coils generating a magnetic field with an input device, e.g., a pen, at a certain resonant frequency. The digitizers DGZ may be referred to as an electromagnetic resonance (EMR) sensing panel.

The magnetic field generated by the digitizers DGZ may be applied to an LC resonant circuit formed by an inductor (e.g., coil) and a capacitor of the pen. The coil may generate a current in response to the magnetic field applied thereto and may supply the generated current to the capacitor. Accordingly, the capacitor may be charged with the current supplied thereto from the coil and may discharge the charged current to the coil. Thus, the magnetic field of the resonant frequency may be emitted from the coil. The magnetic field emitted by the pen may be absorbed by the loop coils of the digitizers DGZ. Thus, a position in the digitizers DGZ to which the pen gets close may be determined or detected.

The shielding layers MMP may be disposed under the digitizers DGZ, respectively. Each of the shielding layers MMP may include a magnetic metal powder. The shielding layers MMP may be referred to as a magnetic metal powder layer, a magnetic layer, a magnetic circuit layer, or a magnetic path layer. The shielding layers MMP may shield a magnetic field.

The heat dissipation layers CU may be disposed under the shielding layers MMP, respectively. The heat dissipation layers CU may be sheets with a high heat conductivity. As an example, each of the heat dissipation layers CU may include graphite, copper, or copper alloy, however, embodiments are not limited thereto.

The protective layers PET may be disposed under the heat dissipation layers CU, respectively. The protective layers PET may be insulating layers. As an example, the protective layers PET may prevent a static electricity from entering. Accordingly, an electrical interference may be prevented from occurring between the flexible circuit film FCB (refer to FIG. 2A) and members disposed on the protective layers PET by the protective layers PET.

The waterproof tapes WFT may be attached to the shielding layers MMP and the protective layers PET. The waterproof tape WFT may be attached to a set bracket. Among the waterproof tapes WFT, the waterproof tapes attached to the shielding layers MMP may have a thickness different from a thickness of the waterproof tapes attached to the protective layers PET.

At least some components of the lower member LM may include a through hole COP defined therethrough. The through hole COP may overlap or correspond to the sensing area ED-SA (refer to FIG. 1A) of the electronic device EDE. At least a portion of the camera module CMM (refer to FIG. 2A) may be inserted into the through hole COP.

FIG. 3 shows a structure in which the through hole COP is defined from a rear surface of a protective layer among the protective layers PET to the fifth adhesive layer AL5 as a representative example, however, embodiments are not limited thereto or thereby. As an example, the through hole COP may be defined from the rear surface of the one protective layer to an upper surface of the panel protective layer PPF or from the rear surface of the one protective layer to an upper surface of the fourth adhesive layer AL4.

Figure 4:
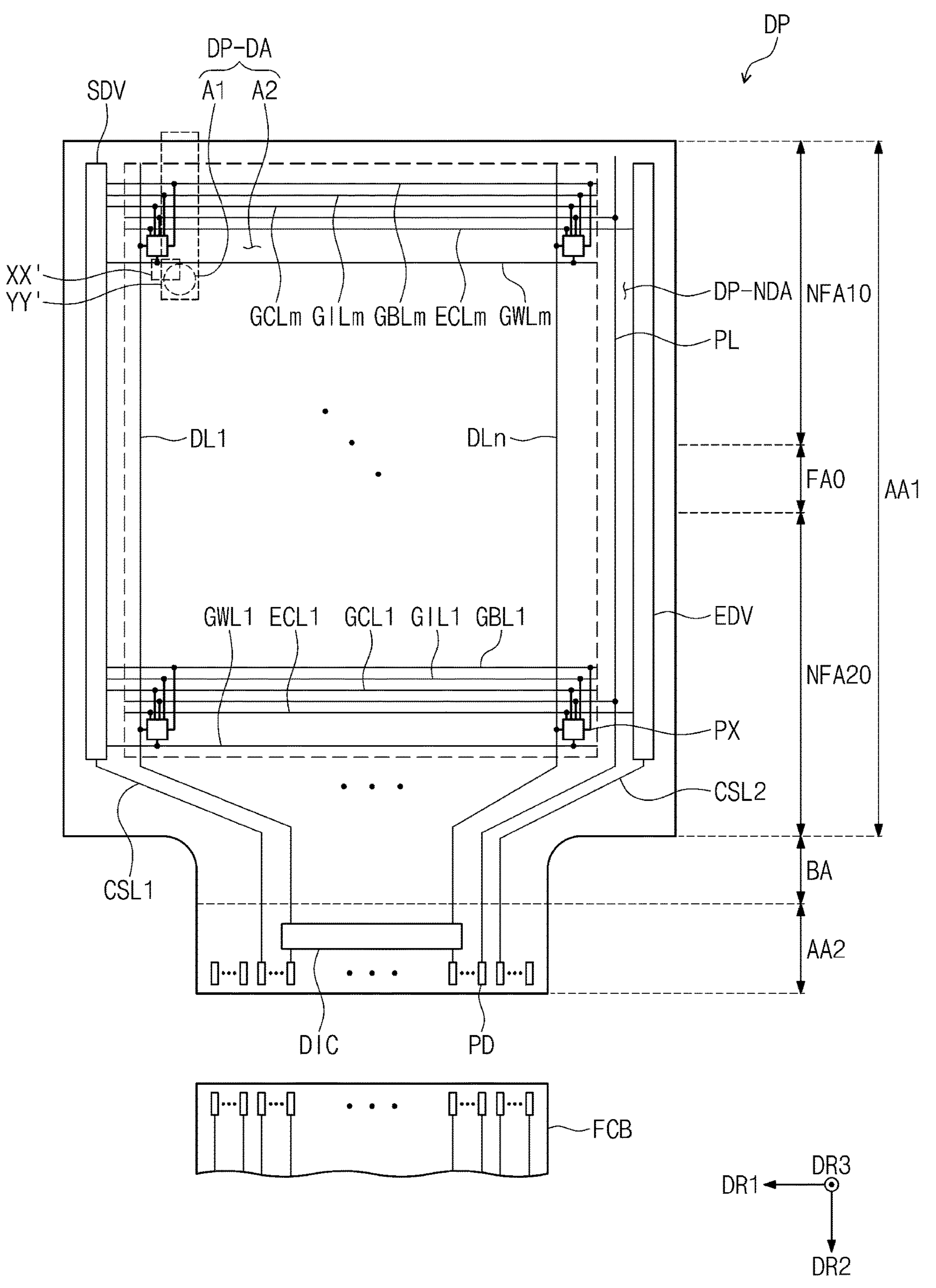
FIG. 4 is a schematic plan view of a display panel according to an embodiment.

FIG. 4 is a schematic plan view of the display panel DP according to an embodiment.

Referring to FIG. 4, the display panel DP may include the display area DP-DA and the non-display area DP-NDA around the display area DP-DA. The display area DP-DA and the non-display area DP-NDA may be distinguished (or defined) from each other by a presence or absence of a pixel PX. The pixel PX may be disposed in the display area DP-DA. A scan driver SDV, a data driver, and an emission driver EDV may be disposed in the non-display area NDA. The data driver may be a circuit provided in the driving chip DIC.

The display area DP-DA may include the first area A1 and the second area A2. The first area A1 and the second area A2 may be distinguished (or defined) from each other by an arrangement interval of the pixels PX, a size of the pixels PX, a shape of the pixels PX, or a presence or absence of a transmission area TP (refer to FIG. 6). The first area A1 and the second area A2 will be described in detail below.

The display panel DP may include a first panel area AA1, a bending area BA, and a second panel area AA2, which are defined in the second direction DR2. The second panel area AA2 and the bending area BA may be areas of the non-display area DP-NDA. The bending area BA may be defined between the first panel area AA1 and the second panel area AA2.

The first panel area AA1 may correspond to the display surface DS of FIG. 1A. The first panel area AA1 may include a first non-folding area NFA10, a second non-folding area NFA20, and a folding area FAO. The first non-folding area NFA10, the second non-folding area NFA20, and the folding area FAO may respectively correspond to the first non-folding area NFA1, the second non-folding area NFA2, and the folding area FA of FIGS. 1A and 1B.

A width (or a length) in the first direction DR1 of the bending area BA and a width (or a length) in the first direction DR1 of the second panel area AA2 may be smaller than a width (or a length) in the first direction DR1 of the first panel area AA1. An area having a relatively short length in a bending axis direction may be relatively readily bent.

The display panel DP may include the pixels PX, initialization scan lines GILL to GILm, compensation scan lines GCL1 to GCLm, write scan lines GWL1 to GWLm, black scan lines GBL1 to GBLm, emission control lines ECL1 to ECLm, data lines DL1 to DLn, first and second control lines CSL1 and CSL2, a driving voltage line PL, and pads PD. In an embodiment, each of "m" and "n" is a natural number equal to or greater than 2.

The pixels PX may be connected (e.g., electrically connected) to the initialization scan lines GILL to GILm, the compensation scan lines GCL1 to GCLm, the write scan lines GWL1 to GWLm, the black scan lines GBL1 to GBLm, the emission control lines ECL1 to ECLm, and the data lines DL1 to DLn.

The initialization scan lines GILL to GILm, the compensation scan lines GCL1 to GCLm, the write scan lines GWL1 to GWLm, and the black scan lines GBL1 to GBLm may extend in the first direction DR1 and may be electrically connected to the scan driver SDV. The data lines DL1 to DLn may extend in the second direction DR2 and may be electrically connected to the driving chip DIC via the bending area BA. The emission control lines ECL1 to ECLm may extend in a direction opposite to the first direction DR1 and may be electrically connected to the emission driver EDV.

The driving voltage line PL may include a portion extending in the first direction DR1 and a portion extending in the second direction DR2. The portion extending in the first direction DR1 and the portion extending in the second direction DR2 may be disposed on different layers from each other. The portion of the driving voltage line PL, which extends in the second direction DR2, may extend to the second panel area AA2 via the bending area BA. The driving voltage line PL may provide a driving voltage to the pixels PX.

The first control line CSL1 may be connected (e.g., electrically connected) to the scan driver SDV and may extend to a lower end portion of the second panel area AA2 via the bending area BA. The second control line CSL2 may be connected (e.g., electrically connected) to the emission driver EDV and may extend to the lower end portion of the second panel area AA2 via the bending area BA.

When viewed in a plane, the pads PD may be disposed adjacent to the lower end portion of the second panel area AA2. The driving chip DIC, the driving voltage line PL, the first control line CSL1, and the second control line CSL2 may be electrically connected to the pads PD. The flexible circuit film FCB may be electrically connected to the pads PD through an anisotropic conductive adhesive layer.

Figure 5:
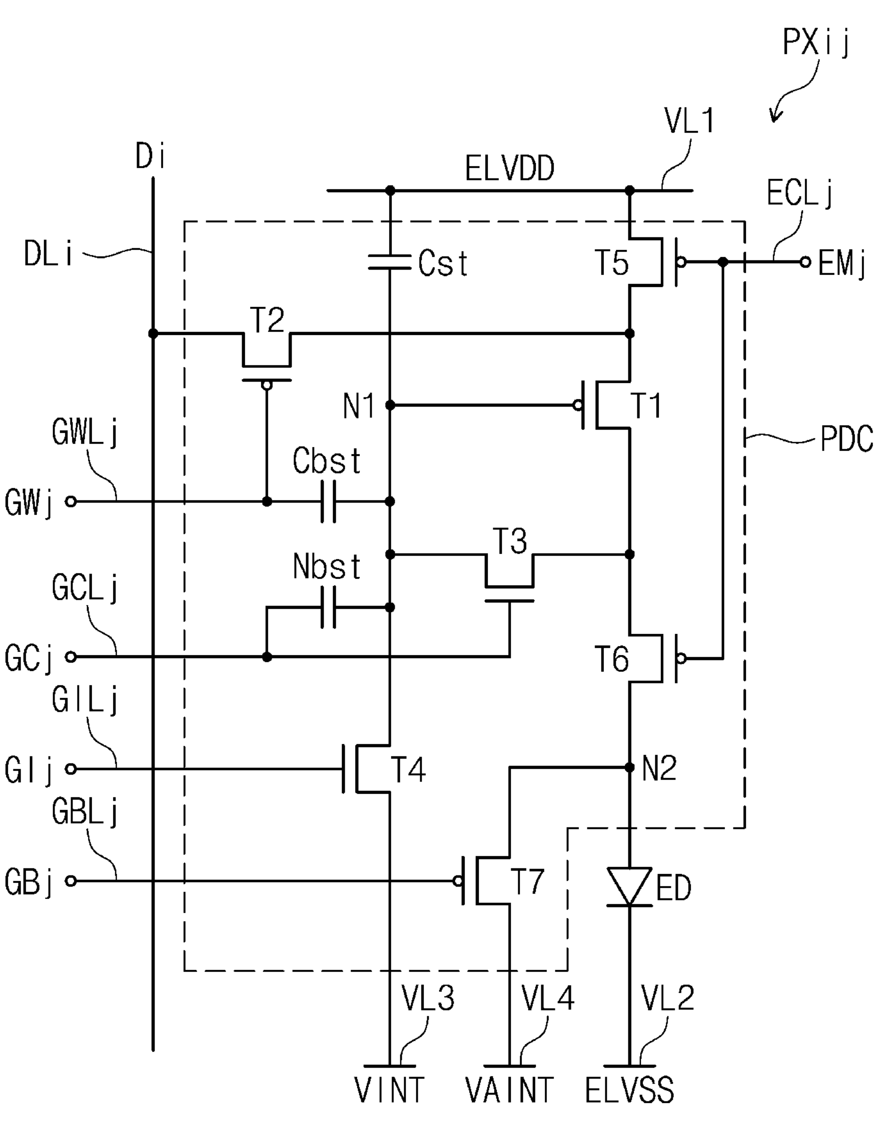
FIG. 5 is a schematic diagram of an equivalent circuit of a pixel according to an embodiment.

FIG. 5 is a schematic diagram of an equivalent circuit of a pixel PXij according to an embodiment.

FIG. 5 shows an equivalent circuit of the pixel PXij among the pixels PX (refer to FIG. 4). Since the pixels PX may have substantially the same configuration as each other, the circuit configuration of the pixel PXij will be described in detail, and detailed descriptions of the other pixels will be omitted for descriptive convenience.

Referring to FIGS. 4 and 5, the pixel PXij may be connected (e.g., electrically connected) to an i-th data line DLi among data lines DL1 to DLn, a j-th initialization scan line GILj among the initialization scan lines GILL to GILm, a j-th compensation scan line GCLj among the compensation scan lines GCL1 to GCLm, a j-th write scan line GWLj among the write scan lines GWL1 to GWLm, a j-th black scan line GBLj among the black scan lines GBL1 to GBLm, a j-th emission control line ECLj among the emission control lines ECL1 to ECLm, first and second driving voltage lines VL1 and VL2, and first and second initialization voltage lines VL3 and VL4. The “i” may be an integer number equal to or greater than 1 and equal to or smaller than n, and the “j” may be an integer number equal to or greater than 1 and equal to or smaller than “m”.

The pixel PXij may include a light emitting element ED and a pixel circuit PDC. The light emitting element ED may be a light emitting diode. As an example, the light emitting element ED may be an organic light emitting diode including an organic light emitting layer, however, embodiments are not limited thereto. The pixel circuit PDC may control an amount of current flowing through the light emitting element ED in response to the i-th data signal Di. The light emitting element ED may emit a light having a certain luminance corresponding to the amount of current provided from the pixel circuit PDC.

The pixel circuit PDC may include first, second, third, fourth, fifth, sixth, and seventh transistors T1, T2, T3, T4, T5, T6, and T7 and first, second, and third capacitors Cst, Cbst, and Nbst. The configuration of the pixel circuit PDC should not be limited to the embodiment shown in FIG. 5. The pixel circuit PDC shown in FIG. 5 is an example, and the configuration of the pixel circuit PDC may be changed.

According to an embodiment, at least one of the first to seventh transistors T1 to T7 may include a low-temperature polycrystalline silicon (LTPS) as its semiconductor layer. At least one of the first to seventh transistors T1 to T7 may include an oxide material as its semiconductor layer. As an example, each of the third and fourth transistors T3 and T4 may be an oxide semiconductor transistor, and each of the first, second, fifth, sixth, and seventh transistors T1, T2, T5, T6, and T7 may be a low-temperature polycrystalline silicon (LTPS) transistor.

In detail, the first transistor T1, which directly affects the luminance of the light emitting element ED, may include the semiconductor layer including polycrystalline silicon with high reliability, and thus, the display device with high resolution may be implemented. Since the oxide semiconductor has a high carrier mobility and a low leakage current, the voltage drop may not be large even though the driving time is long. For example, in case that the pixels PX are driven at low frequency, a change in color of the image due to the voltage drop may not be large, and thus, the pixels PX may be driven at low frequency. As described above, since the oxide semiconductor has low leakage current, at least one of the third transistor T3 and the fourth transistor T4, which are connected to a gate electrode of the first transistor T1, may include the oxide semiconductor. Thus, the leakage current may be prevented from flowing to the gate electrode of the first transistor T1, and power consumption may be reduced.

Some of the first to seventh transistors T1 to T7 may be a P-type transistor, and the other of the first to seventh transistors T1 to T7 may be an N-type transistor. As an example, each of the first, second, fifth, sixth, and seventh transistors T1, T2, T5, T6, and T7 may be the P-type transistor, and each of the third and fourth transistors T3 and T4 may be the N-type transistor.

The configuration of the pixel circuit PDC should not be limited to that shown in FIG. 5. The pixel circuit PDC shown in FIG. 5 is an example, and the configuration of the pixel circuit PDC may be changed. As an example, all the first to seventh transistors T1 to T7 may be the P-type transistor or the N-type transistor. According to an embodiment, the first, second, fifth, and sixth transistors T1, T2, T5, and T6 may be the P-type transistor, and the third, fourth, and seventh transistors T3, T4, and T7 may be the N-type transistor.

The j-th initialization scan line GILj, the j-th compensation scan line GCLj, the j-th write scan line GWLj, the j-th black scan line GBLj, and the j-th emission control line ECLj may transmit a j-th initialization scan signal GIj, a j-th compensation scan signal GCj, a j-th write scan signal GWj, a j-th black scan signal GBj, and a j-th emission control signal EMj to the pixel PXij, respectively. The i-th data line DLi may transmit an i-th data signal Di to the pixel PXij. The i-th data signal Di may have a voltage level corresponding to the image signal input to the display device DD (refer to FIG. 3).

The First and second driving voltage lines VL1 and VL2 may transmit a first driving voltage ELVDD and a second driving voltage ELVSS to the pixel PXij, respectively. For example, the first and second initialization voltage lines VL3 and VL4 may transmit a first initialization voltage VINT and a second initialization voltage VAINT to the pixel PXij, respectively.

The first transistor T1 may be connected (e.g., electrically connected) between the first driving voltage line VL1, which receives the first driving voltage ELVDD, and the light emitting element ED. The first transistor T1 may include a first electrode connected to the first driving voltage line VL1 via the fifth transistor T5, a second electrode electrically connected to a pixel electrode (or referred to as an anode) of the light emitting element ED via the sixth transistor T6, and a third electrode (e.g., the gate electrode) connected to an end portion (e.g., a first node N1) of the first capacitor Cst. The first transistor T1 may receive the i-th data signal Di transmitted through the i-th data line DLi according to a switching operation of the second transistor T2 and may supply a driving current to the light emitting element ED.

The second transistor T2 may be connected (e.g., electrically connected) between the i-th data line DLi and the first electrode of the first transistor T1. The second transistor T2 may include a first electrode connected to the i-th data line DLi, a second electrode connected to the first electrode of the first transistor T1, and a third electrode (e.g., a gate electrode) connected to the j-th write scan line GWLj. The second transistor T2 may be turned on in response to the j-th write scan signal GWj applied thereto via the j-th write scan line GWLj and may transmit the i-th data signal Di applied thereto via the i-th data line DLi to the first electrode of the first transistor T1. An end portion of the second capacitor Cbst may be connected (e.g., electrically connected) to the third electrode of the second transistor T2, and another end portion of the second capacitor Cbst may be connected (e.g., electrically connected) to the first node N1.

The third transistor T3 may be connected (e.g., electrically connected) between the second electrode of the first transistor T1 and the first node N1. The third transistor T3 may include a first electrode connected to the third electrode of the first transistor T1, a second electrode connected to the second electrode of the first transistor T1, and a third electrode (e.g., a gate electrode) connected to the j-th compensation scan line GCLj. The third transistor T3 may be turned on in response to the j-th compensation scan signal GCj applied thereto via the j-th compensation scan line GCLj and may connect the third electrode and the second electrode of the first transistor T1 to each other to allow the first transistor T1 to be connected in a diode configuration. An end portion of the third capacitor Nbst may be connected to the third electrode of the third transistor T3, and another end portion of the third capacitor Nbst may be connected (e.g., electrically connected) to the first node N1.

The fourth transistor T4 may be connected (e.g., electrically connected) between the first initialization voltage line VL3 to which the first initialization voltage VINT is applied and the first node N1. The fourth transistor T4 may include a first electrode connected to the first initialization voltage line VL3 to which the first initialization voltage VINT is applied, a second electrode connected to the first node N1, and a third electrode (e.g., a gate electrode) connected to the j-th initialization scan line GILj. The fourth transistor T4 may be turned on in response to the j-th initialization scan signal GIj applied thereto via the j-th initialization scan line GILj. The turned-on fourth transistor T4 may transmit the first initialization voltage VINT to the first node N1 to initialize an electric potential of the third electrode of the first transistor T1, e.g., an electric potential of the first node N1.

The fifth transistor T5 may include a first electrode connected to the first driving voltage line VL1, a second electrode connected to the first electrode of the first transistor T1, and a third electrode (e.g., a gate electrode) connected to the j-th emission control line ECLj. The sixth transistor T6 may include a first electrode connected to the second electrode of the first transistor T1, a second electrode connected to the pixel electrode of the light emitting element ED, and a third electrode (e.g., a gate electrode) connected to the j-th emission control line ECLj.

The fifth transistor T5 and the sixth transistor T6 may be substantially simultaneously turned on in response to the j-th emission control signal EMj applied thereto via the j-th emission control line ECLj. The first driving voltage ELVDD applied via the turned-on fifth transistor T5 may be compensated for by the first transistor T1 connected in the diode configuration and may be transmitted to the light emitting element ED via the sixth transistor T6.

The seventh transistor T7 may include a first electrode connected to the second initialization voltage line VL4 to which the second initialization voltage VAINT is applied, a second electrode connected to the second electrode of the sixth transistor T6, and a third electrode (e.g., a gate electrode) connected to the j-th black scan line GBLj. The second initialization voltage VAINT may have a voltage level equal to or lower than that of the first initialization voltage VINT.

As described above, the end portion of the first capacitor Cst may be connected (e.g., electrically connected) to the third electrode of the first transistor T1, and the another end portion of the first capacitor Cst may be connected (e.g., electrically connected) to the first driving voltage line VL1. A cathode of the light emitting element ED may be connected (e.g., electrically connected) to the second driving voltage line VL2 that transmits the second driving voltage ELVSS. The second driving voltage ELVSS may have a voltage level lower than that of the first driving voltage ELVDD.

Figure 6:
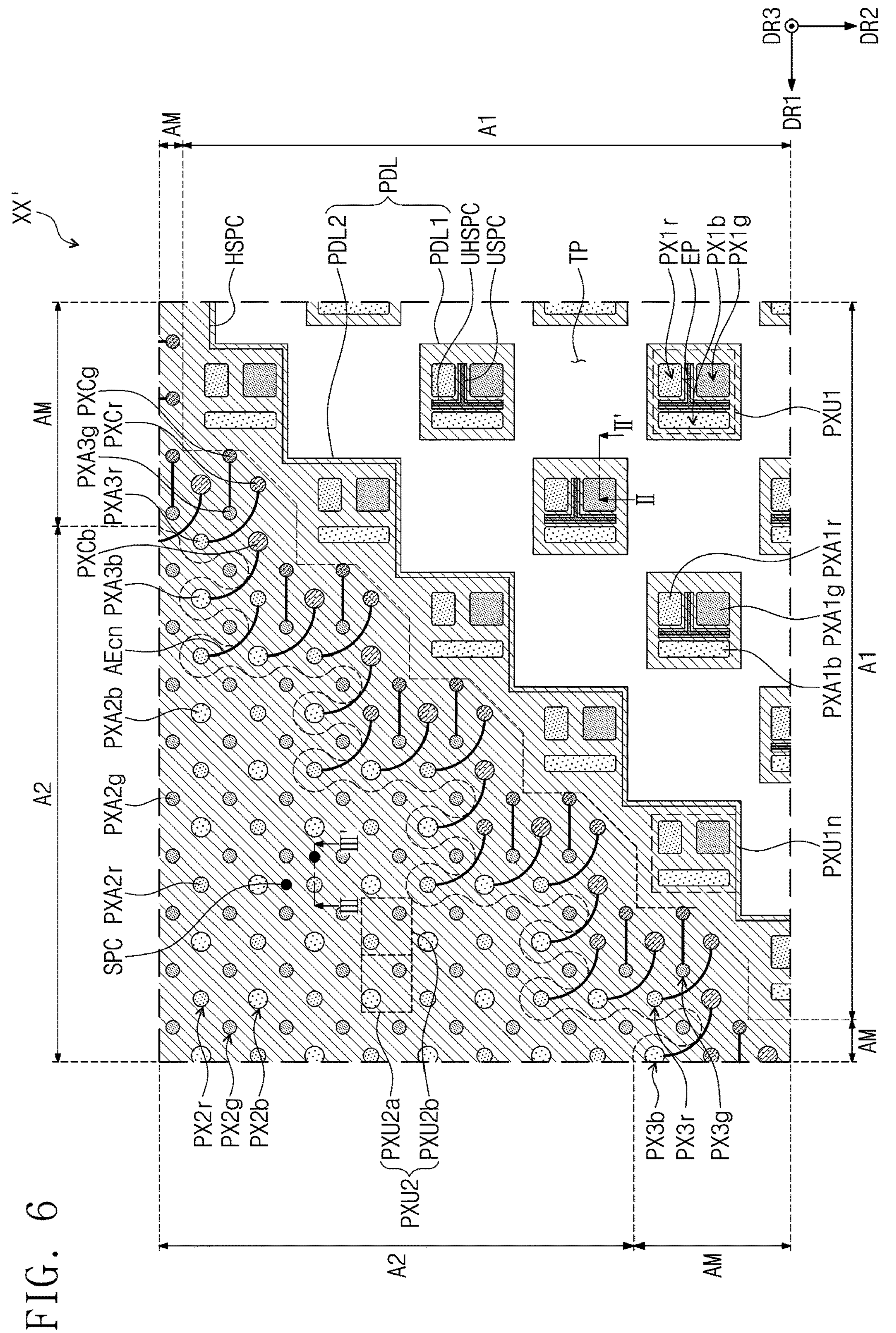
FIG. 6 is a schematic enlarged plan view of a portion of a display panel according to an embodiment.

FIG. 6 is a schematic enlarged plan view of a portion of the display panel DP according to an embodiment. FIG. 6 is a schematic enlarged plan view of an area XX' shown in FIG. 4.

Referring to FIGS. 4 and 6, the display panel DP may include the first area A1, the second area A2, and an intermediate area AM defined between the first area A1 and the second area A2.

The pixel PX may be provided in plural, and the pixels PX may include first pixels PX1*r*, PX1*g*, and PX1*b* disposed in the first area A1, second pixels PX2*r*, PX2*g*, and PX2*b* disposed in the second area A2, and third pixels PX3*r*, PX3*g*, and PX3*b* disposed in the intermediate area AM.

The number of the first pixels PX1*r*, PX1*g*, and PX1*b* disposed in the first area A1 per reference area (or unit area) may be smaller than the number of the second pixels PX2*r*, PX2*g*, and PX2*b* disposed in the second area A2 per reference area (or unit area). For example, a pixel density of the first area A1 may be smaller than a pixel density of the second area A2. Accordingly, a resolution of the first area A1 may be lower than a resolution of the second area A2.

The first pixels PX1*r*, PX1*g*, and PX1*b* may include a first-first color pixel PX1*r*, a first-second color pixel PX1*g*, and a first-third color pixel PX1*b*. The second pixels PX2*r*, PX2*g*, and PX2*b* may include a second-first color pixel PX2*r*, a second-second color pixel PX2*g*, and a second-third color pixel PX2*b*. The third pixels PX3*r*, PX3*g*, and PX3*b* may include a third-first color pixel PX3*r*, a third-second color pixel PX3*g*, and a third-third color pixel PX3*b*. The first-first color pixel PX1*r*, the second-first color pixel PX2*r*, and the third-first color pixel PX3*r* may be red light emitting pixels. The first-second color pixel PX1*g*, the second-second color pixel PX2*g*, and the third-second color pixel PX3*g* may be green light emitting pixels. The first-third color pixel PX1*b*, the second-third color pixel PX2*b*, and the third-third color pixel PX3*b* may be blue light emitting pixels.

Each of the first pixels PX1*r*, PX1*g*, and PX1*b*, the second pixels PX2*r*, PX2*g*, and PX2*b*, and the third pixels PX3*r*, PX3*g*, and PX3*b* shown in FIG. 6 may have a shape corresponding to that of the light emitting area defined in the light emitting element when viewed in the plane. The light emitting area may be defined by a pixel definition opening defined (or formed) through a pixel definition layer PDL.

FIG. 6 shows first light emitting areas PXA1*r*, PXA1*g*, and PXA1*b* respectively corresponding to the first pixels PX1*r*, PX1*g*, and PX1*b* and second light emitting areas PXA2*r*, PXA2*g*, and PXA2*b* respectively corresponding to the second pixels PX2*r*, PX2*g*, and PX2*b*. In FIG. 6, a third-first light emitting area PXA3*r* and a third-first copy light emitting area PXCr, which correspond to the third-first color pixel PX3*r*, a third-second light emitting area PXA3*g* and a third-second copy light emitting area PXCg, which correspond to the third-second color pixel PX3*g*, and a third-third light emitting area PXA3*b* and a third-third copy light emitting area PXCb, which correspond to the third-third color pixel PX3*b*, are shown.

A first-first light emitting area PXA1*r* may have a size greater than a size of a second-first light emitting area PXA2*r*. A first-second light emitting area PXA1*g* may have a size greater than a size of a second-second light emitting area PXA2*g*. A first-third light emitting area PXA1*b* may have a size greater than a size of a second-third light emitting area PXA2*b*. In case that a constant brightness is implemented within the reference area, the size of each of the first pixels PX1*r*, PX1*g*, and PX1*b*, which is required to emit relatively bright light, may be provided larger than the size of each of the second pixels PX2*r*, PX2*g*, and PX2*b*, and thus, lifespans of the first pixels PX1*r*, PX1*g*, and PX1*b* may be compensated such that differences in the life spans of the first pixels PX1*r*, PX1g, and PX1*b* may be minimized.

The emission of the third-first light emitting area PXA3*r* and the emission of the third-first copy light emitting area PXCr may be controlled by the operation of the same pixel circuit. Accordingly, the third-first light emitting area PXA3*r* and the third-first copy light emitting area PXCr may or may not provide the light substantially simultaneously. FIG. 6 shows a connection electrode AEcn to clarify a relationship between the third-first light emitting area PXA3*r* and the third-first copy light emitting area PXCr. The emission of the third-second light emitting area PXA3*g* and the emission of the third-second copy light emitting area PXCg may be controlled by the operation of the same pixel circuit, and the emission of the third-third light emitting area PXA3*b* and the emission of the third-third copy light emitting area PXCb may be controlled by the operation of the same pixel circuit.

In the intermediate area AM, the plurality of light emitting areas may be included in a single pixel. As an example, the third-first color pixel PX3*r* may include the third-first light emitting area PXA3*r* and the third-first copy light emitting area PXCr, the third-second color pixel PX3*g* may include the third-second light emitting area PXA3*g* and the third-second copy light emitting area PXCg, and the third-third color pixel PX3*b* may include the third-third light emitting area PXA3*b* and the third-third copy light emitting area PXCb.

It is difficult to dispose the pixel circuit in the boundary area between the first area A1 and the second area A2 due to space limitations. As an example, an area in which the third-first copy light emitting area PXCr, the third-second copy light emitting area PXCg, and the third-third copy light emitting area PXCb are arranged may be the boundary area where it is difficult to dispose the pixel circuit due to space limitations. Accordingly, the copy light emitting elements that do not include the pixel circuit may be arranged in the boundary area. Therefore, as the light emitting areas providing the light are additionally provided in the boundary area, the boundary area between the first area A1 and the second area A2 may be prevented from being perceived as dark. For example, the intermediate area AM may be provided to prevent the boundary area between the first area A1 and the second area A2 from being perceived as dark.

FIG. 6 shows the pixel definition layer PDL. The pixel definition layer PDL may include pixel definition pattern layers PDL1 and a pixel definition film PDL2.

The pixel definition pattern layers PDL1 may be disposed in the first area A1 and may be spaced apart from each other. As an example, the first area A1 may include transmission areas TP and an element area EP, and the pixel definition pattern layers PDL1 may not overlap the transmission areas TP and may overlap the element area EP. A boundary area between the transmission areas TP and the element area EP may be defined by a first lower light blocking layer BML1 (refer to FIG. 7A), and details thereof will be described with reference to FIG. 9A. At least three openings may be defined (or formed) through each of the pixel definition pattern layers PDL1. As an example, each of the pixel definition pattern layers PDL1 may include the openings corresponding to the first light emitting areas PXA1*r*, PXA1*g*, and PXA1*b*, respectively.

A first pixel unit PXU1 and a first adjacent pixel unit PXUln may be disposed in the first area A1. Each of the first pixel unit PXU1 and the first adjacent pixel unit PXUln may include the first pixels PX1*r*, PX1*g*, and PX1*b*. For example, shapes of the first light emitting areas PXA1*r*, PXA1*g*, and PXA1*b* corresponding to the first pixel unit PXU1 may be substantially the same as shapes of the first light emitting areas PXA1*r*, PXA1*g*, and PXA1*b* corresponding to the first adjacent pixel unit PXUln.

The first pixel unit PXU1 may be disposed between four transmission areas TP. The adjacent pixel unit PXUln may be disposed between the transmission areas TP disposed at an outermost position of the first area A1 among the transmission areas TP and the second area A2. Accordingly, the adjacent pixel unit PXUln may be disposed adjacent to two transmission areas TP or three transmission areas TP.

The pixel definition film PDL2 may cover the second area A2, the intermediate area AM, and a portion of the first area A1. As an example, the pixel definition film PDL2 may cover the portion of the first area A1 in which the first adjacent pixel unit PXUln is disposed. The pixel definition film PDL2 may include openings defined therethrough to correspond to the first light emitting areas PXA1*r*, PXA1*g*, and PXA1*b* of the first adjacent pixel unit PXU1*n*, openings defined therethrough to correspond to (or overlap) the second light emitting areas PXA2*r*, PXA2*g*, and PXA2*b*, and openings defined therethrough to correspond to the third-first light emitting area PXA3*r*, the third-first copy light emitting area PXCr, the third-second light emitting area PXA3*g*, the third-second copy light emitting area PXCg, the third-third light emitting area PXA3*b*, and the third-third copy light emitting area PXCb.

FIG. 6 shows a first spacer HSPC, a first protruded spacer SPC, a second spacer UHSPC, and a second protruded spacer USPC.

The first spacer HSPC may be disposed on the pixel definition film PDL2. Similar to the pixel definition film PDL2, the first spacer HSPC may cover the second area A2, the intermediate area AM, and a portion of the first area A1. As an example, the first spacer HSPC may cover the portion of the first area A1 in which the adjacent pixel unit PXUln is disposed. For example, the first spacer HSPC may cover a portion of the intermediate area AM in which the third-first copy light emitting area PXCr, the third-second copy light emitting area PXCg, and the third-third copy light emitting area PXCb are arranged. As the first spacer HSPC is also provided in the intermediate area AM, adhesive properties between layers of the display panel DP may be strengthened or improved.

The first protruded spacer SPC may be disposed on the first spacer HSPC. The first protruded spacer SPC may have a circular shape when viewed in the plane. The first protruded spacer SPC may be disposed in the second area A2. The first protruded spacer SPC may not be disposed in the intermediate area AM. The first protruded spacer SPC may be provided only between the second pixels PX2*r*, PX2*g*, and PX2*b* and may not be provided between the third-first copy light emitting area PXCr, the third-second copy light emitting area PXCg, and the third-third copy light emitting area PXCb.

The first protruded spacer SPC may have a height or thickness greater than the height or thickness of the first spacer HSPC. The height of the first spacer HSPC may be within a range from about 0.110 to about 0.5 in, and a sum of the height of the first spacer HSPC and the height of the first protruded spacer SPC may be within a range from about 1.1 in to about 2.0 Jim. However, the height of the first spacer HSPC and the sum of the height of the first spacer HSPC and the height of the first protruded spacer SPC should not be limited thereto or thereby.

The first protruded spacer SPC may be provided in plural. As an example, two first protruded spacers SPC may be disposed adjacent to one second-second color pixel PX2*g*. For example, the probability of occurrence of dent defects caused by a mask during a manufacturing process may be further reduced.

The two first protruded spacers SPC and four second-second color pixels PX2*g* may be repeatedly arranged. As an example, the two first protruded spacers SPC may be spaced apart from another two first protruded spacers SPC with the four second-second color pixels PX2*g* interposed between the two first protruded spacers SPC and the another two first protruded spacers SPC and sequentially arranged in the first direction DR1. For example, the two first protruded spacers SPC may be spaced apart from another two first protruded spacers SPC with the four second-second color pixels PX2*g* interposed between the two first protruded spacers SPC and the another two first protruded spacers SPC and sequentially arranged in the second direction DR2. However, the arrangement of the first protruded spacers SPC should not be limited thereto or thereby. As an example, two first protruded spacers SPC may be repeatedly arranged with two second-second color pixels PX2*g* interposed therebetween. For example, according to an embodiment, one of the two first protruded spacers SPC may be omitted.

The second spacer UHSPC may be disposed on the pixel definition pattern layer PDL1. The second protruded spacer USPC may be disposed on the second spacer UHSPC. When viewed in the plane, the second spacer UHSPC may have a size greater than a size of the second protruded spacer USPC. When viewed in the plane, each of the second spacer UHSPC and the second protruded spacer USPC may be disposed in an area between the first-first light emitting area PXA1*r* and the first-second light emitting area PXA1*g*, an area between the first-first light emitting area PXA1*r* and the first-third light emitting area PXA1*b*, and an area between the first-second light emitting area PXA1*g* and the first-third light emitting area PXA1*b*.

Figure 7A:
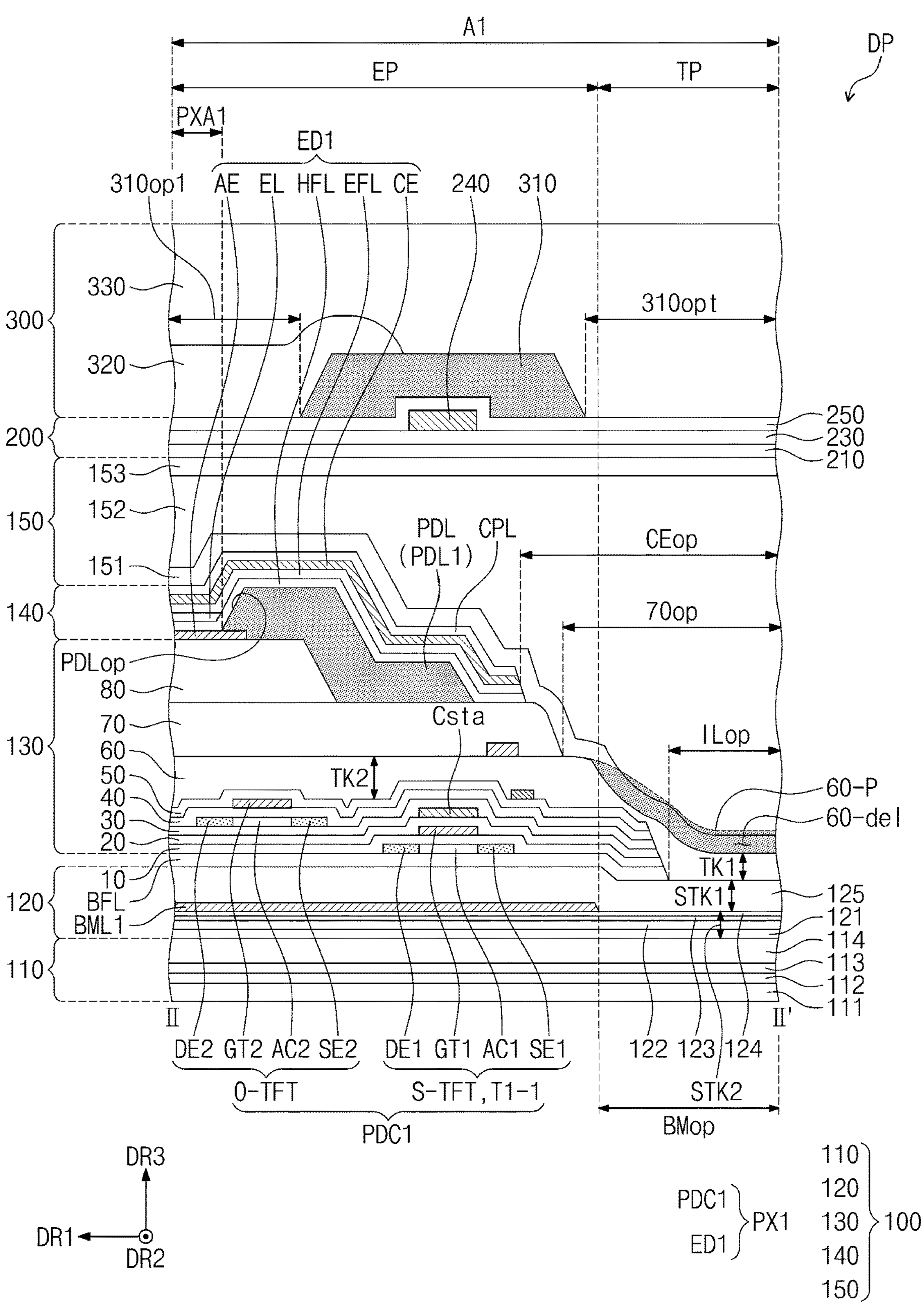
FIG. 7A is a schematic cross-sectional view of a first area of a display panel according to an embodiment.
Figure 7B:
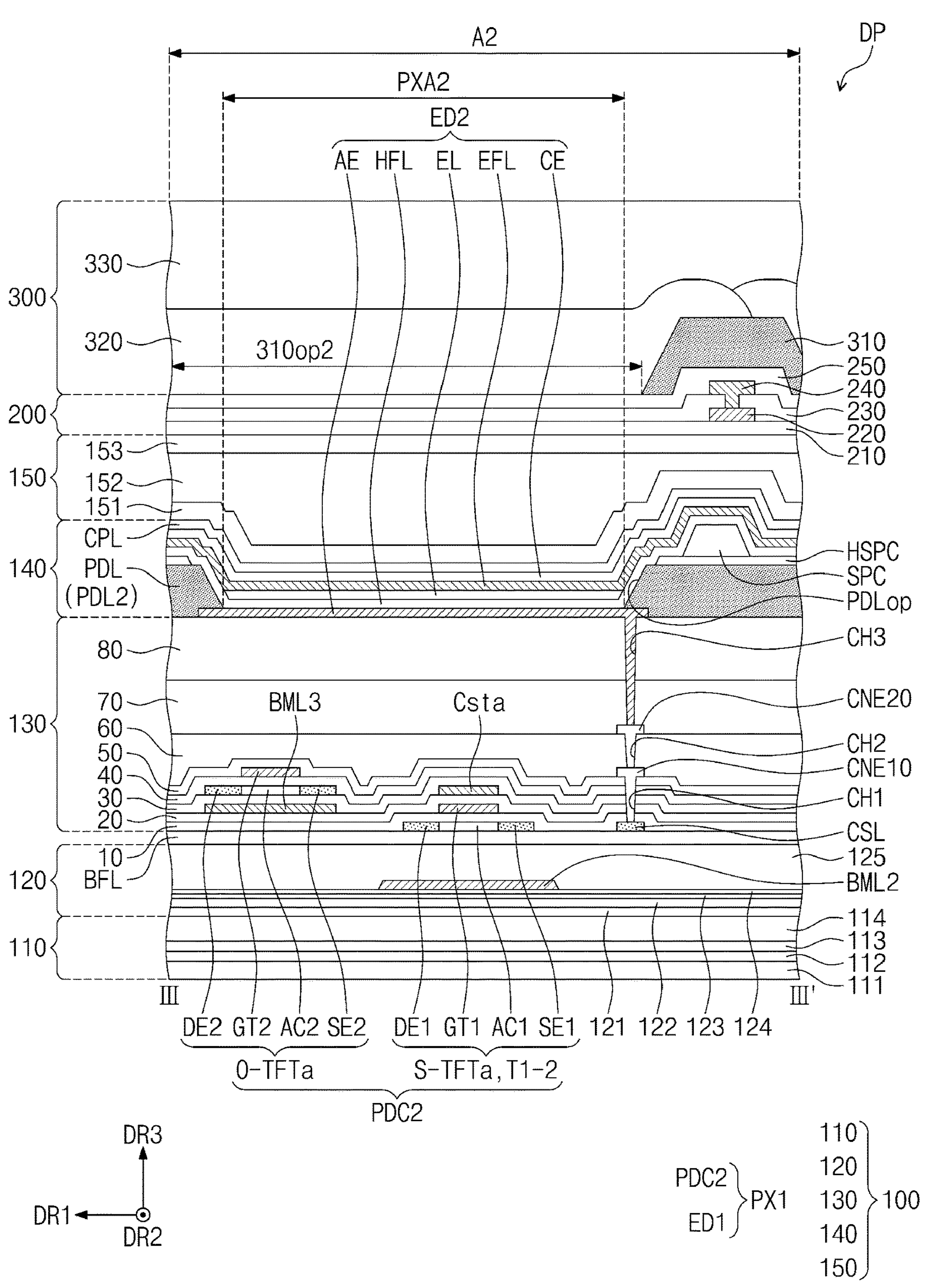
FIG. 7B is a schematic cross-sectional view of a second area of a display panel according to an embodiment.

FIG. 7A is a schematic cross-sectional view of the first area A1 of the display panel DP according to an embodiment. FIG. 7B is a schematic cross-sectional view of the second area A2 of the display panel DP according to an embodiment. FIG. 7A is a schematic cross-sectional view taken along a line II-IF of FIG. 6, and FIG. 7B is a schematic cross-sectional view taken along a line of FIG. 6.

Referring to FIGS. 7A and 7B, the display panel DP may include the display layer 100, the sensor layer 200, and an anti-reflective layer 300. The display layer 100 may include a base layer 110, a barrier layer 120, a circuit layer 130, an element layer 140, and an encapsulation layer 150.

The base layer 110 may include first, second, third, and fourth sub-base layers 111, 112, 113, and 114.

Each of the first sub-base layer 111 and the fourth sub-base layer 114 may include at least one of a polyimide-based resin, an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "A-based resin" means that a functional group of "A" is included. As an example, each of the first and fourth sub-base layers 111 and 114 may include polyimide.

Each of the second sub-base layer 112 and the third sub-base layer 113 may include an inorganic material. As an example, each of the second sub-base layer 112 and the third sub-base layer 113 may include at least one of silicon oxide, silicon nitride, silicon oxynitride, and amorphous silicon. As an example, the second sub-base layer 112 may include silicon oxynitride, and the third sub-base layer 113 may include silicon oxide.

The first sub-base layer 111 may have a thickness greater than a thickness of the fourth sub-base layer 114. As an example, the thickness of the first sub-base layer 111 may be about 100,000 angstroms, and the thickness of the fourth sub-base layer 114 may be about 56,000 angstroms. The second sub-base layer 112 may have a thickness smaller than a thickness of the third sub-base layer 113. As an example, the thickness of the second sub-base layer 112 may be about 1,000 angstroms, and the thickness of the third sub-base layer 113 may be about 5,000 angstroms. However, the thickness of each of the first, second, third, and fourth sub-base layers 111, 112, 113, and 114 should not be limited thereto or thereby.

The barrier layer 120 may be disposed on the base layer 110. The barrier layer 120 may include sub-barrier layers 121, 122, 123, 124, and 125, a first lower light blocking layer BML1, and a second lower light blocking layer BML2.

The first and second lower light blocking layers BML1 and BML2 may be referred to as first and second lower layers, first and second lower metal layers, first and second lower electrode layers, first and second lower shielding layers, first and second light blocking layers, first and second metal layers, first and second electrode layers, first and second shielding layers, or first and second overlap layers.

The sub-barrier layers 121, 122, 123, 124, and 125 may include a first sub-barrier layer 121, a second sub-barrier layer 122, a third sub-barrier layer 123, a fourth sub-barrier layer 124, and a fifth sub-barrier layer 125, which are sequentially stacked in a direction away from the base layer 110. Each of the first, second, third, fourth, and fifth sub-barrier layers 121, 122, 123, 124, and 125 may include an inorganic material. As an example, each of the first, second, third, fourth, and fifth sub-barrier layers 121, 122, 123, 124, and 125 may include at least one of silicon oxide, silicon nitride, silicon oxynitride, and amorphous silicon. As an example, the first sub-barrier layer 121 may include silicon oxynitride, the second sub-barrier layer 122 may include silicon oxide, the third sub-barrier layer 123 may include amorphous silicon, the fourth sub-barrier layer 124 may include silicon oxide, and the fifth sub-barrier layer 125 may include silicon oxide.

Among the first, second, third, fourth, and fifth sub-barrier layers 121, 122, 123, 124, and 125, the fifth sub-barrier layer 125 may be disposed closest to the circuit layer 130. The fifth sub-barrier layer 125 may be referred to as an upper sub-barrier layer. The fifth sub-barrier layer 125 may have a thickness STK1 greater than a thickness of each of the first, second, third, and fourth sub-barrier layers 121, 122, 123, and 124. As an example, the thickness STK1 of the fifth sub-barrier layer 125 may be greater than a sum of thicknesses STK2 of the first, second, third, and fourth sub-barrier layers 121, 122, 123, and 124. As an example, the first sub-barrier layer 121 may have the thickness of about 1,000 angstroms, the second sub-barrier layer 122 may have the thickness of about 1,500 angstroms, the third sub-barrier layer 123 may have the thickness of about 100 angstroms, the fourth sub-barrier layer 124 may have the thickness of about 130 angstroms, and the fifth sub-barrier layer 125 may have the thickness of about 4,200 angstroms. For example, the thickness STK1 of the fifth sub-barrier layer 125 may be greater than the above-described thickness.

The first lower light blocking layer BML1 may be disposed in the first area A1, and the second lower light blocking layer BML2 may be disposed in the second area A2. The first lower light blocking layer BML1 and the second lower light blocking layer BML2 may be electrically insulated from each other, and different signals from each other may be applied to the first lower light blocking layer BML1 and the second lower light blocking layer BML2, respectively. As an example, a constant voltage with a certain voltage level may be applied to the first lower light blocking layer BML1, and the first driving voltage ELVDD (refer to FIG. 5) provided to the pixel circuit PDC (refer to FIG. 5) may be applied to the second lower light blocking layer BML2.

The first lower light blocking layer BML1 and the second lower light blocking layer BML2 may be disposed on the same layer and may include the same material. As an example, the first lower light blocking layer BML1 and the second lower light blocking layer BML2 may be disposed between the fourth sub-barrier layer 124 and the fifth sub-barrier layer 125. The first lower light blocking layer BML1 and the second lower light blocking layer BML2 may be covered by the fifth sub-barrier layer 125. Since the fifth sub-barrier layer 125 has the greatest thickness among the first, second, third, fourth, and fifth sub-barrier layers 121, 122, 123, 124, and 125, the degree of change in characteristics of transistors, which is caused by voltages provided to the first and second lower light blocking layers BML1 and BML2, may be reduced.

The first lower light blocking layer BML1 may include a first opening BMop that defines the transmission area TP. The first lower light blocking layer BML1 may be a pattern layer that functions as a mask in case that an electrode opening CEop is formed through a common electrode CE. As an example, a light irradiated to the common electrode CE from a rear surface of the base layer 110 may reach a portion of each of the common electrode CE and a capping layer CPL after passing through the first opening BMop of the first lower light blocking layer BML1. For example, the portion of the common electrode CE and the capping layer CPL may be removed by the light passing through the first opening BMop of the first lower light blocking layer BML1. The light may be a laser beam.

In the first area A1, a portion overlapping the first opening BMop of the first lower light blocking layer BML1 may be defined as the transmission area TP, and another portion may be defined as the element area EP. The first pixels PX1*r*, PX1*g*, and PX1*b* (refer to FIG. 6) may be disposed in the element area EP, and the first pixels PX1*r*, PX1*g*, and PX1*b* may be spaced apart from the transmission area TP.

A buffer layer BFL may be disposed on the barrier layer 120. The buffer layer BFL may be disposed in both the first area A1 and the second area A2. The buffer layer BFL may prevent metal atoms or impurities from being diffused (or permeated) to a first semiconductor pattern layer (e.g., AC1, DE1, and SE1) from the base layer 110. For example, the buffer layer BFL may control a rate of heat supply during a crystallization process to form the first semiconductor pattern layer so that the first semiconductor pattern layer may be uniformly formed.

The buffer layer BFL may include inorganic layers. As an example, the buffer layer BFL may include a first sub-buffer layer including silicon nitride and a second sub-buffer layer disposed on the first sub-buffer layer and including silicon oxide. The buffer layer BFL may not overlap the transmission area TP. For example, the buffer layer BFL may include an opening defined therethrough to correspond to the transmission area TP. As the buffer layer BFL is not disposed in the transmission area TP, the transmittance of the transmission area TP may be more improved.

FIGS. 7A and 7B show a first pixel PX1 disposed in the first area A1 and a second pixel PX2 disposed in the second area A2, respectively. The first pixel PX1 may be one of the first pixels PX1*r*, PX1g, and PX1*b* (refer to FIG. 6), and the second pixel PX2 may be one of the second pixels PX2*r*, PX2*g*, and PX2*b* (refer to FIG. 6).

The first pixel PX1 may include a first light emitting element ED1 and a first pixel circuit PDC1. The second pixel PX2 may include a second light emitting element ED2 and a second pixel circuit PDC2.

The circuit layer 130 may be disposed on the buffer layer BFL, and the element layer 140 may be disposed on the circuit layer 130. FIG. 7A is a schematic cross-sectional view of a portion of the first light emitting element ED1 and a portion of the first pixel circuit PDC1, which are disposed in the first area A1, and FIG. 7B is a schematic cross-sectional view of a portion of the second light emitting element ED2 and a portion of the second pixel circuit PDC2, which are disposed in the second area A2.

Referring to FIG. 7A, a silicon thin film transistor S-TFT and an oxide thin film transistor O-TFT of the first pixel circuit PDC1 are shown as a representative example. The silicon thin film transistor S-TFT may be one of the first, second, fifth, sixth, and seventh transistors T1, T2, T5, T6, and T7 described with reference to FIG. 5, and the oxide thin film transistor O-TFT may be one of the third and fourth transistors T3 and T4 described with reference to FIG. 5.

The first, second, third, fourth, fifth, sixth, and seventh transistors T1, T2, T3, T4, T5, T6, and T7 included in the first pixel circuit PDC1 may be referred to as first-type transistors. In the first area A1, the first lower light blocking layer BML1 may overlap all the first-type transistors. For example, the first lower light blocking layer BML1 may completely overlap an area in which the first pixel circuit PDC1 is disposed. Accordingly, a voltage applied to the first lower light blocking layer BML1 may be provided regardless of an operation of the first pixel circuit PDC1.

Referring to FIG. 7B, a silicon thin film transistor S-TFTa and an oxide thin film transistor O-TFTa of the second pixel circuit PDC2 are shown as a representative example. The silicon thin film transistor S-TFTa may be the first transistor T1 described with reference to FIG. 5, and the oxide thin film transistor O-TFTa may be one of the third and fourth transistors T3 and T4. The first, second, third, fourth, fifth, sixth, and seventh transistors T1, T2, T3, T4, T5, T6, and T7 included in the second pixel circuit PDC2 may be referred to as second-type transistors. In the second area A2, the second lower light blocking layer BML2 may overlap some of the second-type transistors and may not overlap the other of the second-type transistors. As an example, the second lower light blocking layer BML2 may overlap a portion of an area in which the second pixel circuit PDC2 is disposed, and may overlap the first transistor T1. Accordingly, a voltage provided to the second lower light blocking layer BML2 may be provided in synchronization with an operation of the second pixel circuit PDC2.

Referring to FIGS. 7A and 7B, the first semiconductor pattern layer (e.g., AC1, DE1, and SE1) may be disposed on the buffer layer BFL. The first semiconductor pattern layer may include a silicon semiconductor. As an example, the silicon semiconductor may include amorphous silicon or polycrystalline silicon. For example, the first semiconductor pattern layer may include low temperature polycrystalline silicon.

FIGS. 7A and 7B show only a portion of the first semiconductor pattern layer (e.g., AC1, DE1, and SE1) disposed on the buffer layer BFL, and the first semiconductor pattern layer may be further disposed in other areas. The first semiconductor pattern layer may be arranged with a specific rule over the pixels. The first semiconductor pattern layer may have different electrical properties according to whether it is doped or not or whether it is doped with an N-type dopant or a P-type dopant. The first semiconductor pattern layer may include a first region (e.g., DE1 or SE1) having a relatively high conductivity and a second region (e.g., AC1) having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than that of the first region.

The first region may have a conductivity greater than that of the second region and may substantially function as an electrode or a signal line. The second region may substantially correspond to an active area (or a channel) of the transistor. For example, a portion of the first semiconductor pattern layer may be the active area of the transistor, another portion of the first semiconductor pattern layer may be a source or a drain of the transistor, and the other portion of the first semiconductor pattern layer may be a connection electrode or a connection signal line.

A source area SE1, an active area AC1, and a drain area DE1 of the silicon thin film transistor S-TFT or S-TFTa may be formed from the first semiconductor pattern layer. The source area SE1 and the drain area DE1 of the silicon thin film transistor S-TFT or S-TFTa may extend in opposite directions to each other from the active area AC1 in a cross-section.

FIG. 7B shows a portion of connection signal line CSL formed of the first semiconductor pattern layer. The connection signal line CSL may be connected (e.g., electrically connected) to the second electrode of the sixth transistor T6 (refer to FIG. 5) when viewed in the plane.

The circuit layer 130 may include inorganic layers and organic layers. According to an embodiment, first, second, third, fourth, and fifth insulating layers 10, 20, 30, 40, and 50 sequentially stacked on the buffer layer BFL may be inorganic layers, and the sixth, seventh, and eighth insulating layers 60, 70, and 80 sequentially stacked above the buffer layer BFL may be organic layers.

The first insulating layer 10 may be disposed on the buffer layer BFL. The first insulating layer 10 may cover the first semiconductor pattern layer (e.g., AC1, DE1, and SE1). The first insulating layer 10 may be an inorganic layer and/or an organic layer and may have a single-layer structure or a multi-layer structure. The first insulating layer 10 may include at least one of aluminum oxide, titanium oxide, silicon oxide, silicon nitride, silicon oxynitride, zirconium oxide, and hafnium oxide. In an embodiment, the first insulating layer 10 may have a single-layer structure of a silicon oxide layer. Not only the first insulating layer 10, but also an insulating layer of the circuit layer 130 described below may be an inorganic layer and/or an organic layer and may have a single-layer structure or a multi-layer structure.

A gate electrode GT1 of the silicon thin film transistor S-TFT or S-TFTa may be disposed on the first insulating layer 10. The gate electrode GT1 may be a portion of a metal pattern layer. The gate electrode GT1 may overlap the active area AC1. The gate electrode GT1 may be used as a mask in a process of doping the first semiconductor pattern layer. The gate electrode GT1 may include titanium (Ti), silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), indium tin oxide (ITO), indium zinc oxide (IZO), or the like, however, embodiments are not limited thereto.

The second insulating layer 20 may be disposed on the first insulating layer 10 and may cover the gate electrode GT1. The second insulating layer 20 may be an inorganic layer and may have a single-layer structure or a multi-layer structure. The second insulating layer 20 may include at least one of silicon oxide, silicon nitride, and silicon oxynitride. According to an embodiment, the second insulating layer 20 may have a single-layer structure of a silicon nitride layer.

The third insulating layer 30 may be disposed on the second insulating layer 20. The third insulating layer 30 may be an inorganic layer and may have a single-layer structure or a multi-layer structure. As an example, the third insulating layer 30 may have the multi-layer structure of a silicon oxide layer and a silicon nitride layer. An electrode Csta of the first capacitor Cst (refer to FIG. 5) may be disposed between the second insulating layer 20 and the third insulating layer 30. For example, another electrode (e.g., GT1) of the first capacitor Cst may be disposed between the first insulating layer 10 and the second insulating layer 20.

A second semiconductor pattern layer (e.g., AC2, DE2, and SE2) may be disposed on the third insulating layer 30. The second semiconductor pattern layer (e.g., AC2, DE2, and SE2) may include an oxide semiconductor. The oxide semiconductor may include areas distinguished from each other according to whether a metal oxide is reduced. The area (hereinafter, referred to as a reduced area), in which the metal oxide is reduced, may have a conductivity greater than that of the area (hereinafter, referred to as a non-reduced area) in which the metal oxide is not reduced. The reduced area may function as the source/drain of the transistor or the signal line. The non-reduced area may substantially correspond to the active area (or a semiconductor area, or a channel) of the transistor. For example, a portion of the second semiconductor pattern layer may be the active area of the transistor, another portion of the second semiconductor pattern layer may be the source/drain areas of the transistor, and the other portion of the second semiconductor pattern layer may be a signal transmission area.

A source area SE2, an active area AC2, and a drain area DE2 of the oxide thin film transistor O-TFT or O-TFTa may be formed from the second semiconductor pattern layer. The source area SE2 and the drain area DE2 may extend in opposite directions to each other from the active area AC2 in a cross-section.

The oxide thin film transistor O-TFT disposed in the first area A1 may overlap the first lower light blocking layer BML1. Accordingly, a light incident into the display panel DP from a lower side of the display panel DP may be blocked by the first lower light blocking layer BML1, and thus, may not be provided to the active area AC2 of the oxide thin film transistor O-TFT.

The oxide thin film transistor O-TFTa disposed in the second area A2 may not overlap the second lower light blocking layer BML2. Accordingly, a layer to block a light transmitting toward a lower portion of the oxide thin film transistor O-TFTa may be further provided. As an example, a third lower light blocking layer BML3 may be disposed under the oxide thin film transistor O-TFTa disposed in the second area A2. The third lower light blocking layer BML3 may be disposed between the second insulating layer 20 and the third insulating layer 30. The third lower light blocking layer BML3 may include the same material as the electrode Csta of the first capacitor Cst (refer to FIG. 5) and may be formed by the same process as that of the electrode Csta of the first capacitor Cst (refer to FIG. 5).

The fourth insulating layer 40 may be disposed on the third insulating layer 30. The fourth insulating layer 40 may cover the second semiconductor pattern layer (e.g., AC2, DE2, and SE2). The fourth insulating layer 40 may be an inorganic layer and may have a single-layer structure or a multi-layer structure. The fourth insulating layer 40 may include at least one of aluminum oxide, titanium oxide, silicon oxide, silicon nitride, silicon oxynitride, zirconium oxide, and hafnium oxide. In an embodiment, the fourth insulating layer 40 may have a single-layer structure of a silicon oxide layer.

A gate electrode GT2 of the oxide thin film transistor O-TFT or O-TFTa may be disposed on the fourth insulating layer 40. The gate electrode GT2 may be a portion of a metal pattern layer. The gate electrode GT2 may overlap the active area AC2. The gate electrode GT2 may be used as a mask in a process of reducing the second semiconductor pattern layer.

The fifth insulating layer 50 may be disposed on the fourth insulating layer 40 and may cover the gate electrode GT2. The fifth insulating layer 50 may be an inorganic layer and/or an organic layer and may have a single-layer structure or a multi-layer structure. As an example, the fifth insulating layer 50 may have a multi-layer structure of a silicon oxide layer and a silicon nitride layer.

A first connection electrode CNE10 may be disposed on the fifth insulating layer 50. The first connection electrode CNE10 may be connected (e.g., electrically connected) to the connection signal line CSL via a first contact hole CH1 defined (or formed) through the first to fifth insulating layers 10 to 50.

The buffer layer BFL and at least some insulating layers of the insulating layers 20, 30, 40, 50, 60, 70, and 80, which are included in the circuit layer 130, may include a second opening ILop defined therethrough. As an example, the second opening ILop may be defined (or formed) through the buffer layer BFL and the first, second, third, fourth, and fifth insulating layers 10, 20, 30, 40, and 50. The second opening ILop may be defined in an area overlapping the transmission area TP. For example, as the portion of the buffer layer BFL and the portion of each of the first, second, third, fourth, and fifth insulating layers 10, 20, 30, and 50, which overlap the transmission area TP, are removed, the transmittance of the transmission area TP may be improved.

A minimum width of the second opening ILop may be smaller than a minimum width of the first opening BMop. A sidewall of the buffer layer BFL and the first, second, third, fourth, and fifth insulating layers 10, 20, 30, 40, and 50, which define the second opening ILop, may more protrude to be closer to the second opening ILop than a sidewall of the first lower light blocking layer BML1 toward the transmission area TP, e.g., in a plan view.

The sixth insulating layer 60 may be disposed on the fifth insulating layer 50. The sixth insulating layer 60 may include an organic material. For example, the sixth insulating layer 60 may include a polyimide-based resin. As an example, the sixth insulating layer 60 may include a photosensitive polyimide. A second connection electrode CNE20 may be disposed on the sixth insulating layer 60. The second connection electrode CNE20 may be connected (e.g., electrically connected) to the first connection electrode CNE10 via a second contact hole CH2 defined (or formed) through the sixth insulating layer 60.

The sixth insulating layer 60 may be disposed in both the element area EP and the transmission area TP. The sixth insulating layer 60 may be referred to as a common organic layer. The sixth insulating layer 60 may be filled in the second opening ILop. For example, the sixth insulating layer 60 may overlap the transmission area TP. As the sixth insulating layer 60 is provided in the transmission area TP, a step difference on the upper surface of the sixth insulating layer 60 may be reduced. In case that the step difference between layers overlapping the transmission area TP is reduced, a diffraction of the light incident into the transmission area TP may be alleviated (or reduced). Accordingly, a deformation of the image, which is caused by the diffraction, may be reduced, and the quality of the image acquired by the camera module CMM (refer to FIG. 2A) may be improved.

A portion of the preliminary common organic layer 60-*p* disposed in the transmission area TP may be removed (or etched) in the thickness direction to form (or provide) the sixth insulating layer 60. In FIG. 7A, the preliminary common organic layer 60-*p* is indicated by a dotted line, and the removed portion 60-*del* of the preliminary common organic layer 60-*p* is hatched. A halftone mask may be used to form the sixth insulating layer 60 from the preliminary common organic layer 60-*p*.

A first thickness TK1 of the sixth insulating layer 60 in the transmission area TP may be smaller than a second thickness TK2 of the sixth insulating layer 60 in the element area EP. As an example, the first thickness TK1 may be a minimum thickness or an average thickness of the sixth insulating layer 60 in the transmission area TP, and the second thickness TK2 may be a maximum thickness or an average thickness of the sixth insulating layer 60 in the element area EP. The first thickness TK1 may be equal to or greater than about 40% and smaller than about 100% of the second thickness TK2. As a difference between the first thickness TK1 and the second thickness TK2 increases, the step difference on the upper surface of the sixth insulating layer 60 may increase. For example, in a process of patterning a conductive layer closest to the transmission area TP, the conductive layer may be patterned (or removed) more than originally designed. For example, a probability that a line or wiring becomes thinner may increase, and accordingly, a probability of occurrence of defects may also increase. In the case where the first thickness TK1 is provided to be about 40% or more of the second thickness TK2, the probability of occurrence of defects may decrease. Accordingly, as the first thickness TK1 is provided to be about 40% or more of the second thickness TK2, the transmittance of the transmission area TP may be improved, and defects may be reduced.

As an example, in case that the second thickness TK2 is about 15,000 angstroms, the first thickness TK1 may be equal to or greater than about 6,000 angstroms and may be equal to or smaller than about, 10,000 angstroms. In case that the first thickness TK1 is greater than about 10,000 angstroms, the effect of improving the transmittance may be lowered. Accordingly, the first thickness TK1 may be determined in a range equal to or greater than about 40% of the second thickness TK2 and equal to or smaller than about 10,000 angstroms.

The seventh insulating layer 70 may be disposed on the sixth insulating layer 60 and may cover the second connection electrode CNE20. The eighth insulating layer 80 may be disposed on the seventh insulating layer 70. The seventh insulating layer 70 may include an opening 70*op* formed therethrough to overlap the first opening BMop. A minimum width of the opening 70*op* may be greater than the minimum width of the first opening BMop of the first lower light blocking layer BML1.

Each of the sixth insulating layer 60, the seventh insulating layer 70, and the eighth insulating layer 80 may be an organic layer. For example, the sixth insulating layer 60 may be referred to as a first organic insulating layer, the seventh insulating layer 70 may be referred to as a second organic insulating layer, and the eighth insulating layer 80 may be referred to as a third organic insulating layer. As an example, each of the sixth insulating layer 60, the seventh insulating layer 70, and the eighth insulating layer 80 may include a general-purpose polymer, such as benzocyclobutene (BCB), polyimide, hexamethyldisiloxane (HMDSO), polymethylmethacrylate (PMMA), or polystyrene (PS), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

Referring to FIGS. 7A and 7B, the element layer 140 including the first and second light emitting elements ED1 and ED2 may be disposed on the circuit layer 130. Each of the first and second light emitting elements ED1 and ED2 may include a pixel electrode AE (or an anode), a first functional layer HFL, a light emitting layer EL, a second functional layer EFL, and a common electrode CE (or a cathode). The first functional layer HFL, the second functional layer EFL, and the common electrode CE may be commonly disposed over the pixels PX (refer to FIG. 4).

The pixel electrode AE may be disposed on the eighth insulating layer 80. The pixel electrode AE may be connected (e.g., electrically connected) to the second connection electrode CNE20 via a third contact hole CH3 defined (or formed) through the seventh and eighth insulating layers 70 and 80. The pixel electrode AE may be a semi-transmissive electrode, a transmissive electrode, or a reflective electrode. According to an embodiment, the pixel electrode AE may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum-doped zinc oxide (AZO). For instance, the pixel electrode AE may have a stack structure of ITO/Ag/ITO.

The pixel definition layer PDL may be disposed on the eighth insulating layer 80. The pixel definition layer PDL may have a light absorbing property, and for example, the pixel definition layer PDL may have a black color. The pixel definition layer PDL may include a black coloring agent. The black coloring agent may include a black dye or a black pigment. The black coloring agent may include a metal material, such as carbon black, chromium, or an oxide thereof.

The pixel definition layer PDL may include an opening PDLop defined therethrough to expose a portion of the pixel electrode AE. For example, the pixel definition layer PDL may cover an edge portion of the pixel electrode AE. For example, the pixel definition layer PDL may cover a side surface of the eighth insulating layer 80 adjacent to the transmission area TP. The pixel definition layer PDL may be spaced apart from a side surface of the seventh insulating layer 70 adjacent to the transmission area TP. Accordingly, the pixel definition layer PDL may be stably in contact with the seventh insulating layer 70 and the eighth insulating layer 80.

The light emitting areas may be defined by the openings PDLop defined (or formed) through the pixel definition layer PDL. As an example, a first light emitting area PXA1 may be defined in the first light emitting element ED1, and a second light emitting area PXA2 may be defined in the second light emitting element ED2.

The first spacer HSPC may be disposed on the pixel definition film PDL2. The first protruded spacer SPC may be disposed on the first spacer HSPC. The first spacer HSPC and the first protruded spacer SPC may be integral with each other and may be formed of the same material. As an example, the first spacer HSPC and the first protruded spacer SPC may be formed by the same process by using the halftone mask, however, this is an example. According to an embodiment, the first spacer HSPC and the first protruded spacer SPC may include different materials from each other and may be formed by different processes from each other.

The second spacer UHSPC described with reference to FIG. 6 may have substantially the same thickness as that of the first spacer HSPC, and the second protruded spacer USPC may have substantially the same thickness as that of the first protruded spacer SPC. For example, the second spacer UHSPC and the second protruded spacer USPC may have shapes similar to those of the first spacer HSPC and the first protruded spacer SPC shown in FIG. 7B in a cross-section.

The first functional layer HFL may be disposed on the pixel electrode AE, the pixel definition layer PDL, the first spacer HSPC, and the first protruded spacer SPC. The first functional layer HFL may include a hole transport layer, may include a hole injection layer, or may include both the hole transport layer and the hole injection layer. The first functional layer HFL may be disposed over the first area A1 and the second area A2.

The light emitting layer EL may be disposed on the first functional layer HFL and may be disposed in an area corresponding to the opening PDLop of the pixel definition layer PDL. The light emitting layer EL may include an organic material, an inorganic material, or an organic-inorganic material, which emits a light having a certain color. The light emitting layer EL may be disposed in the first area A1, the second area A2, and the intermediate area AM. The light emitting layer EL disposed in the first area A1 may be disposed in an area spaced apart from the transmission area TP, e.g., the element area EP.

The second functional layer EFL may be disposed on the first functional layer HFL and may cover the light emitting layer EL. The second functional layer EFL may include an electron transport layer, may include an electron injection layer, or may include both the electron transport layer and the electron injection layer. The second functional layer EFL may be disposed over the first area A1 and the second area A2.

The common electrode CE may be disposed on the second functional layer EFL. The common electrode CE may be disposed in the first area A1 and the second area A2. The common electrode CE may include an electrode opening CEop defined (or formed) therethrough to overlap the first opening BMop. A minimum width of the electrode opening CEop may be greater than a minimum width of the first opening BMop of the first lower light blocking layer BML1.

The element layer 140 may further include the capping layer CPL disposed on the common electrode CE. The capping layer CPL may improve a light emission efficiency by the principle of constructive interference. The capping layer CPL may include a material having a refractive index equal to or greater than about 1.6 with respect to a light having a wavelength of about 589 nm. The capping layer CPL may be an organic capping layer including an organic material, an inorganic capping layer including an inorganic material, or a composite capping layer including the organic material and the inorganic material. For instance, the capping layer may include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. In another example, the carbocyclic compounds, the heterocyclic compounds, and the amine group-containing compounds may be substituted with substituents including O, N, S, Se, Si, F, Cl, Br, I, or any combination thereof.

A portion of the capping layer CPL, which overlaps the electrode opening CEop of the common electrode CE, may be removed. As the portion of the capping layer CPL and the portion of the common electrode CE overlapping the transmission area TP are removed, the light transmittance of the transmission area TP may be improved.

The encapsulation layer 150 may be disposed on the element layer 140. The encapsulation layer 150 may include an inorganic layer 151, an organic layer 152, and an inorganic layer 153, which are sequentially stacked, however, layers included in the encapsulation layer 150 should not be limited thereto or thereby.

The inorganic layers 151 and 153 may protect the element layer 140 from moisture and oxygen, and the organic layer 152 may protect the element layer 140 from a foreign substance such as dust particles. The inorganic layers 151 and 153 may include a silicon nitride layer, a silicon oxynitride layer, a silicon oxide layer, a titanium oxide layer, or an aluminum oxide layer. The organic layer 152 may include an acrylic-based organic layer, however, embodiments are not limited thereto or thereby.

The sensor layer 200 may be disposed on the display layer 100. The sensor layer 200 may be referred to as a sensor, an input sensing layer, or an input sensing panel. The sensor layer 200 may include a sensor base layer 210, a first sensor conductive layer 220, a sensor insulating layer 230, a second sensor conductive layer 240, and a sensor cover layer 250.

The sensor base layer 210 may be disposed (e.g., directly disposed) on the display layer 100. The sensor base layer 210 may be an inorganic layer including at least one of silicon nitride, silicon oxynitride, and silicon oxide. According to an embodiment, the sensor base layer 210 may be an organic layer including an epoxy resin, an acrylic resin, or an imide-based resin. The sensor base layer 210 may have a single-layer structure or a multi-layer structure of layers stacked in the third direction DR3.

Each of the first sensor conductive layer 220 and the second sensor conductive layer 240 may have a single-layer structure or a multi-layer structure of layers stacked in the third direction DR3.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. For example, the transparent conductive layer may include a conductive polymer such as poly(3,4-ethylenedioxythiophene) (PEDOT), metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The sensor insulating layer 230 may be disposed between the first sensor conductive layer 220 and the second sensor conductive layer 240. The sensor insulating layer 230 may include an inorganic layer. The inorganic layer may include at least one of aluminum oxide, titanium oxide, silicon oxide, silicon nitride, silicon oxynitride, zirconium oxide, and hafnium oxide.

According to an embodiment, the sensor insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The sensor cover layer 250 may be disposed on the sensor insulating layer 230 and may cover the second sensor conductive layer 240. The second sensor conductive layer 240 may include a conductive pattern layer 240P (refer to FIG. 13A). The sensor cover layer 250 may cover the conductive pattern layer 240P and may reduce a possibility of occurrence of damages in the conductive pattern layer 240P in a subsequent process.

The sensor cover layer 250 may include an inorganic material. As an example, the sensor cover layer 250 may include silicon nitride, however, embodiments are not limited thereto or thereby.

The anti-reflective layer 300 may be disposed on the sensor layer 200. The anti-reflective layer 300 may include a division layer 310, color filters 320, and a planarization layer 330. The division layer 310 and the color filters 320 may not be disposed in the transmission area TP of the first area A1.

The division layer 310 may overlap the conductive pattern layer 240P of the second sensor conductive layer 240. The sensor cover layer 250 may be disposed between the division layer 310 and the second sensor conductive layer 240. The division layer 310 may prevent an external light from being reflected by the second sensor conductive layer 240. Materials for the division layer 310 should not be limited as long as the materials absorb a light. The division layer 310 may have a black color and may include a black coloring agent. The black coloring agent may include a black dye or a black pigment. The black coloring agent may include a metal material, such as carbon black, chromium, or an oxide thereof.

Figure 18:
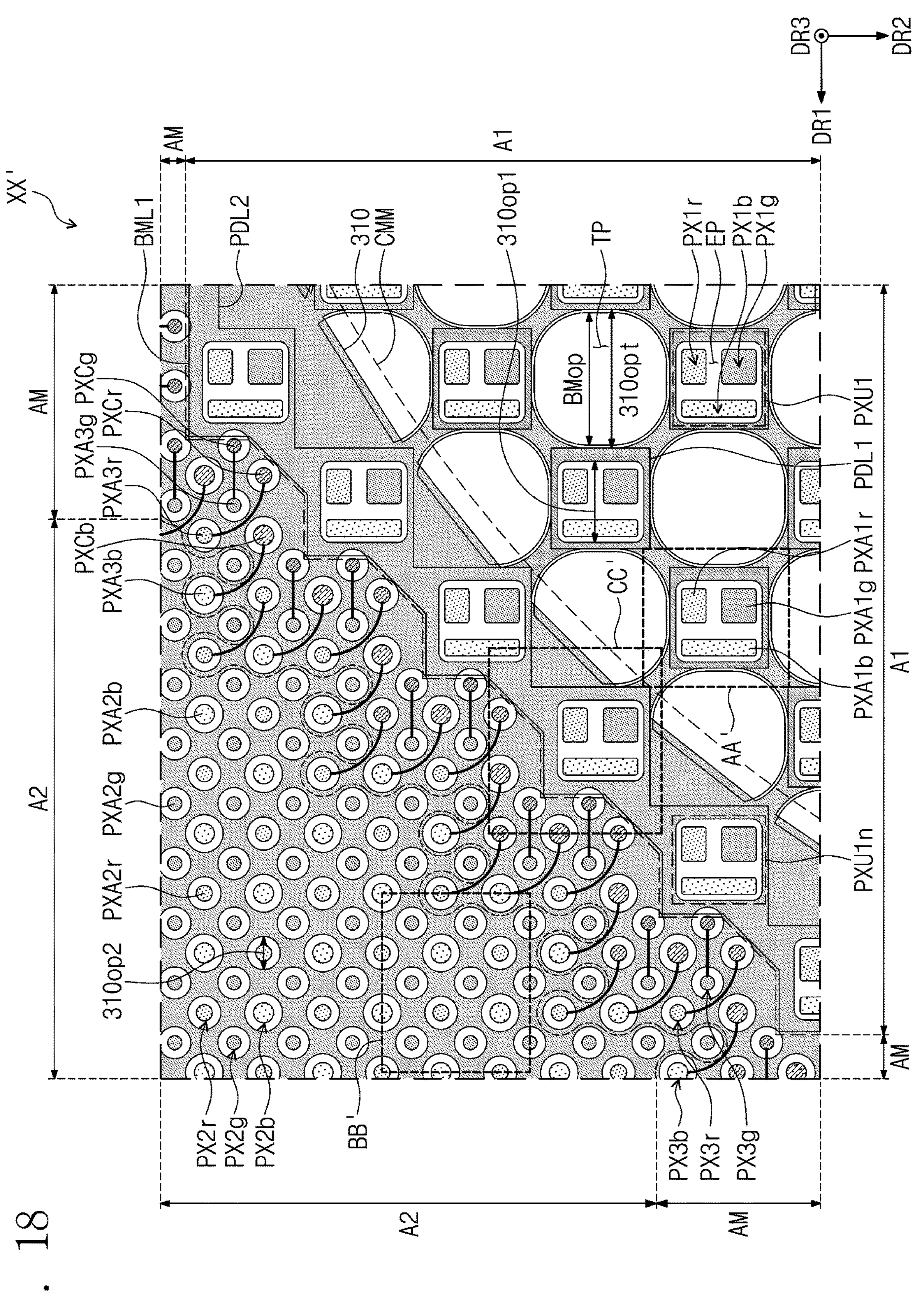
FIG. 18 is a schematic enlarged plan view of a portion of a display panel according to an embodiment.

The division layer 310 may include division openings 310*op*1 and 310*op*2 and a transmission opening 310*opt*, which are defined therethrough. The division openings 310*op*1 and 310*op*2 may overlap the light emitting layers EL. For reference, the shape of the division layer 310 in a plane is shown in FIG. 18. The color filters 320 may be disposed to correspond to the division openings 310*op*1 and 310*op*2, respectively. The color filters 320 may transmit a light provided from the light emitting layer EL overlapping the color filters 320. The transmission opening 310*opt* of the division layer 310 may overlap the first opening BMop of the first lower light blocking layer BML1. A minimum width of the transmission opening 310*opt* of the division layer 310 may be substantially the same as a minimum width of the first opening BMop of the first lower light blocking layer BML1. For example, an edge portion of the division layer 310 may be substantially aligned with an edge portion of the first lower light blocking layer BML1 in an area adjacent to the transmission area TP. In the disclosure, the expression "components are substantially aligned with each other" or the expression "components have substantially the same width as each other" not only means a case that one component is completely aligned with the other component or a case that a width of one component is physically the same as a width the other component but also means a case that one component coincides with the other component within a range including differences that may occur due to fabrication errors in spite of the same design.

An edge portion of the division layer 310 may more protrude to be closer to the second opening ILop than an edge portion of the pixel definition layer PDL and an edge portion of the common electrode CE in the area adjacent to the transmission area TP, e.g., in a plan view.

The planarization layer 330 may cover the division layer 310 and the color filters 320. The planarization layer 330 may include an organic material and may provide a flat surface on an upper surface thereof. According to an embodiment, the planarization layer 330 may be omitted.

According to an embodiment, the anti-reflective layer 300 may include a reflective control layer instead of the color filters 320. As an example, in the structures shown in FIGS. 7A and 7B, the color filters 320 may be omitted, and the reflective control layer may be provided in place of the color filters 320. The reflective control layer may selectively absorb a light in some bands of lights reflected from inside the display panel and/or electronic device or lights incident from outside the display panel and/or electronic device.

As an example, the reflective control layer may absorb a light in a first wavelength range from about 490 nm to about 505 nm and a light in a second wavelength range from about 585 nm to about 600 nm, and thus, a light transmittance in the first wavelength range and in the second wavelength range may be about 40% or less. The reflective control layer may absorb a light having a wavelength outside wavelength ranges of red, green, and blue lights emitted from the light emitting layer EL. As described above, since the reflective control layer absorbs the light having a wavelength outside wavelength ranges of red, green, and blue lights emitted from the light emitting layer EL, the brightness of the display panel and/or electronic device may be prevented from being lowered. For example, the light emission efficiency of the display panel and/or electronic device may be prevented from being lowered, and the visibility of the display panel and/or electronic device may be improved.

The reflective control layer may be an organic material layer including a dye, a pigment, or a combination thereof. The reflective control layer may include a tetraazaporphyrin-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, and combinations thereof.

According to an embodiment, the reflective control layer may have a transmittance from about 64% to about 72%. The transmittance of the reflective control layer may be controlled according to a content of the pigment and/or the dye included in the reflective control layer. The reflective control layer may overlap the light emitting areas when viewed in the plane but may not overlap the transmission area TP when viewed in the plane.

Figure 8A:
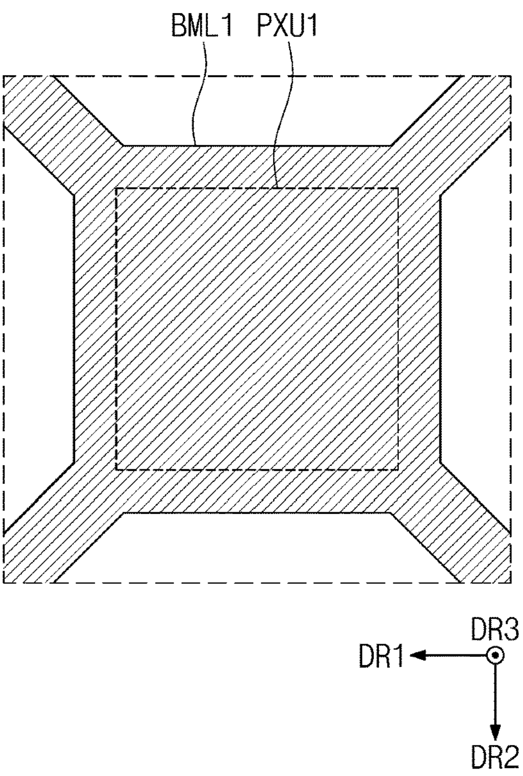
FIG. 8A is a schematic plan view of a portion of a first lower light blocking layer according to an embodiment.
Figure 8B:
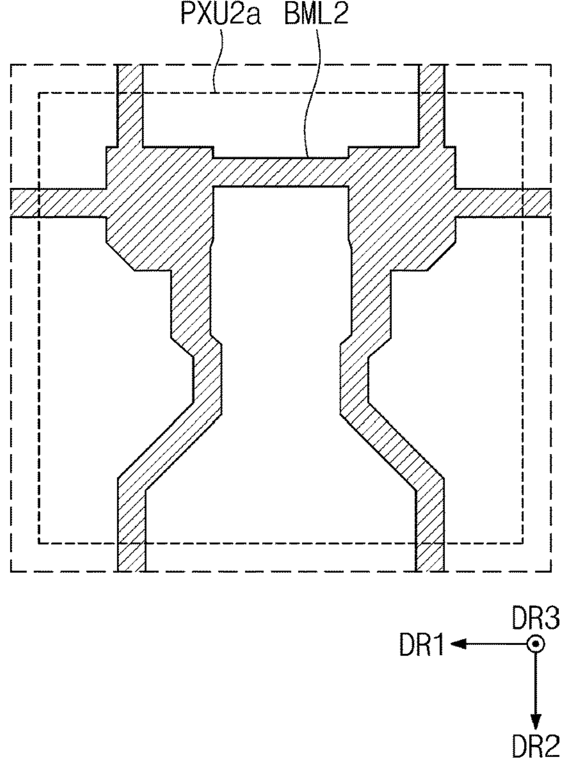
FIG. 8B is a schematic plan view of a portion of a second lower light blocking layer according to an embodiment.

FIG. 8A is a schematic plan view of a portion of the first lower light blocking layer BML1 according to an embodiment. FIG. 8B is a schematic plan view of a portion of the second lower light blocking layer BML2 according to an embodiment.

The first pixel unit PXU1 overlapping the first lower light blocking layer BML1 is indicated by a dotted line in FIG. 8A, and the first sub-pixel unit PXU2*a* overlapping the second lower light blocking layer BML2 is indicated by a dotted line in FIG. 8B. An arrangement relationship between the second sub-pixel unit PXU2*b* (refer to FIG. 6) and the second lower light blocking layer BML2 may be substantially the same as an arrangement relationship between the first sub-pixel unit PXU2*a* and the second lower light blocking layer BML2, and thus, details of the arrangement relationship between the second sub-pixel unit PXU2*b* (refer to FIG. 6) and the second lower light blocking layer BML2 will be omitted for descriptive convenience.

Referring to FIGS. 8A and 8B, the first lower light blocking layer BML1 and the second lower light blocking layer BML2 may be disposed on the same layer and may be substantially simultaneously formed by the same process. As a result, when compared with a process of forming the first and second lower light blocking layers disposed on different layers from each other, in the process of forming the first and second lower light blocking layers BML1 and BML2 according to an embodiment, a mask process may be omitted one time. Accordingly, a manufacturing process of the display panel DP (refer to FIG. 7A) may be simplified, and a manufacturing cost of the display panel DP may be reduced.

The first lower light blocking layer BML1 and the second lower light blocking layer BML2 may be disposed between the fourth sub-barrier layer 124 and the fifth sub-barrier layer 125 shown in FIGS. 7A and 7B.

The first lower light blocking layer BML1 and the second lower light blocking layer BML2 may be electrically insulated from each other. The constant voltage with the certain voltage level may be provided to the first lower light blocking layer BML1, and a power voltage applied to the second pixel circuit PDC2 (refer to FIG. 7B) may be provided to the second lower light blocking layer BML2. As an example, the first driving voltage ELVDD (refer to FIG. 5) may be provided to the second lower light blocking layer BML2.

The first lower light blocking layer BML1 may overlap (e.g., entirely overlap) the area in which the first pixel unit PXU1 is disposed. Accordingly, the first lower light blocking layer BML1 may overlap the first pixels PX1*r*, PX1*g*, and PX1*b* (refer to FIG. 6) included in the first pixel unit PXU1. In the first area A1, the first lower light blocking layer BML1 may overlap all the first-type transistors included in each of the first pixels PX1*r*, PX1*g*, and PX1*b* (refer to FIG. 6). Accordingly, the voltage provided to the first lower light blocking layer BML1 may be provided regardless of the operation of the first pixels PX1*r*, PX1*g*, and PX1*b* (refer to FIG. 6).

The second lower light blocking layer BML2 may overlap a portion of the area in which the first sub-pixel unit PXU2*a* is disposed. As an example, the first sub-pixel unit PXU2*a* may include the second-second color pixel PX2*g* (refer to FIG. 6) and the second-third color pixel PX2*b* (refer to FIG. 6). In the second area A2, the second lower light blocking layer BML2 may overlap a portion of the second-type transistors included in each of the second-second color pixel PX2*g* and the second-third color pixel PX2*b*. As an example, the second lower light blocking layer BML2 may overlap the first transistor T1 (refer to FIG. 5). Accordingly, the voltage provided to the second lower light blocking layer BML2 may be provided in synchronization with an operation of the second-second color pixel PX2*g* and the second-third color pixel PX2*b*.

Figure 9A:
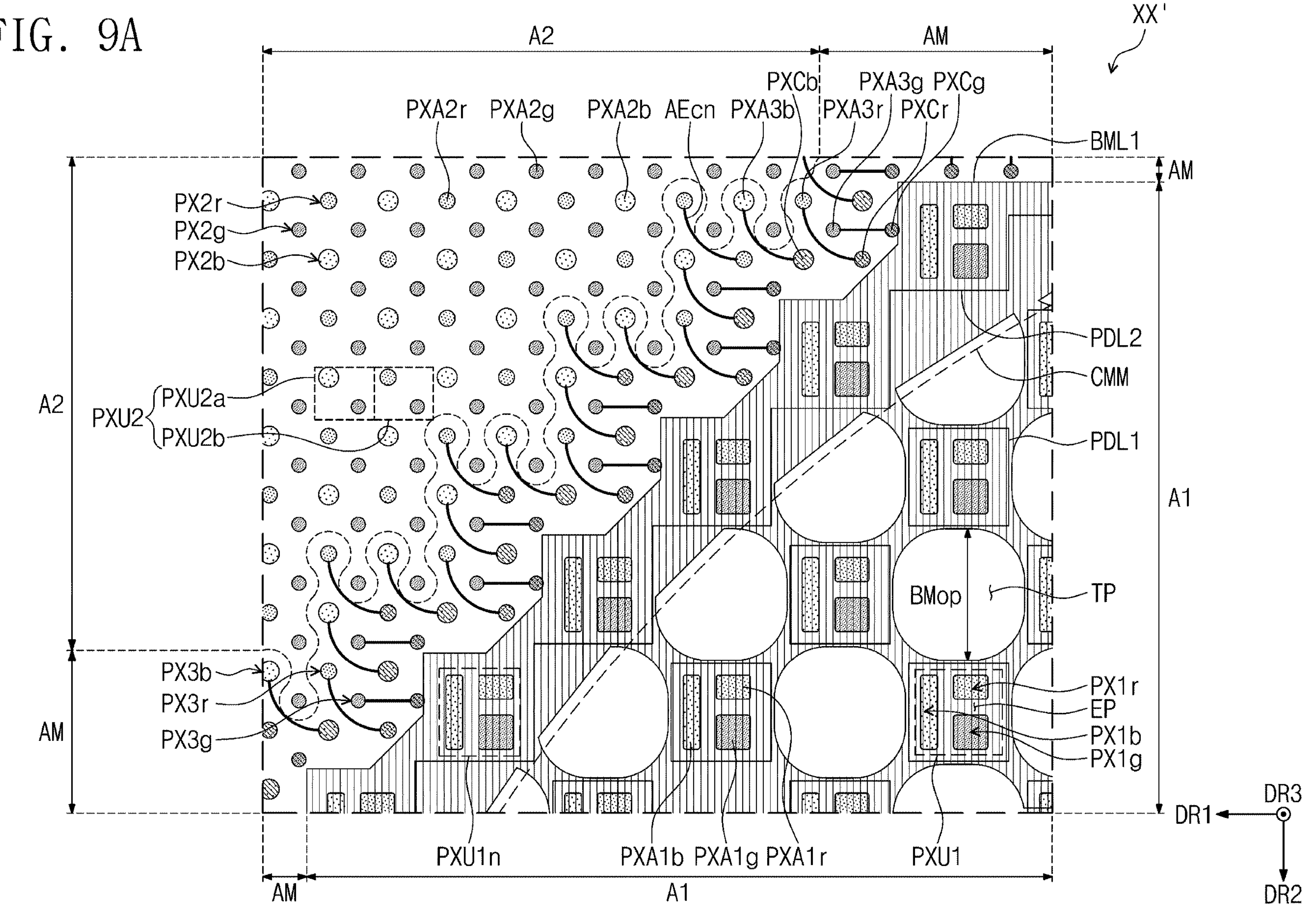
FIG. 9A is a schematic enlarged plan view of a portion of a display panel according to an embodiment.
Figure 9B:
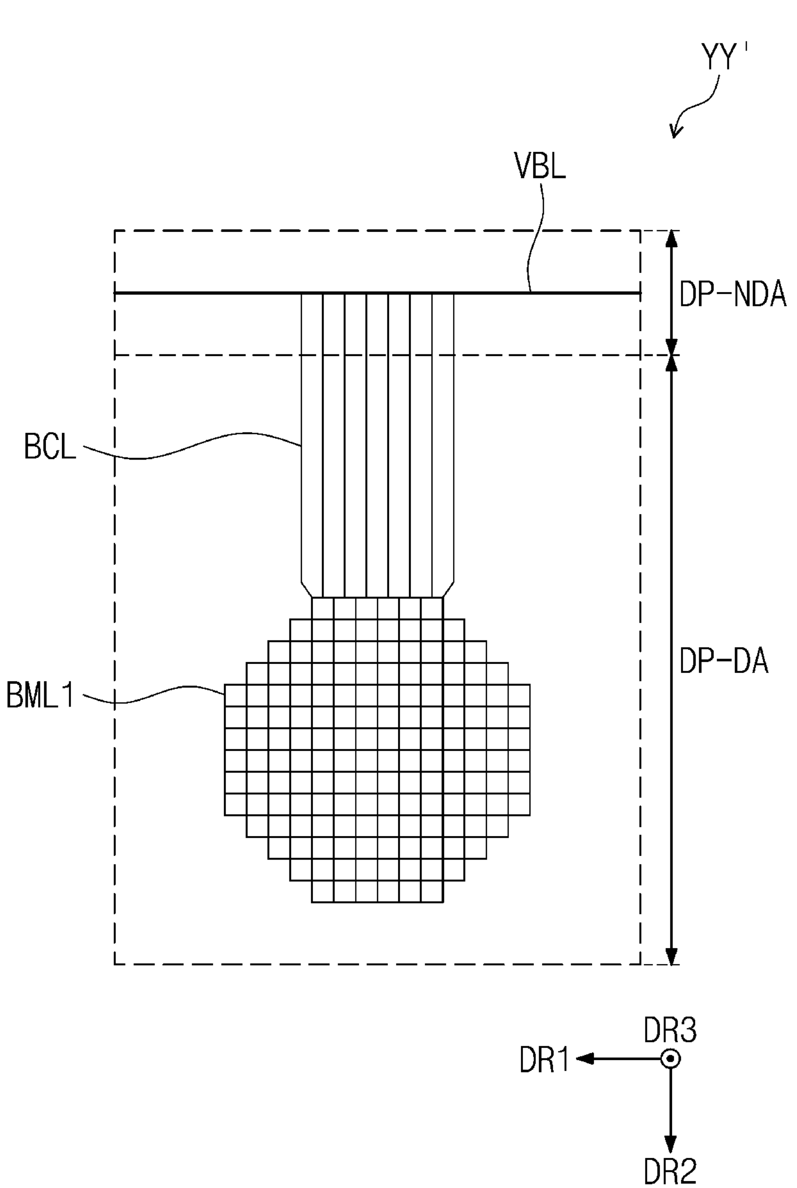
FIG. 9B is a schematic enlarged plan view of a portion of a display panel according to an embodiment.

FIG. 9A is a schematic enlarged plan view of a portion of the display panel according to an embodiment. FIG. 9B is a schematic enlarged plan view of a portion of the display panel according to an embodiment. FIG. 9A is a schematic enlarged plan view of the portion XX' shown in FIG. 4. FIG. 9B is a schematic enlarged plan view of a portion YY' shown in FIG. 4.

Referring to FIGS. 9A and 9B, the first lower light blocking layer BML1 may be disposed in the first area A1. The display panel DP (refer to FIG. 4) may further include a first light blocking voltage line VBL and a second light blocking voltage line BCL. The first light blocking voltage line VBL and the second light blocking voltage line BCL may be electrically connected to the first lower light blocking layer BML1 and may apply the constant voltage with the certain voltage level to the first lower light blocking layer BML1.

As an example, the first light blocking voltage line VBL may be disposed in the non-display area DP-NDA and may surround at least a portion of the display area DP-DA. Pads may be respectively connected to opposite end portions of the first light blocking voltage line VBL, and the constant voltage may be respectively provided to the opposite end portions of the first light blocking voltage line VBL via the pads.

The second light blocking voltage line BCL may extend from the first light blocking voltage line VBL and may be connected (e.g., electrically connected) to the first lower light blocking layer BML1 via the display area DP-DA. The second light blocking voltage line BCL may be provided in plural. FIG. 9B shows eight second light blocking voltage lines BCL as a representative example, however, the number of the second light blocking voltage lines BCL may be smaller or greater than eight.

FIG. 9A shows the camera module CMM overlapping the first area A1. A dotted line indicated as the camera module CMM may correspond to a light receiving portion or a lens of the camera module CMM that receives a light.

The camera module CMM may overlap a portion of the first area A1. As an example, the camera module CMM may overlap the transmission areas TP and the element areas EP in which the first pixel unit PXU1 is disposed. The camera module CMM may not overlap the adjacent pixel unit PXU1*n*. For example, the camera module CMM may not overlap the intermediate area AM and the second area A2. Accordingly, the camera module CMM may not overlap the second pixels PX2*r*, PX2*g*, and PX2*b* and the third pixels PX3*r*, PX3*g*, and PX3*b*.

Figure 9C:
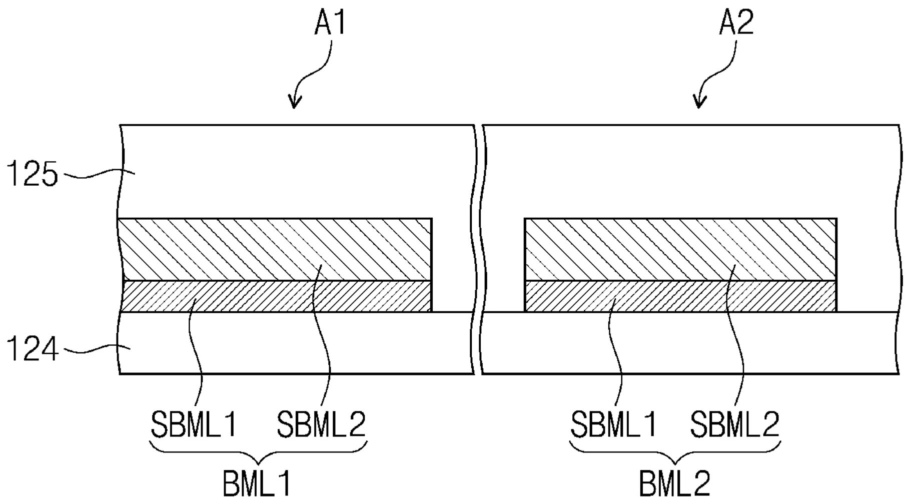
FIG. 9C is a schematic cross-sectional view of a first lower light blocking layer and a second lower light blocking layer according to an embodiment.

FIG. 9C is a schematic cross-sectional view of the first lower light blocking layer BML1 and the second lower light blocking layer BML2 according to an embodiment.

Referring to FIG. 9C, each of the first lower light blocking layer BML1 and the second lower light blocking layer BML2 may include a first sub-lower light blocking layer SBML1 and a second sub-lower light blocking layer SBML2. The second sub-lower light blocking layer SBML2 may be disposed on the first sub-lower light blocking layer SBML1. The first sub-lower light blocking layer SBML1 may include titanium, however, embodiments are not limited thereto. The second sub-lower light blocking layer SBML2 may include molybdenum or copper, however, embodiments are not limited thereto.

A passage may be defined by cracks generated in the first, second, third, and fourth sub-barrier layers 121, 122, 123, and 124 (refer to FIG. 7A) and particles between the first, second, third, and fourth sub-barrier layers 121, 122, 123, and 124 (refer to FIG. 7A). For example, hydrogen may be introduced through the passage, and the first sub-lower light blocking layer SBML1 may function to adsorb hydrogen. Accordingly, an occurrence of defects due to the hydrogen may be reduced in the transistor.

The first sub-lower light blocking layer SBML1 may have a thickness smaller than a thickness of the second sub-lower light blocking layer SBML2. As an example, the thickness of the second sub-lower light blocking layer SBML2 may be about four times greater than the thickness of the first sub-lower light blocking layer SBML1. As an example, the thickness of the first sub-lower light blocking layer SBML1 may be about 300 angstroms, and the thickness of the second sub-lower light blocking layer SBML2 may be about 1,200 angstroms.

Figure 9D:
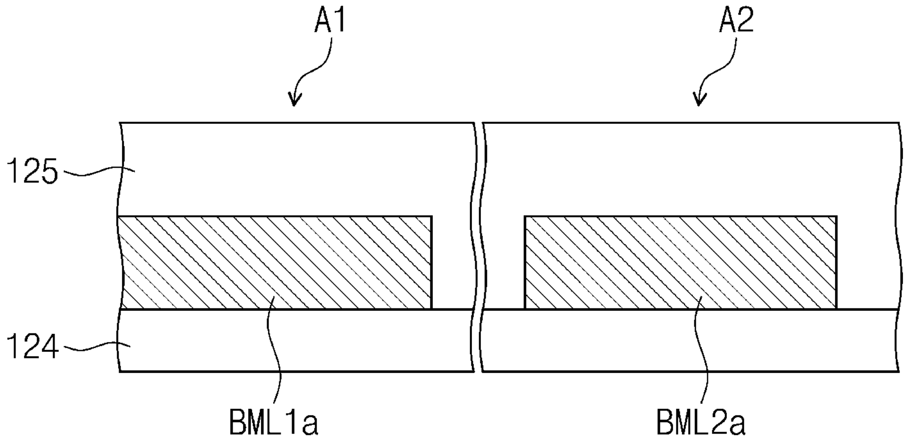
FIG. 9D is a schematic cross-sectional view of a first lower light blocking layer and a second lower light blocking layer according to an embodiment.

FIG. 9D is a schematic cross-sectional view of a first lower light blocking layer BML1*a* and a second lower light blocking layer BML2*a* according to an embodiment.

Referring to FIG. 9D, each of the first lower light blocking layer BML1*a* and the second lower light blocking layer BML2*a* may have a single-layer structure. For example, each of the first lower light blocking layer BMLla and the second lower light blocking layer BML2*a* may include molybdenum or copper, however, embodiments are not limited thereto.

FIGS. 10A, 11A, 12A, 13A, 14A, 15A, and 16A (hereinafter, referred to as FIGS. to 16A) are plan views of an arrangement of conductive pattern layers and semiconductor pattern layers, which are included in the circuit layer of the first area A1 according to an embodiment. FIGS. 10B, 11B, 12B, 13B, 14B, 15B, and 16B (hereinafter, referred to as FIGS. to 16B) are plan views of an arrangement of the conductive pattern layers and the semiconductor pattern layers, which are included in the circuit layer of the second area A2 according to an embodiment. FIGS. 10A to 16A show the driving circuit of the first-first color pixel PX1*r* (refer to FIG. 6), the driving circuit of the second color pixel PX1*g* (refer to FIG. 6), and the driving circuit of the third color pixel PX1*b* (refer to FIG. 6), which are arranged in the first area A1 (refer to FIG. 6). FIGS. 10B to 16B show two driving circuits adjacent to each other and arranged in the second area A2 (refer to FIG. 6), for example, the driving circuit of the second-third color pixel PX2*b* (refer to FIG. 6) and the driving circuit of the second-first color pixel PX2*r* (refer to FIG. 6).

Figure 10A:
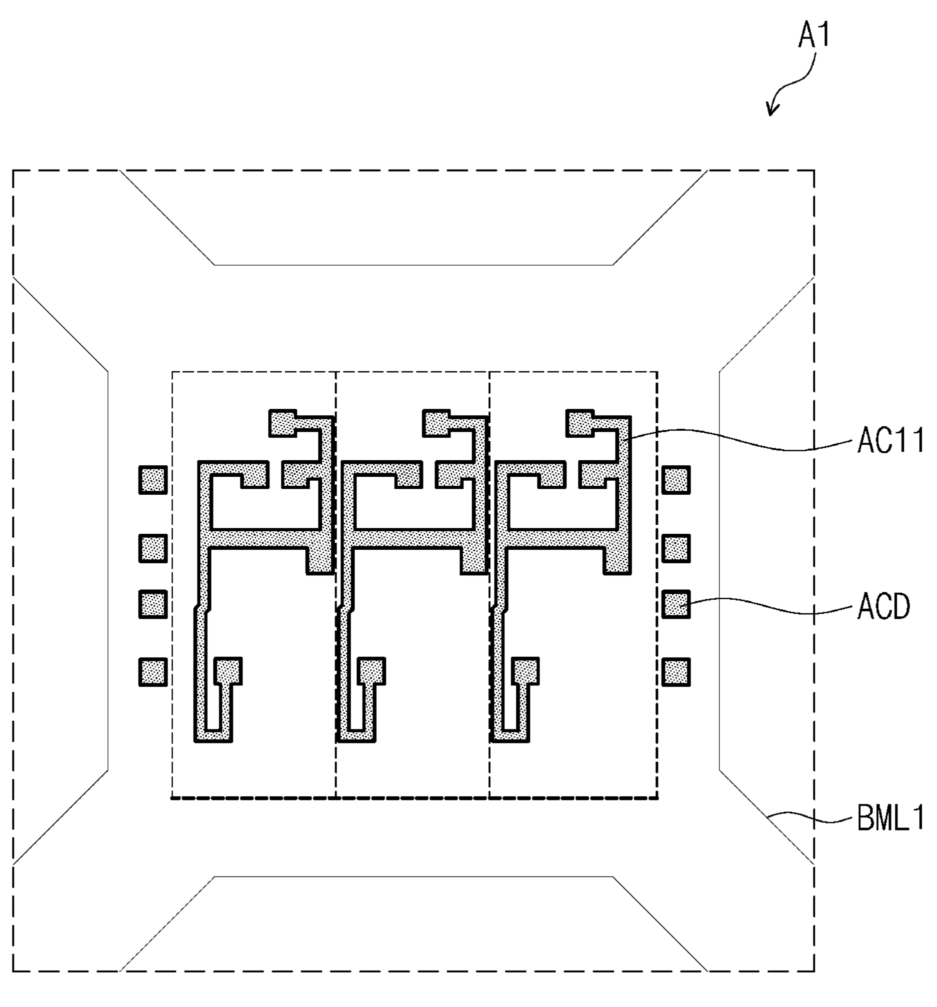
FIG. 10A is a schematic plan view of a layer forming pixel circuits arranged in a first area according to an embodiment.
Figure 10A:
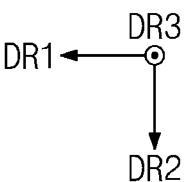
Figure 10B:
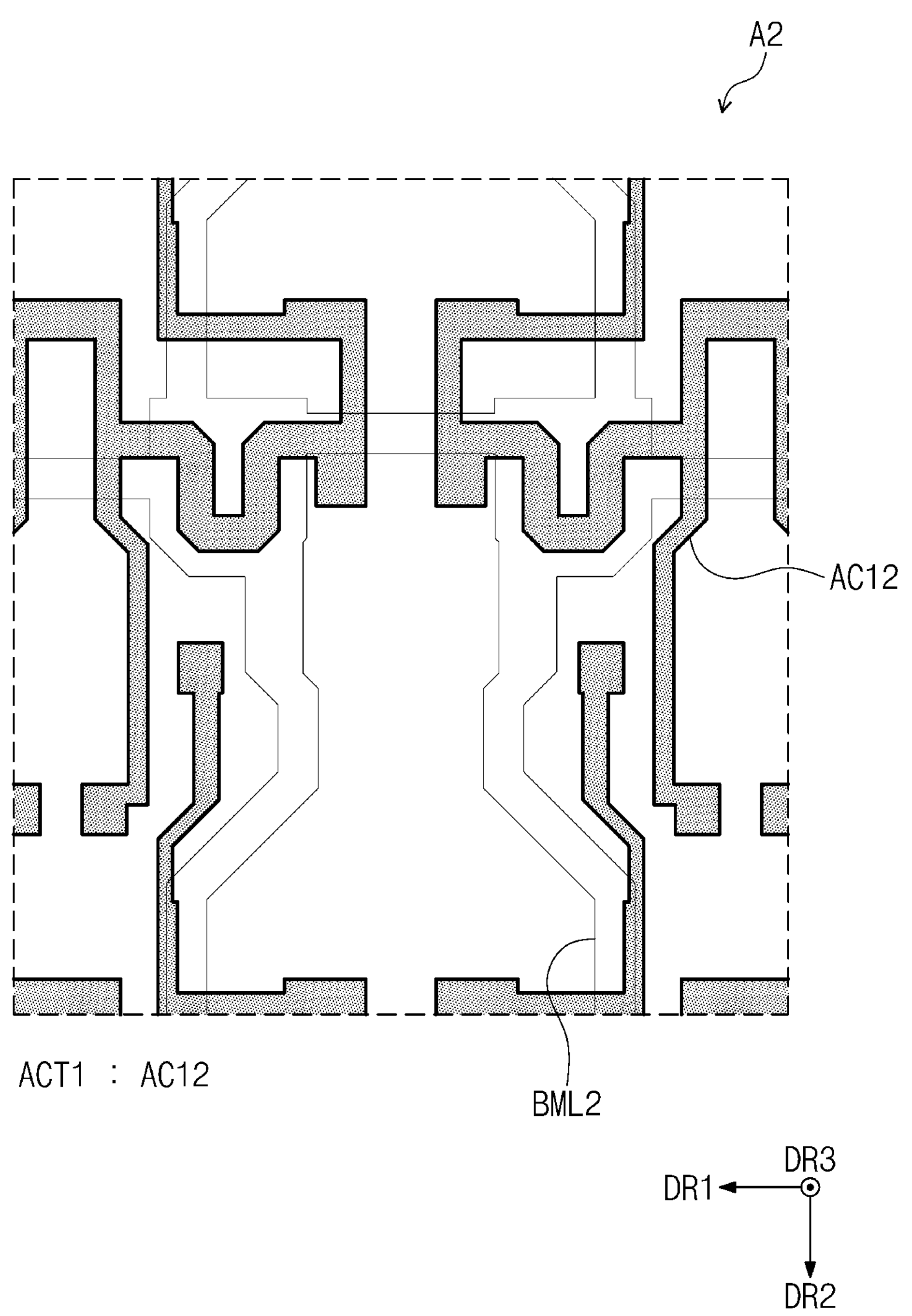
FIG. 10B is a schematic plan view of a layer forming pixel circuits arranged in a second area according to an embodiment.

FIG. 10A is a schematic plan view of a layer forming the pixel circuits arranged in the first area A1 according to an embodiment. FIG. 10B is a schematic plan view of a layer forming the pixel circuits arranged in the second area A2 according to an embodiment.

Referring to FIGS. 7A, 7B, 10A, and 10B, a first semiconductor layer ACT1 may be disposed between the buffer layer BFL and the first insulating layer 10. The first semiconductor layer ACT1 may include a silicon semiconductor. As an example, the silicon semiconductor may include amorphous silicon or polycrystalline silicon. For example, the first semiconductor layer ACT1 may include low temperature polycrystalline silicon.

The first semiconductor layer ACT1 may include a first semiconductor pattern layer AC11 disposed in the first area A1, a second semiconductor pattern layer AC12 disposed in the second area A2, and outer semiconductor pattern layers ACD disposed in the first area A1.

Referring to FIG. 10A, the first semiconductor pattern layer AC11 and the outer semiconductor pattern layers ACD may overlap (e.g., entirely overlap) the first lower light blocking layer BML1 in the first area A1. Referring to FIG. 10B, a portion of the second semiconductor pattern layer AC12 may overlap the second lower light blocking layer BML2 in the second area A2, and another portion of the second semiconductor pattern layer AC12 may not overlap the second lower light blocking layer BML2 in the second area A2.

Figure 11A:
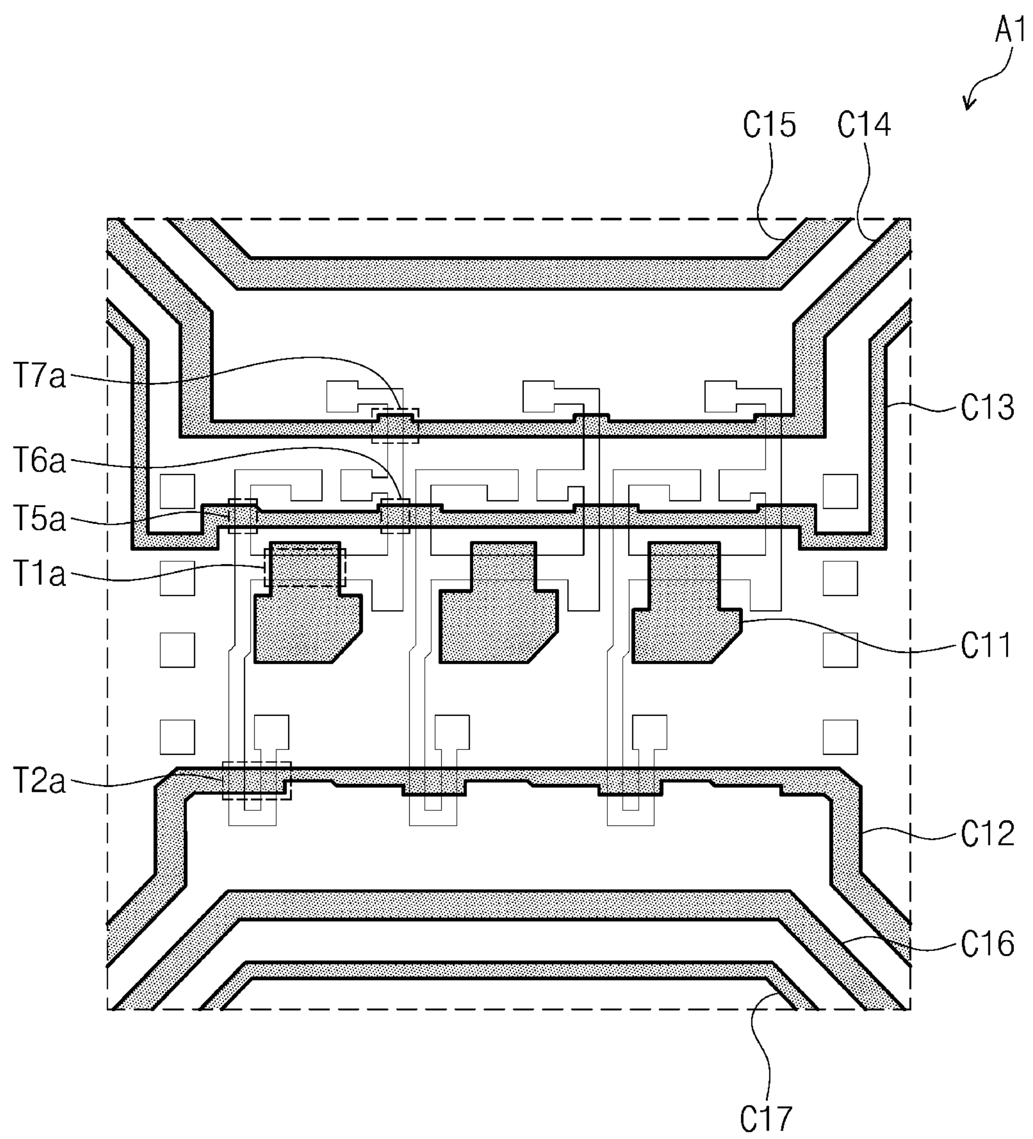
FIG. 11A is a schematic plan view of a layer forming pixel circuits arranged in a first area according to an embodiment.
Figure 11A:
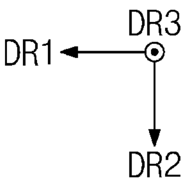
Figure 11B:
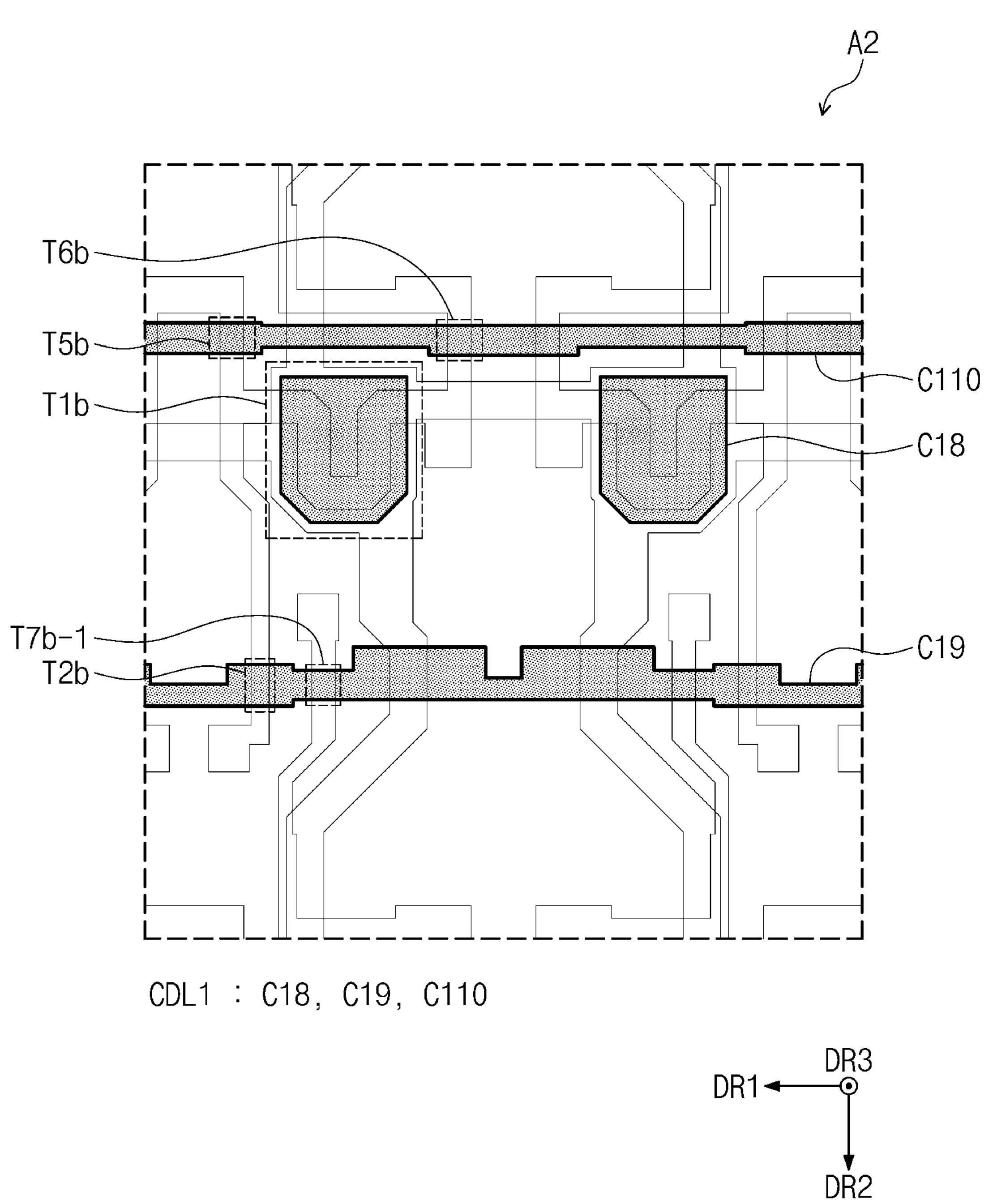
FIG. 11B is a schematic plan view of a layer forming pixel circuits arranged in a second area according to an embodiment.

FIG. 11A is a schematic plan view of a layer forming the pixel circuits arranged in the first area A1 according to an embodiment, and FIG. 11B is a schematic plan view of a layer forming the pixel circuits arranged in the second area A2 according to an embodiment.

Referring to FIGS. 7A, 7B, 11A, and 11B, a first conductive layer CDL1 may be disposed between the first insulating layer 10 and the second insulating layer 20. The first conductive layer CDL1 may include a metal, an alloy, a conductive metal oxide, or a transparent conductive material. As an example, the first conductive layer CDL1 may include silver, silver-containing alloys, molybdenum, molybdenum-containing alloys, aluminum, aluminum-containing alloys, aluminum nitride, tungsten, tungsten nitride, copper, indium tin oxide, indium zinc oxide, etc., however, embodiments are not limited thereto.

The first conductive layer CDL1 may include first, second, third, fourth, fifth, sixth, seventh, eighth, ninth, and tenth conductive pattern layers C11, C12, C13, C14, C15, C16, C17, C18, C19, and C110.

The first conductive pattern layer C11 may be the first gate electrode GT1 shown in FIG. 7A, and the eighth conductive pattern layer C18 may be the first gate electrode GT1 shown in FIG. 7B. The first conductive pattern layer C11 and the eighth conductive pattern layer C18 may be arranged in an island shape. The first conductive pattern layer C11 may form a first transistor T1*a* together with the first semiconductor pattern layer AC11 (refer to FIG. 10A). The eighth conductive pattern layer C18 may form a first transistor T1*b* together with the second semiconductor pattern layer AC12 (refer to FIG. 10B).

The second conductive pattern layer C12 and the ninth conductive pattern layer C19 may correspond to the j-th write scan line GWLj of FIG. 5. The second conductive pattern layer C12 may form a second transistor T2*a* together with the first semiconductor pattern layer AC11 (refer to FIG. 10A). The ninth conductive pattern layer C19 may form a second transistor T2*b* together with the second semiconductor pattern layer AC12 (refer to FIG. 10B).

The third conductive pattern layer C13 and the tenth conductive pattern layer C110 may correspond to the j-th emission control line ECLj of FIG. 5. The third conductive pattern layer C13 may form fifth and sixth transistors T5*a* and T6*a* together with the first semiconductor pattern layer AC11 (refer to FIG. 10A). The tenth conductive pattern layer C110 may form fifth and sixth transistors T5*b* and T6*b* together with the second semiconductor pattern layer AC12 (refer to FIG. 10B).

The fourth conductive pattern layer C14 may correspond to the j-th black scan line GBLj of FIG. 5. The fourth conductive pattern layer C14 may form a seventh transistor T7*a* together with the first semiconductor pattern layer AC11 (refer to FIG. 10A). In the second area A2, the j-th black scan line GBLj may correspond to a (j−1)th write scan line or a (j+1)th write scan line. Accordingly, the ninth conductive pattern layer C19 of the second area A2 may form a seventh transistor T7*b*-1 together with the second semiconductor pattern layer AC12 (refer to FIG. 10B). The seventh transistor T7*b*-1 may be a seventh transistor included in another driving circuit adjacent thereto.

The fifth, sixth, and seventh conductive pattern layers C15, C16, and C17 may be arranged adjacent to the transmission area TP and may be referred to as outer signal lines. As an example, the fifth conductive pattern layer C15 may correspond to a (j−2)th write scan line. The fifth conductive pattern layer C15 may be a line that applies the write scan signal to other pixels arranged in the first area A1. The sixth conductive pattern layer C16 may correspond to the (j+1)th write scan line. The sixth conductive pattern layer C16 may apply the write scan signal to the pixels arranged in the second area A2. The seventh conductive pattern layer C17 may correspond to a (j+1)th emission control line.

Figure 12A:
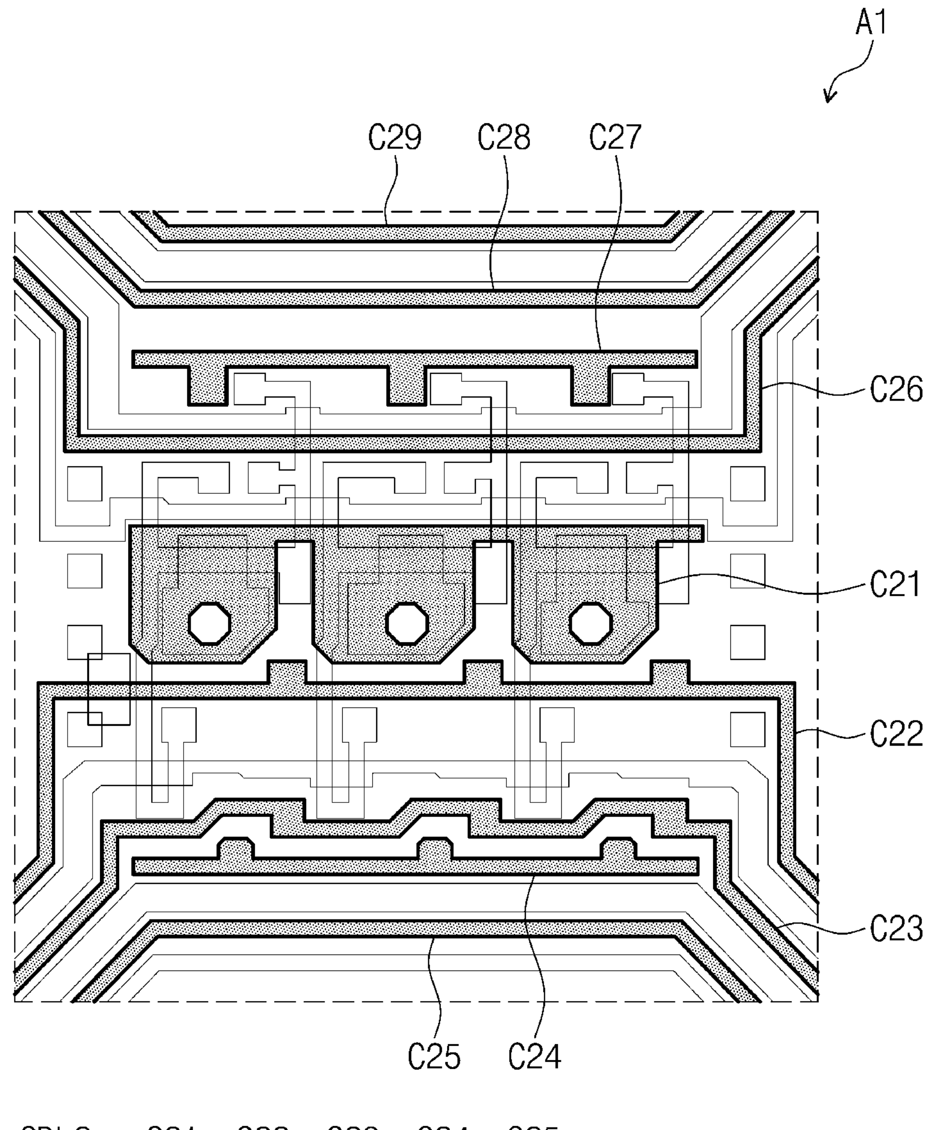
FIG. 12A is a schematic plan view of a layer forming pixel circuits arranged in a first area according to an embodiment.
Figure 12A:
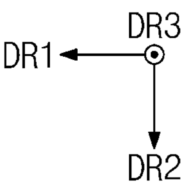
Figure 12B:
FIG. 12B is a schematic plan view of a layer forming pixel circuits arranged in a second area according to an embodiment.
Figure 12B:
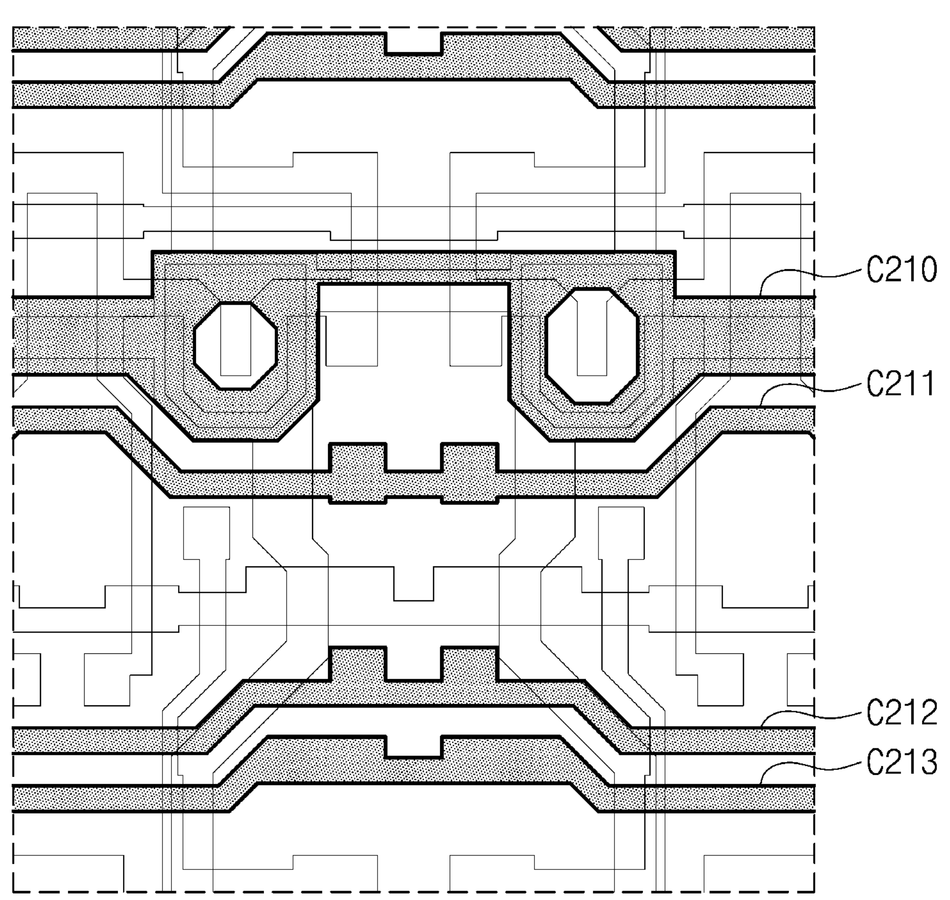
Figure 12B:
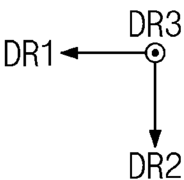

FIG. 12A is a schematic plan view of a layer forming the pixel circuits arranged in the first area A1 according to an embodiment. FIG. 12B is a schematic plan view of a layer forming the pixel circuits arranged in the second area A2 according to an embodiment.

Referring to FIGS. 7A, 7B, 12A, and 12B, a second conductive layer CDL2 may be disposed between the second insulating layer 20 and the third insulating layer 30. The second conductive layer CDL2 may include a metal, an alloy, a conductive metal oxide, or a transparent conductive material. As an example, the second conductive layer CDL2 may have a singly-layer structure including molybdenum.

The second conductive layer CDL2 may include first, second, third, fourth, fifth, sixth, seventh, eighth, ninth, tenth, eleventh, twelfth, and thirteenth conductive pattern layers C21, C22, C23, C24, C25, C26, C27, C28, C29, C210, C211, C212, and C213.

The first conductive pattern layer C21 and the tenth conductive pattern layer C210 may overlap the first conductive pattern layer C11 (refer to FIG. 11A) and the eighth conductive pattern layer C18 (refer to FIG. 11B), respectively. The first conductive pattern layer C21 may form the first capacitor Cst (refer to FIG. 5) together with the first conductive pattern layer C11. The tenth conductive pattern layer C210 may form the first capacitor Cst (refer to FIG. 5) together with the eighth conductive pattern layer C18. The first driving voltage ELVDD (refer to FIG. 5) may be provided to the first conductive pattern layer C21 and the tenth conductive pattern layer C210.

The second conductive pattern layer C22 and the eleventh conductive pattern layer C211 may be the j-th compensation scan line GCLj (refer to FIG. 5). The third conductive pattern layer C23 and the twelfth conductive pattern layer C212 may be the j-the initialization scan line GILj (refer to FIG. 5). The fourth conductive pattern layer C24 and the thirteenth conductive pattern layer C213 may be a portion of the first initialization voltage line VL3 (refer to FIG. 5) to which the first initialization voltage VINT (refer to FIG. 5) is provided. The seventh conductive pattern layer C27 may be a portion of the second initialization voltage line VL4 (refer to FIG. 5) to which the second initialization voltage VAINT (refer to FIG. 5) is provided.

Each of the fifth, sixth, eighth, and ninth conductive pattern layers C25, C26, C28, and C29 may be a line to which the compensation scan signal or the initialization scan signal is applied. As an example, the fifth conductive pattern layer C25 may correspond to a (j+1)th initialization scan line, the sixth conductive pattern layer C26 may correspond to a (j−1)th initialization scan line, the eighth conductive pattern layer C28 may correspond to a (j−2)th initialization scan line, and the ninth conductive pattern layer C29 may correspond to a (j−2)th compensation scan line. The fifth conductive pattern layer C25 and the sixth conductive pattern layer C26 may be lines to apply the initialization scan signal to the pixels arranged in the second area A2, the eighth conductive pattern layer C28 may be a line to apply the initialization scan signal to other pixels arranged in the first area A1, and the ninth conductive pattern layer C29 may be a line to apply the compensation scan signal to other pixels arranged in the first area A1.

The fifth and ninth conductive pattern layers C25 and C29 may be arranged adjacent to the transmission area TP and may be referred to as outer signal lines. The fifth conductive pattern layer C25 may be spaced apart from the ninth conductive pattern layer C29 with the first conductive pattern layer C21 interposed therebetween.

Figure 13A:
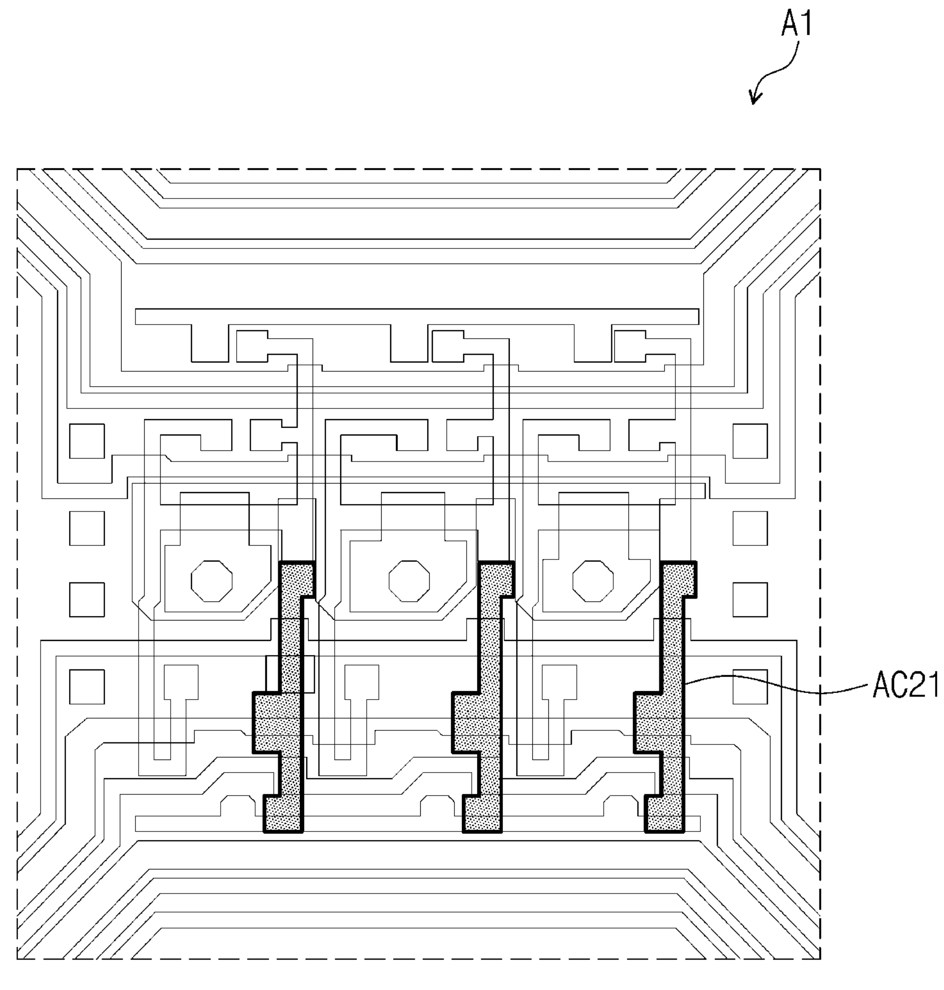
FIG. 13A is a schematic plan view of a layer forming pixel circuits arranged in a first area according to an embodiment.
Figure 13A:
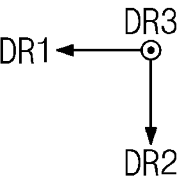
Figure 13B:
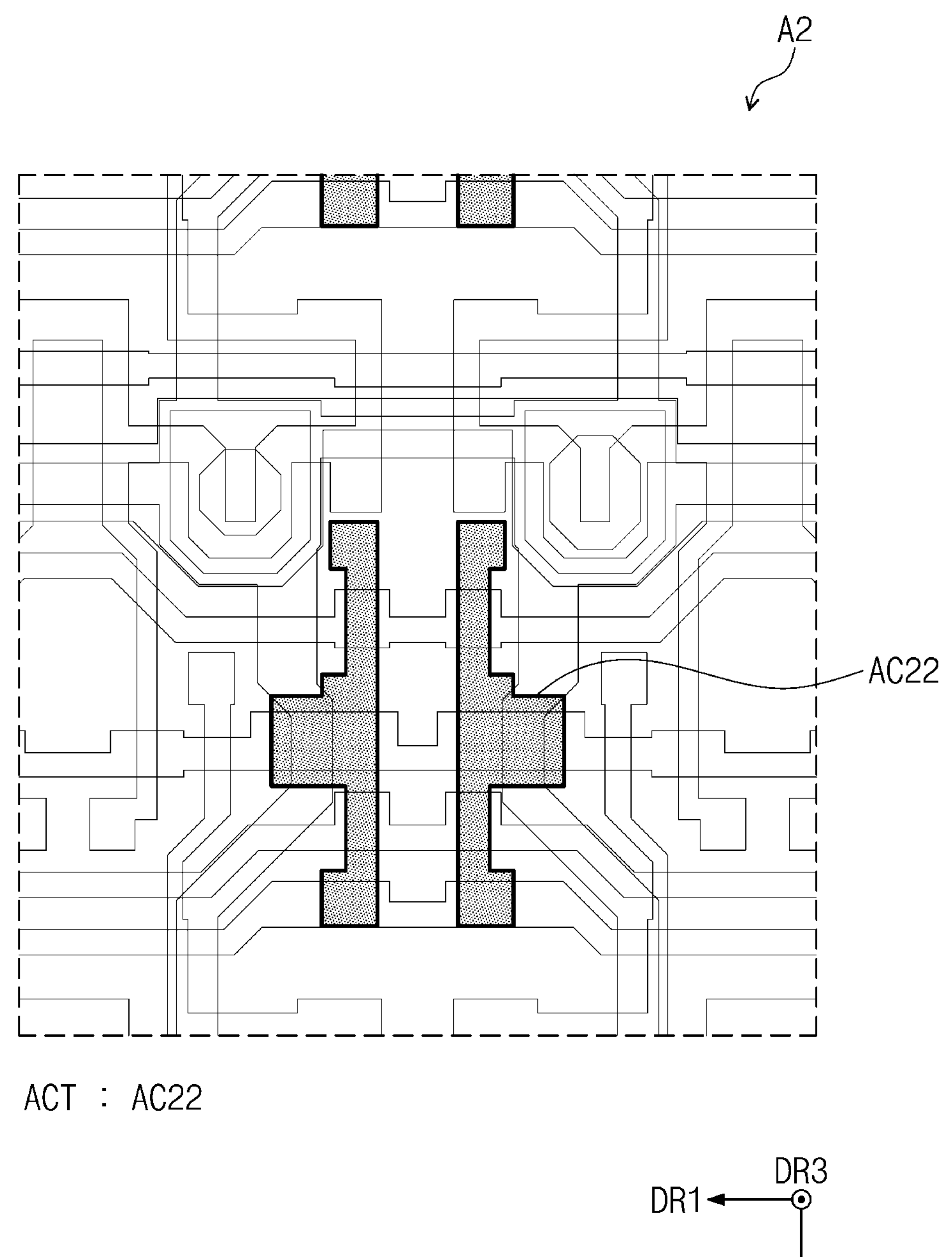
FIG. 13B is a schematic plan view of a layer forming pixel circuits arranged in a second area according to an embodiment.

FIG. 13A is a schematic plan view of a layer forming the pixel circuits arranged in the first area A1 according to an embodiment. FIG. 13B is a schematic plan view of a layer forming the pixel circuits arranged in the second area A2 according to an embodiment.

Referring to FIGS. 7A, 7B, 13A, and 13B, a second semiconductor layer ACT2 may be disposed between the third insulating layer 30 and the fourth insulating layer 40. The second semiconductor layer ACT2 may include oxide semiconductor. The second semiconductor layer ACT2 may be disposed on a layer different from a layer on which the first semiconductor layer ACT1 is disposed and may not overlap the first semiconductor layer ACT1.

The second semiconductor layer ACT2 may include a third semiconductor pattern layer AC21 disposed in the first area A1 and a fourth semiconductor pattern layer AC22 disposed in the second area A2.

Referring to FIG. 13A, the third semiconductor pattern layer AC21 may overlap (e.g., entirely overlap) the first lower light blocking layer BML1 (refer to FIG. 10A) in the first area A1. Referring to FIG. 13B, a portion of the fourth semiconductor pattern layer AC22 may overlap the second lower light blocking layer BML2 (refer to FIG. 10B) in the second area A2, and a portion of the fourth semiconductor pattern layer AC22 may not overlap the second lower light blocking layer BML2 (refer to FIG. 10B) in the second area A2. The eleventh conductive pattern layer C211 (refer to FIG. 12B) and the twelfth conductive pattern layer C212 (refer to FIG. 12B) may be disposed under the fourth semiconductor pattern layer AC22. Accordingly, the light may be blocked by the eleventh conductive pattern layer C211 and the twelfth conductive pattern layer C212 at a portion of a lower portion of the fourth semiconductor pattern layer AC22. Thus, the third lower light blocking layer BML3 may be a portion of the eleventh conductive pattern layer C211 or a portion of the twelfth conductive pattern layer C212.

Figure 14A:
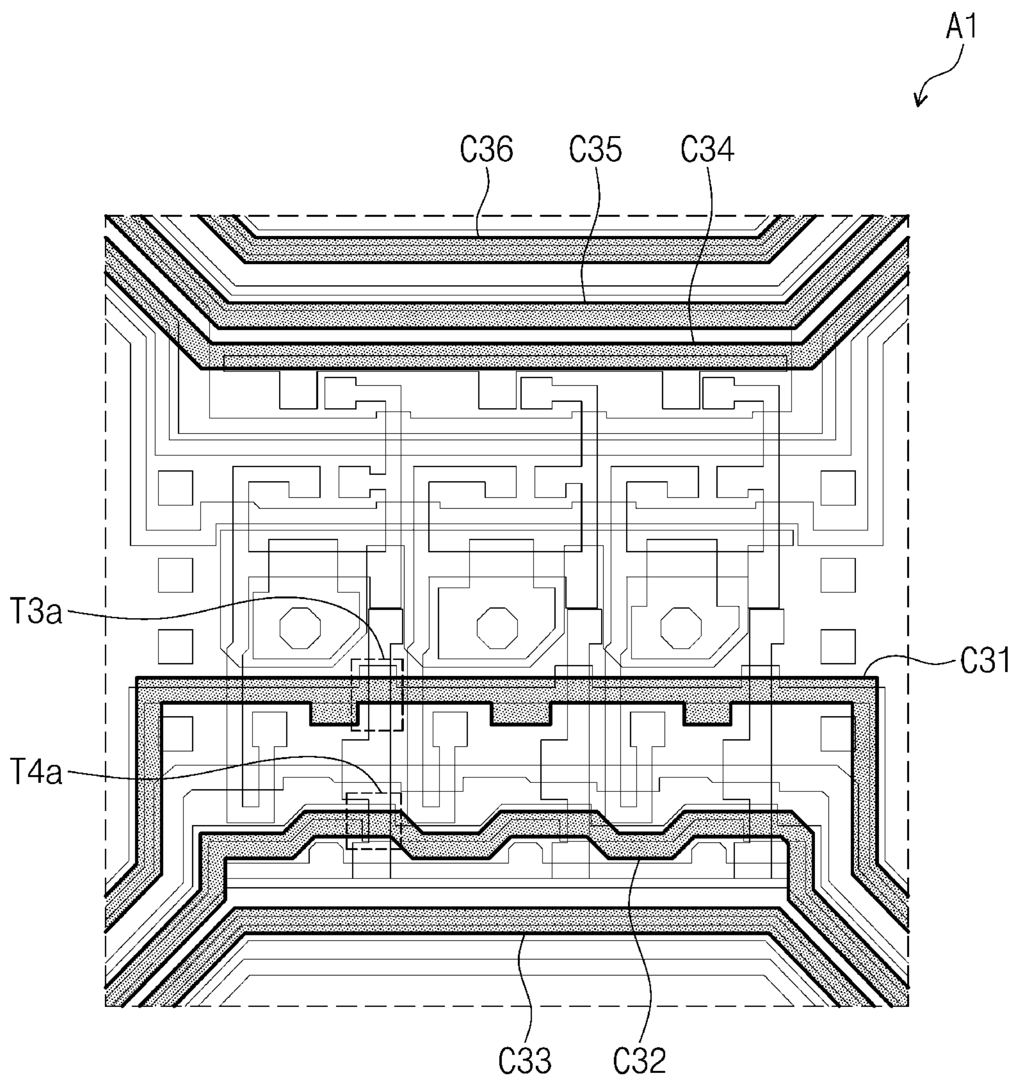
FIG. 14A is a schematic plan view of a layer forming pixel circuits arranged in a first area according to an embodiment.
Figure 14A:
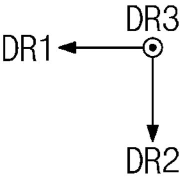
Figure 14B:
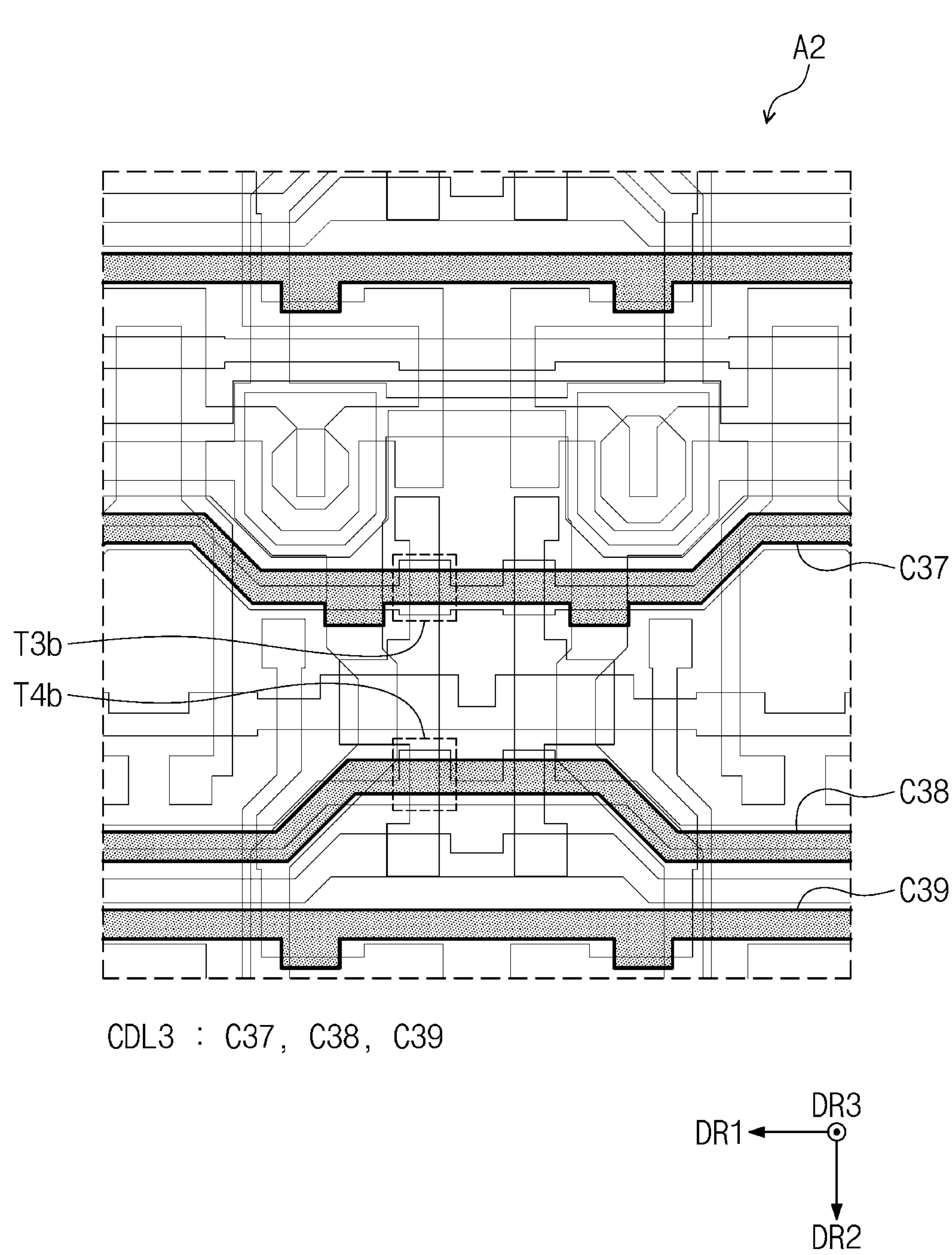
FIG. 14B is a schematic plan view of a layer forming pixel circuits arranged in a second area according to an embodiment.

FIG. 14A is a schematic plan view of a layer forming the pixel circuits arranged in the first area A1 according to an embodiment. FIG. 14B is a schematic plan view of a layer forming the pixel circuits arranged in the second area A2 according to an embodiment.

Referring to FIGS. 7A, 7B, 14A, and 14B, a third conductive layer CDL3 may be disposed between the fourth insulating layer 40 and the fifth insulating layer 50. The third conductive layer CDL3 may include a metal, an alloy, a conductive metal oxide, or a transparent conductive material. The third conductive layer CDL3 may have a multilayer structure in which titanium and molybdenum are sequentially stacked, however, embodiments are not limited thereto.

The third conductive layer CDL3 may include first, second, third, fourth, fifth, sixth, seventh, eighth, and ninth conductive pattern layers C31, C32, C33, C34, C35, C36, C37, C38, and C39.

The first conductive pattern layer C31 and the seventh conductive pattern layer C37 may correspond to the j-th compensation scan line GCLj (refer to FIG. 5). The first conductive pattern layer C31 may form a third transistor T3*a* together with the third semiconductor pattern layer AC21 (refer to FIG. 13A). The seventh conductive pattern layer C37 may form a third transistor T3*b* together with the fourth semiconductor pattern layer AC22 (refer to FIG. 13B).

The second conductive pattern layer C32 and the eighth conductive pattern layer C38 may correspond to the j-th initialization scan line GILj (refer to FIG. 5). The second conductive pattern layer C32 may form a fourth transistor T4*a* together with the third semiconductor pattern layer AC21 (refer to FIG. 13A). The eighth conductive pattern layer C38 may form a fourth transistor T4*b* together with the fourth semiconductor pattern layer AC22 (refer to FIG. 13B).

The first, second, third, fourth, fifth, sixth, and seventh transistors T1*a*, T2*a*, T3*a*, T4*a*, T5*a*, T6*a*, and T7*a* shown in FIGS. 11A and 14A may be referred to as first-type transistors. The first, second, third, fourth, fifth, sixth, and seventh transistors T1*a*, T2*a*, T3*a*, T4*a*, T5*a*, T6*a*, and T7*a* may be included in the first pixel circuit PDC1 disposed in the first area A1. The first, second, third, fourth, fifth, sixth, and seventh transistors T1*b*, T2*b*, T3*b*, T4*b*, T5*b*, T6*b*, and T7*b*-1 shown in FIGS. 11B and 14B may be referred to as second-type transistors. The first, second, third, fourth, fifth, sixth, and seventh transistors T1*b*, T2*b*, T3*b*, T4*b*, T5*b*, T6*b*, and T7*b*-1 may be included in the second pixel circuit PDC2 disposed in the second area A2.

The ninth conductive pattern layer C39 may be a portion of the second initialization voltage line VL4 to which the second initialization voltage VAINT is applied.

The fourth, fifth, and sixth conductive pattern layers C34, C35, and C36 may be spaced apart from the third conductive pattern layer C33 with the first and second conductive pattern layers C31 and C32 interposed therebetween. The third, fourth, fifth, and sixth conductive pattern layers C33, C34, C35, and C36 may be lines to which the compensation scan signal or the initialization scan signal is applied. As an example, the third conductive pattern layer C33 may correspond to a (j+1)th compensation scan line, the fourth conductive pattern layer C34 may correspond to a (j−1)th compensation scan line, the fifth conductive pattern layer C35 may correspond to the (j−2)th initialization scan line, and the sixth conductive pattern layer C36 may correspond to the (j−2)th compensation scan line. The third conductive pattern layer C33 and the fourth conductive pattern layer C34 may be lines to apply the compensation scan signal to pixels arranged in the second area A2, the fifth conductive pattern layer C35 may be a line to apply the initialization scan signal to other pixels arranged in the first area A1, and the sixth conductive pattern layer C36 may be a line to apply the compensation scan signal to other pixels arranged in the first area A1.

Figure 15A:
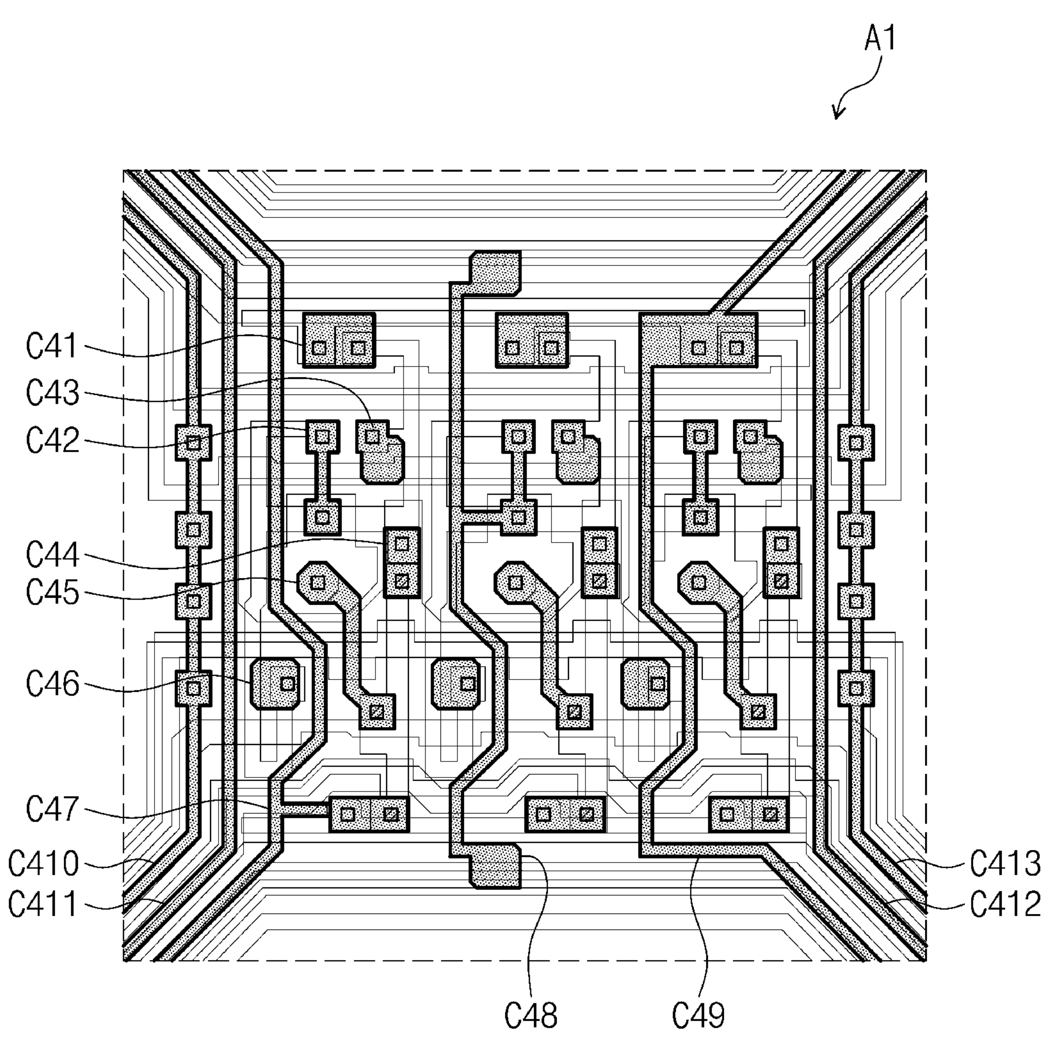
FIG. 15A is a schematic plan view of a layer forming pixel circuits arranged in a first area according to an embodiment.
Figure 15A:
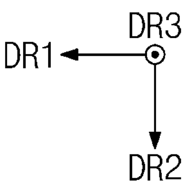
Figure 15B:
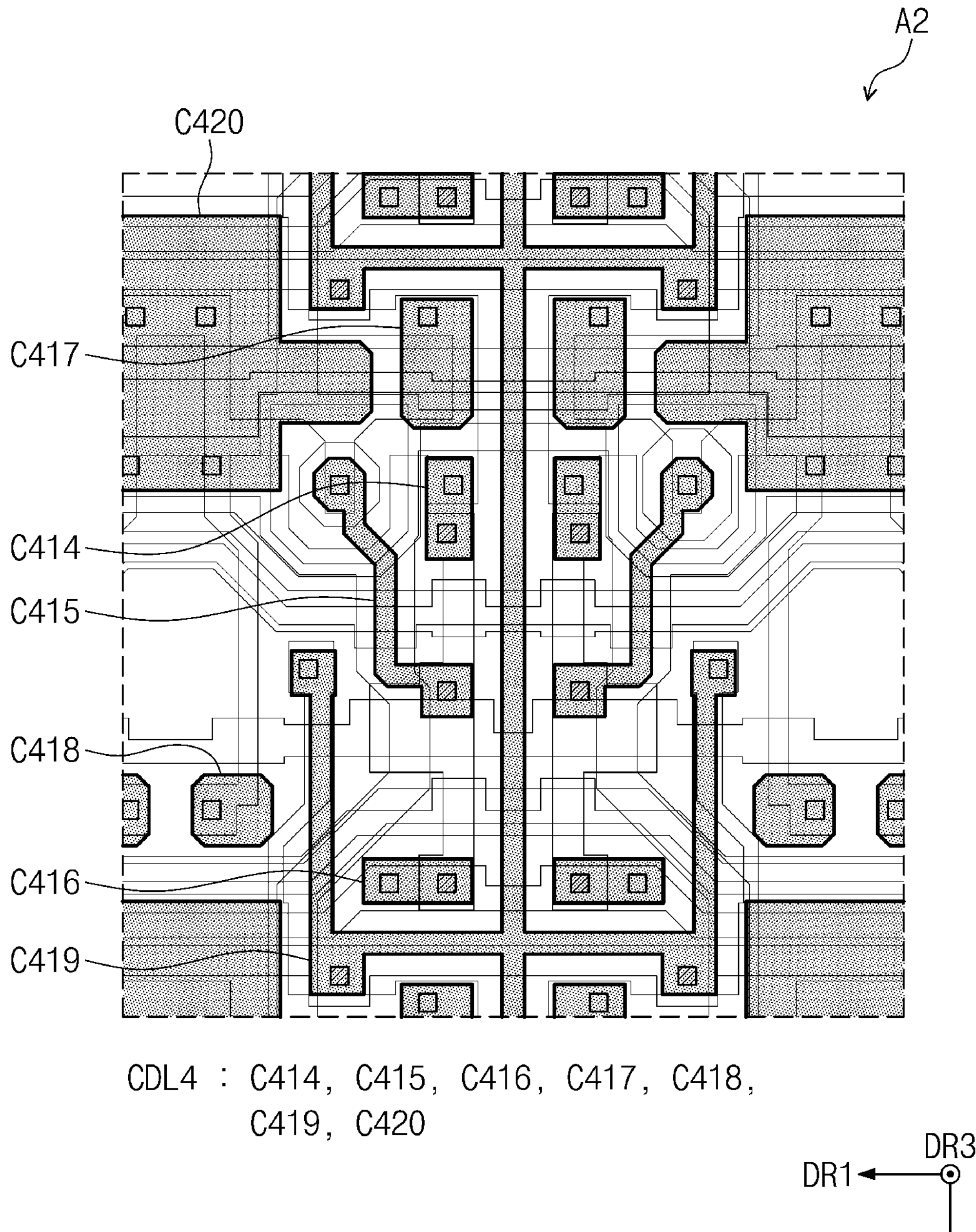
FIG. 15B is a schematic plan view of a layer forming pixel circuits arranged in a second area according to an embodiment.

FIG. 15A is a schematic plan view of a layer forming the pixel circuits arranged in the first area A1 according to an embodiment. FIG. 15B is a schematic plan view of a layer forming the pixel circuits arranged in the second area A2 according to an embodiment.

Referring to FIGS. 7A, 7B, 15A, and 15B, a fourth conductive layer CDL4 may be disposed between the fifth insulating layer 50 and the sixth insulating layer 60. The fourth conductive layer CDL4 may include a metal, an alloy, a conductive metal oxide, or a transparent conductive material. The fourth conductive layer CDL4 may have a multi-layer structure in which titanium, aluminum, and titanium are sequentially stacked, however, embodiments are not limited thereto.

The fourth conductive layer CDL4 may include first, second, third, fourth, fifth, sixth, seventh, eighth, ninth, tenth, eleventh, twelfth, thirteenth, fourteenth, fifteenth, sixteenth, seventeenth, eighteenth, nineteenth, and twentieth conductive pattern layers C41, C42, C43, C44, C45, C46, C47, C48, C49, C410, C411, C412, C413, C414, C415, C416, C417, C418, C419, and C420 (hereinafter, referred to as first to twentieth pattern layers C41 to C420). The first to twentieth conductive pattern layers C41 to C420 may be connection pattern layers connected to a single pattern layer or a plurality of pattern layers.

The first conductive pattern layer C41 may be connected (e.g., electrically connected) to the first semiconductor pattern layer AC11 (refer to FIG. 10A) and the seventh conductive pattern layer C27 (refer to FIG. 12A). The second conductive pattern layer C42 may be connected (e.g., electrically connected) to the first semiconductor pattern layer AC11 and the first conductive pattern layer C21 (refer to FIG. 12A) to which the first driving voltage ELVDD (refer to FIG. 5) is provided. The third conductive pattern layer C43 may be connected (e.g., electrically connected) to the first semiconductor pattern layer AC11. The fourth conductive pattern layer C44 may be connected (e.g., electrically connected) to the first semiconductor pattern layer AC11 and the third semiconductor pattern layer AC21 (refer to FIG. 13A). The fifth conductive pattern layer C45 may be connected (e.g., electrically connected) to the first conductive pattern layer C11 (refer to FIG. 11A) and the third semiconductor pattern layer AC21. The sixth conductive pattern layer C46 may be connected (e.g., electrically connected) to the first semiconductor pattern layer AC11.

The seventh conductive pattern layer C47 may be connected (e.g., electrically connected) to the fourth conductive pattern layer C24 (refer to FIG. 12A) and the third semiconductor pattern layer AC21. The seventh conductive pattern layer C47 may be a portion of the first initialization voltage line VL3 (refer to FIG. 5) to which the first initialization voltage VINT (refer to FIG. 5) is provided.

The eighth conductive pattern layer C48 may be connected (e.g., electrically connected) to the first semiconductor pattern layer AC11 and the first conductive pattern layer C21. The eighth conductive pattern layer C48 may be a portion of the first driving voltage line VL1 (refer to FIG. 5) to which the first driving voltage ELVDD (refer to FIG. 5) is provided.

The ninth conductive pattern layer C49 may be connected (e.g., electrically connected) to the first semiconductor pattern layer AC11 and the seventh conductive pattern layer C27. The ninth conductive pattern layer C49 may be a portion of the second initialization voltage line VL4 (refer to FIG. 5) to which the second initialization voltage VAINT (refer to FIG. 5) is provided.

Each of the tenth conductive pattern layer C410 and the thirteenth conductive pattern layer C413 may be connected (e.g., electrically connected) to the outer semiconductor pattern layers ACD (refer to FIG. 10A). The eleventh conductive pattern layer C411 may be spaced apart from the transmission area TP with the tenth conductive pattern layer C410 interposed therebetween, and the twelfth conductive pattern layer C412 may be spaced apart from the transmission area TP with the thirteenth conductive pattern layer C413 interposed therebetween.

The tenth, eleventh, twelfth, and thirteenth conductive pattern layers C410, C411, C412, and C413 may be the initialization voltage lines to provide the initialization voltage to the pixels arranged in the second area A2 or the data lines to provide the data voltage to the pixels arranged in the second area A2. As an example, the tenth conductive pattern layer C410 may be a portion of the second initialization voltage line VL4 (refer to FIG. 5) to which the second initialization voltage VAINT (refer to FIG. 5) is provided. Each of the eleventh conductive pattern layer C411 and the twelfth conductive pattern layer C412 may be the data line applying the data voltage. The thirteenth conductive pattern layer C413 may be a portion of the first initialization voltage line VL3 (refer to FIG. 5) to which the first initialization voltage VINT (refer to FIG. 5) is provided.

The fourteenth conductive pattern layer C414 may be connected (e.g., electrically connected) to the second semiconductor pattern layer AC12 (refer to FIG. 10B) and the fourth semiconductor pattern layer AC22 (refer to FIG. 13B). The fifteenth conductive pattern layer C415 may be connected (e.g., electrically connected) to the eighth conductive pattern layer C18 (refer to FIG. 11B) and the fourth semiconductor pattern layer AC22. The sixteenth conductive pattern layer C416 may be connected (e.g., electrically connected) to the thirteenth conductive pattern layer C213 (refer to FIG. 12B) and the fourth semiconductor pattern layer AC22. The seventeenth conductive pattern layer C417 may be connected (e.g., electrically connected) to the second semiconductor pattern layer AC12. The eighteenth conductive pattern layer C418 may be connected (e.g., electrically connected) to the second semiconductor pattern layer AC12. The nineteenth conductive pattern layer C419 may be connected (e.g., electrically connected) to the second semiconductor pattern layer AC12 and the ninth conductive pattern layer C39 (refer to FIG. 14B) to which the second initialization voltage VAINT (refer to FIG. 5) is provided. The twentieth conductive pattern layer C420 may be connected (e.g., electrically connected) to the second semiconductor pattern layer AC12 and the tenth conductive pattern layer C210 (refer to FIG. 12B). The first driving voltage ELVDD (refer to FIG. 5) may be provided to the twentieth conductive pattern layer C420, and the twentieth conductive pattern layer C420 may be a portion of the first driving voltage line VL1 (refer to FIG. 5).

Figure 16A:
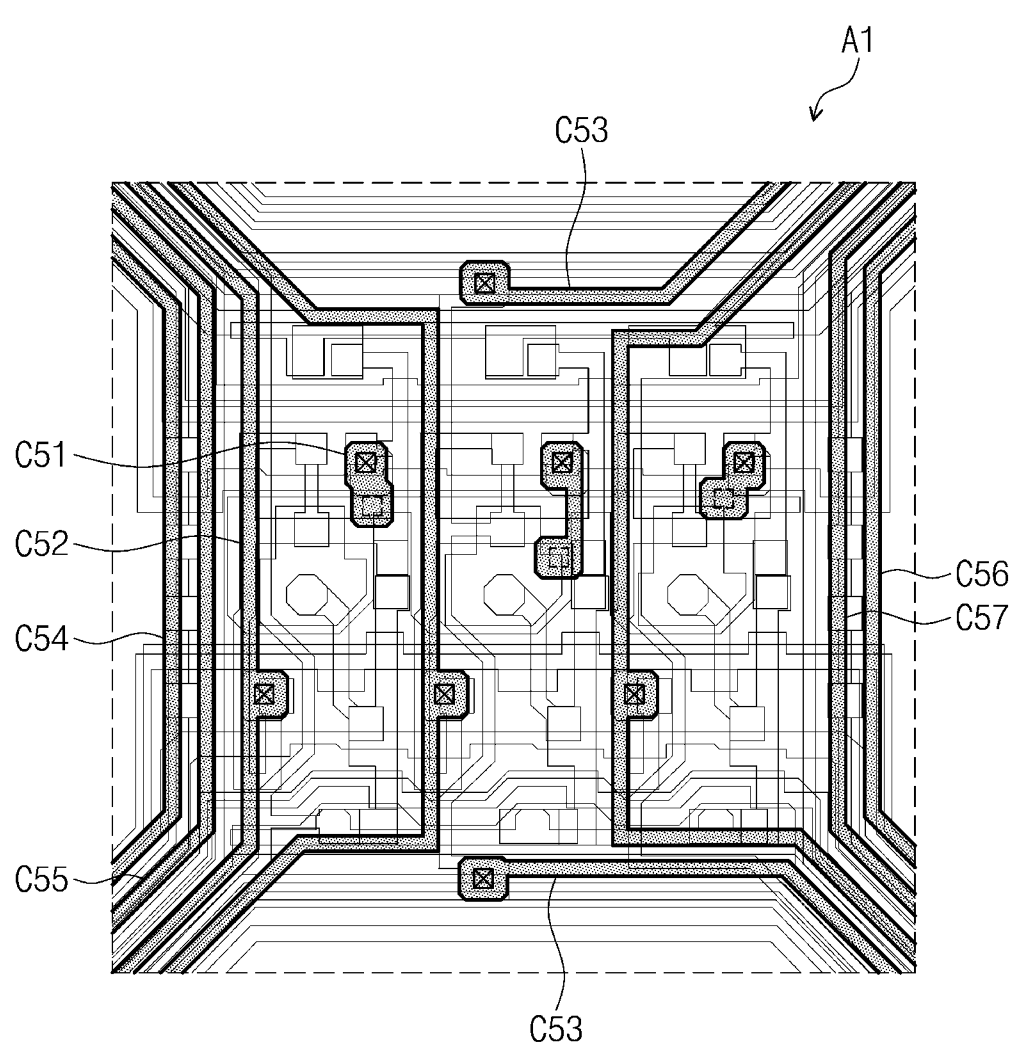
FIG. 16A is a schematic plan view of a layer forming pixel circuits arranged in a first area according to an embodiment.
Figure 16A:
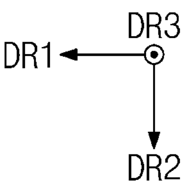
Figure 16B:
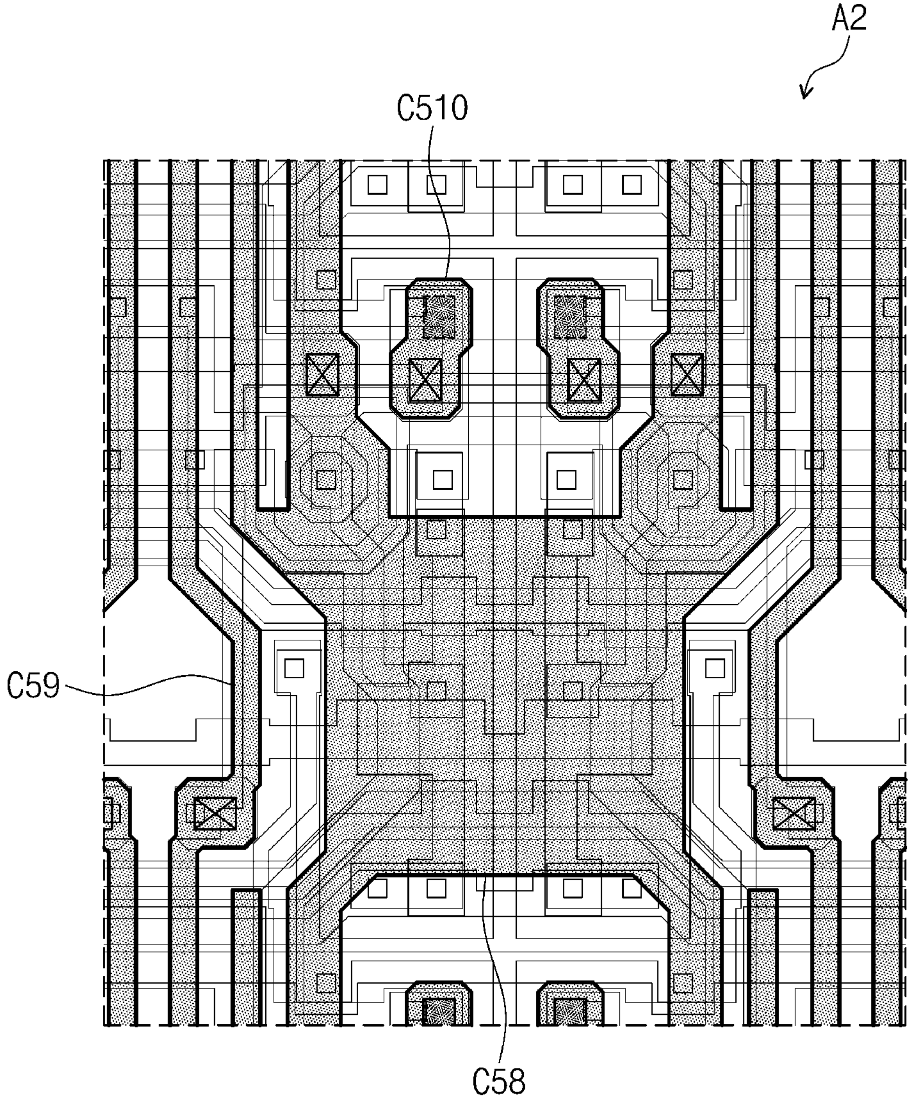
FIG. 16B is a schematic plan view of a layer forming pixel circuits arranged in a second area according to an embodiment.
Figure 16B:
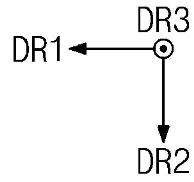

FIG. 16A is a schematic plan view of a layer forming the pixel circuits arranged in the first area A1 according to an embodiment. FIG. 16B is a schematic plan view of a layer forming the pixel circuits arranged in the second area A2 according to an embodiment.

Referring to FIGS. 7A, 7B, 16A, and 16B, a fifth conductive layer CDL5 may be disposed between the sixth insulating layer 60 and the seventh insulating layer 70. The fifth conductive layer CDL5 may include a metal, an alloy, a conductive metal oxide, or a transparent conductive material. The fifth conductive layer CDL5 may have a multi-layer structure in which titanium, aluminum, and titanium are sequentially stacked, however, embodiments are not limited thereto.

The fifth conductive layer CDL5 may include first, second, third, fourth, fifth, sixth, seventh, eighth, ninth, and tenth conductive pattern layers C51, C52, C53, C54, C55, C56, C57, C58, C59, and C510 (hereinafter, referred to as first to tenth conductive pattern layers C51 to C510). The first to tenth conductive pattern layers C51 to C510 may be connection pattern layers connected to a single pattern layer or a plurality of pattern layers.

An end portion of the first conductive pattern layer C51 may be connected (e.g., electrically connected) to the third conductive pattern layer C43 (refer to FIG. 15A). Another end portion of the first conductive pattern layer C51 may be connected to the pixel electrode AE of the first light emitting element ED1. The second conductive pattern layer C52 may be connected (e.g., electrically connected) to the sixth conductive pattern layer C46 (refer to FIG. 15A). The second conductive pattern layer C52 may correspond to the i-th data line DLi (refer to FIG. 5). The third conductive pattern layer C53 may be connected (e.g., electrically connected) to the eighth conductive pattern layer C48 (refer to FIG. 15A). The third conductive pattern layer C53 may be a portion of the first driving voltage line VL1 (refer to FIG. 5) to which the first driving voltage ELVDD (refer to FIG. 5) is provided.

Each of the fourth conductive pattern layer C54, the fifth conductive pattern layer C55, the sixth conductive pattern layer C56, and the seventh conductive pattern layer C57 may be a portion of the signal lines. The fourth conductive pattern layer C54 may be disposed adjacent to the transmission area TP, and the fifth conductive pattern layer C55 may be spaced apart from the transmission area TP with the fourth conductive pattern layer C54 interposed therebetween. The sixth conductive pattern layer C56 may be disposed adjacent to the transmission area TP, and the seventh conductive pattern layer C57 may be spaced apart from the transmission area TP with the sixth conductive pattern layer C56 interposed therebetween.

The fourth, fifth, sixth, and seventh conductive pattern layers C54, C55, C56, and C57 may be driving voltage lines to provide the driving voltage to the pixels arranged in the second area A2 or the data lines to provide the data voltage to the pixels arranged in the second area A2. As an example, the fourth conductive pattern layer C54 may be a portion of the first driving voltage line VL1 (refer to FIG. 5) to which the first driving voltage ELVDD (refer to FIG. 5) is provided. Each of the fifth, sixth, and seventh conductive pattern layers C55, C56, and C57 may be the data line that provides the data voltage.

The eighth conductive pattern layer C58 may be connected (e.g., electrically connected) to the twentieth conductive pattern layer C420 (refer to FIG. 15B). The first driving voltage ELVDD (refer to FIG. 5) may be provided to the eighth conductive pattern layer C58, and the eighth conductive pattern layer C58 may be a portion of the first driving voltage line VL1 (refer to FIG. 5).

The ninth conductive pattern layer C59 may be connected (e.g., electrically connected) to the eighteenth conductive pattern layer C418 (refer to FIG. 15B). The ninth conductive pattern layer C59 may be electrically connected to the second semiconductor pattern layer AC12 (refer to FIG. 10B) via the eighteenth conductive pattern layer C418. The ninth conductive pattern layer C59 may correspond to the i-th data line DLi (refer to FIG. 5).

An end portion of the tenth conductive pattern layer C510 may be connected (e.g., electrically connected) to the seventeenth conductive pattern layer C417 (refer to FIG. 15B). As an example, the seventeenth conductive pattern layer C417 may be the first connection electrode CNE10, and the tenth conductive pattern layer C510 may be the second connection electrode CNE20. The another end portion of the tenth conductive pattern layer C510 may be connected (e.g., electrically connected) to the pixel electrode AE of the second light emitting element ED2.

Figure 17:
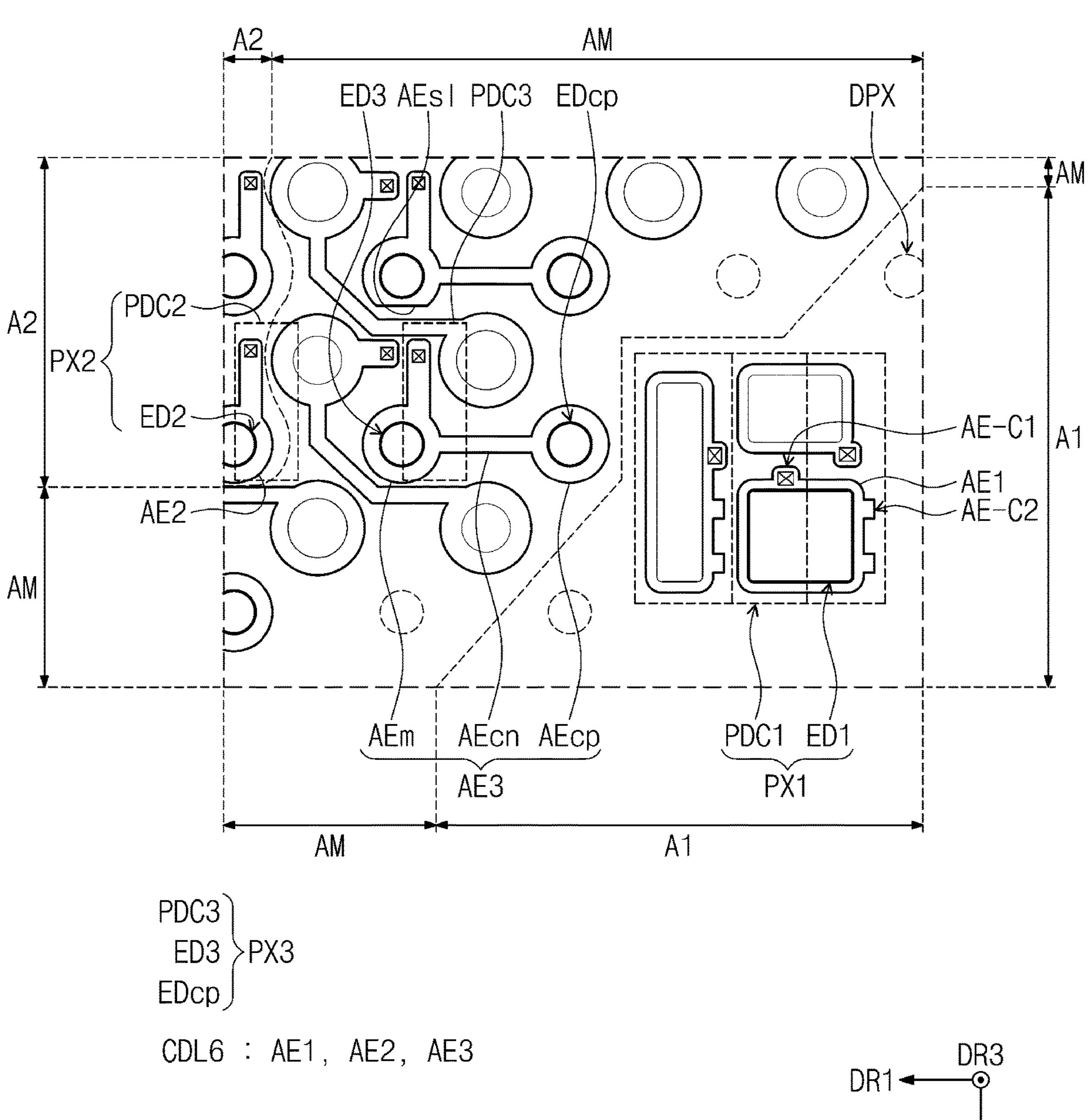
FIG. 17 is a schematic enlarged plan view of a portion of a display panel according to an embodiment.

FIG. 17 is a schematic enlarged plan view of a portion of the display panel according to an embodiment.

Referring to FIG. 17, the sixth conductive layer CDL6 may be disposed on the eighth insulating layer 80. The sixth conductive layer CDL6 may include a metal, an alloy, a conductive metal oxide, a transparent conductive material, or the like. The sixth conductive layer CDL6 may have a multi-layer structure in which indium tin oxide, silver, and indium tin oxide are sequentially stacked, however, embodiments are not limited thereto or thereby The sixth conductive layer CDL6 may include a first pixel electrode AE1 disposed in the first area A1, a second pixel electrode AE2 disposed in the second area A2, and a third pixel electrode AE3 disposed in the intermediate area AM.

The first pixel PX1 disposed in the first area A1 may include the first pixel circuit PDC1 and the first light emitting element ED1. The first pixel electrode AE1 may be included in the first light emitting element ED1. The first pixel electrode AE1 may be electrically connected to the first pixel circuit PDC1. As an example, the first pixel electrode AE1 may be connected (e.g., electrically connected) to the first conductive pattern layer C51 shown in FIG. 16A.

The second pixel PX2 disposed in the second area A2 may include the second pixel circuit PDC2 and the second light emitting element ED2. The second pixel electrode AE2 may be included in the second light emitting element ED2. The second pixel electrode AE2 may be electrically connected to the second pixel circuit PDC2. As an example, the second pixel electrode AE2 may be connected (e.g., electrically connected) to the tenth conductive pattern layer C510 shown in FIG. 16B. The third pixel electrode AE3 may be electrically connected to the third pixel circuit PDC3.

The third pixel PX3 disposed in the intermediate area AM may include the third pixel circuit PDC3, the third light emitting element ED3, and the copy light emitting element EDcp. The third pixel circuit PDC3 may be referred to as an intermediate pixel circuit, and the third light emitting element ED3 may be referred to as an intermediate light emitting element. The copy light emitting element EDcp may be disposed to be closer to the first light emitting element ED1 than the third light emitting element ED3 is. The third pixel circuit PDC3 may not be disposed under the copy light emitting element EDcp due to space constraints. Accordingly, the copy light emitting element EDcp may not overlap the first lower light blocking layer BML1 (refer to FIG. 8A) and the second lower light blocking layer BML2 (refer to FIG. 8B). However, embodiments are not limited thereto. As an example, at least a portion of the copy light emitting element EDcp may overlap the first lower light blocking layer BML1 that expands and extends and may overlap the second lower light blocking layer BML2 that is repeatedly arranged.

The third pixel electrode AE3 may be included in the third light emitting element ED3 and the copy light emitting element EDcp. The third pixel electrode AE3 may include a main pixel electrode AEm, the connection electrode AEcn, and a copy pixel electrode AEcp. The main pixel electrode AEm may be included in the third light emitting element ED3, and the copy pixel electrode AEcp may be included in the copy light emitting element EDcp. The connection electrode AEcn may electrically connect the third light emitting element ED3 and the copy light emitting element EDcp.

The main pixel electrode AEm, the connection electrode AEcn, and the copy pixel electrode AEcp may be disposed on the same layer and may include the same material. For example, the main pixel electrode AEm, the connection electrode AEcn, and the copy pixel electrode AEcp may be substantially simultaneously formed by the same process. The main pixel electrode AEm may be connected (e.g., directly connected) to the third pixel circuit PDC3, and the copy pixel electrode AEcp may be connected (e.g., electrically connected) to the third pixel circuit PDC3 via the connection electrode AEcn and the main pixel electrode AEm.

Some of the main pixel electrodes AEm may include a straight edge portion AEs1 to secure an area through which the connection electrode AEcn passes. The straight edge portion AEs1 may be provided at a portion facing the connection electrode AEcn.

The first pixel electrode AE1 may include a first protruding portion AE-C1 and a second protruding portion AE-C2. The first protruding portion AE-C1 may be connected (e.g., electrically connected) to the first conductive pattern layer C51 (refer to FIG. 16A) and may overlap a contact hole. The second protruding portion AE-C2 may be a portion extending to overlap the third semiconductor pattern layer AC21 (refer to FIG. 13A). Accordingly, the light may be blocked by the first lower light blocking layer BML1*a* (refer to FIG. 10A) at a lower surface of the third semiconductor pattern layer AC21, and the light may be blocked by the first pixel electrode AE1 at an upper surface of the third semiconductor pattern layer AC21.

A dummy pixel DPX may be disposed in the intermediate area AM. The dummy pixel DPX may not emit a light and may be referred to as a defective pixel. As an example, the dummy pixel DPX may not include the pixel circuit PDC (refer to FIG. 5) and the pixel electrode AE (refer to FIG. 7B) and may include the light emitting layer EL (refer to FIG. 7B). The dummy pixel DPX may further include the first functional layer HFL (refer to FIG. 7B), the second functional layer EFL (refer to FIG. 7B), and the common electrode CE (refer to FIG. 7B). The dummy pixel DPX may overlap a dummy division opening defined (or formed) through the division layer 310 (refer to FIG. 7B), however, this is an example. According to an embodiment, the dummy division opening may not be defined in the area in which the dummy pixel DPX is disposed. According to an embodiment, a dummy pixel definition opening may be defined (or formed) through the pixel definition film PDL2 to correspond to the area in which dummy pixel DPX is disposed.

FIG. 18 is a schematic enlarged plan view of a portion of the display panel according to an embodiment.

Referring to FIGS. 7A, 7B, and 18, the division openings 310*op*1 and 310*op*2 and the transmission opening 310*opt* may be defined (or formed) through the division layer 310. The division openings 310*op*1 and 310*op*2 may include a first division opening 310*op*1 defined in the first area A1 and a second division opening 310*op*2 defined in the second area A2 and the intermediate area AM. The transmission opening 310*opt* may be defined in the first area A1.

In the first area A1, a single first division opening 310*op*1 may overlap a single first pixel unit PXU1. Accordingly, the single first division opening 310*op*1 may overlap the first light emitting areas PXA1*r*, PXA1*g*, and PXA1*b*.

The division layer 310 may not be disposed between the first light emitting areas PXA1*r*, PXA1*g*, and PXA1*b* adjacent to each other in the first area A1. Accordingly, it is not necessary to form a relatively thin and long portion of the division layer 310 in a narrow area between the first light emitting areas PXA1*r*, PXA1*g* and PXA1*b*. Accordingly, a difficulty of the process of forming the division layer 310 may be reduced. For example, since the portion of the division layer 310 is not disposed between the first light emitting areas PXA1*r*, PXA1*g*, and PXA1*b*, a degree of change in luminance ratio or white angular dependency (WAD) characteristic may be reduced even though the viewing angle increases. For example, the luminance ratio or the WAD characteristic may be improved in the first area A1.

In the second area A2 and the intermediate area AM, a single second division opening 310*op*2 may overlap a single light emitting area among the second light emitting areas PXA2*r*, PXA2*g*, and PXA2*b*, the third light emitting areas PXA3*r*, PXA3*g*, and PXA3*b*, and the copy light emitting areas PXCr, PXCg, and PXCb. In the second area A2 and the intermediate area AM, a portion of the division layer 310 may be disposed between the second light emitting areas PXA2*r*, PXA2*g*, and PXA2*b*, the third light emitting areas PXA3*r*, PXA3*g*, and PXA3*b*, and the copy light emitting areas PXCr, PXCg, and PXCb, adjacent to each other.

The transmission opening 310*opt* may overlap the first opening BMop of the first lower light blocking layer BML1. The transmission opening 310*opt* and the first opening BMop of the first lower light blocking layer BML1 may have substantially the same size as each other.

Figure 19A:
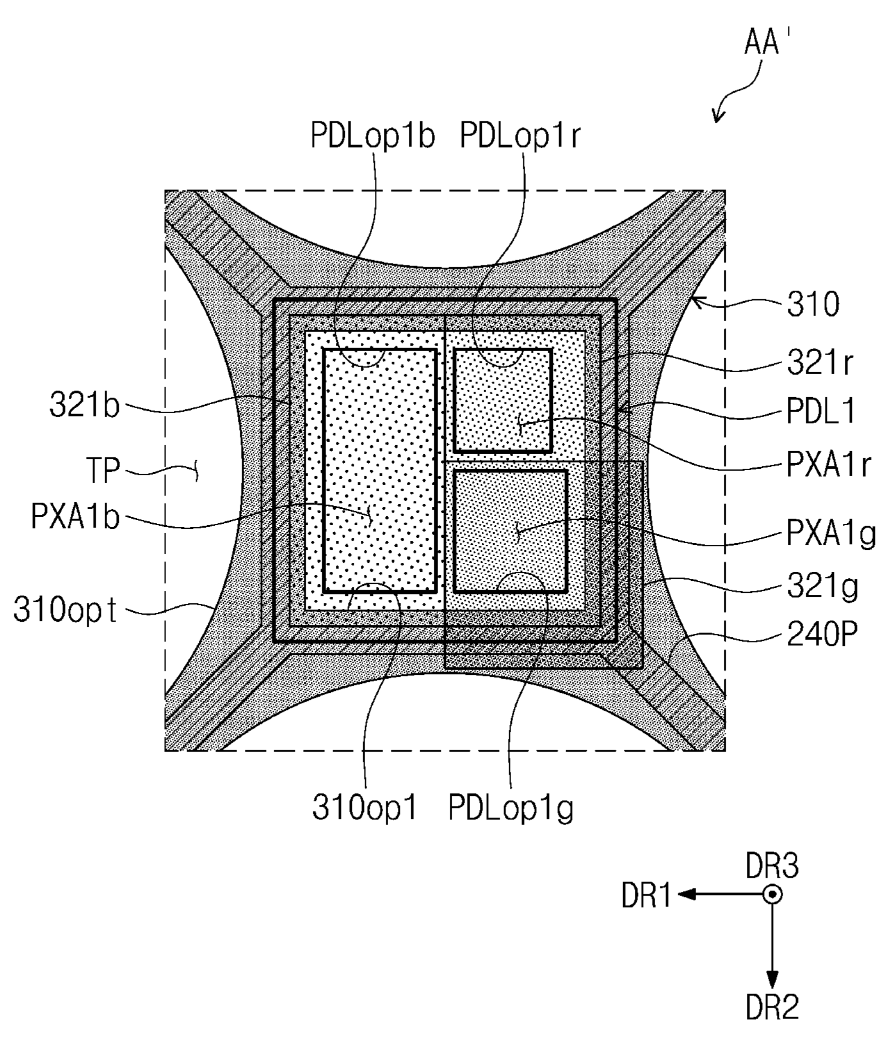
FIG. 19A is a schematic enlarged plan view of a portion of a display panel according to an embodiment.

FIG. 19A is a schematic enlarged plan view of a portion of the display panel according to an embodiment. FIG. 19A is a schematic enlarged plan view of a portion AA' shown in FIG. 18.

Referring to FIGS. 19A, the color filters 320 (refer to FIG. 7A) may include a first color filter 321*r*, a second color filter 321*g*, and a third color filter 321*b*, which are disposed in the first area A1. The first, second, and third color filters 321*r*, 321*g*, and 321*b* may overlap the first division opening 310*op*1 of the division layer 310.

A first opening PDLop1*r*, a second opening PDLop1*g*, and a third opening PDLop1*b* may be defined (or formed) through the pixel definition pattern layer PDL1. The first opening PDLop1*r*, the second opening PDLop1*g*, and the third opening PDLop1*b* may overlap the first division opening 310*op*1 of the division layer 310. The first color filter 321*r* may overlap the first opening PDLop1*r*, the second color filter 321*g* may overlap the second opening PDLop1*g*, and the third color filter 321*b* may overlap the third opening PDLop1*b*. Among the first, second, and third color filters 321*r*, 321*g*, and 321*b*, the second color filter 321*g* may have the largest size, and the first color filter 321*r* may have the smallest size. Accordingly, the second color filter 321*g* may protrude more in a direction away from the third color filter 321*b* than the first color filter 321*r* is.

The conductive pattern layer 240P may be covered by the division layer 310. Accordingly, the conductive pattern layer 240P may overlap (e.g., entirely overlap) the division layer 310. The division layer 310 may prevent the external light from being reflected by the conductive pattern layer 240P.

Figure 19B:
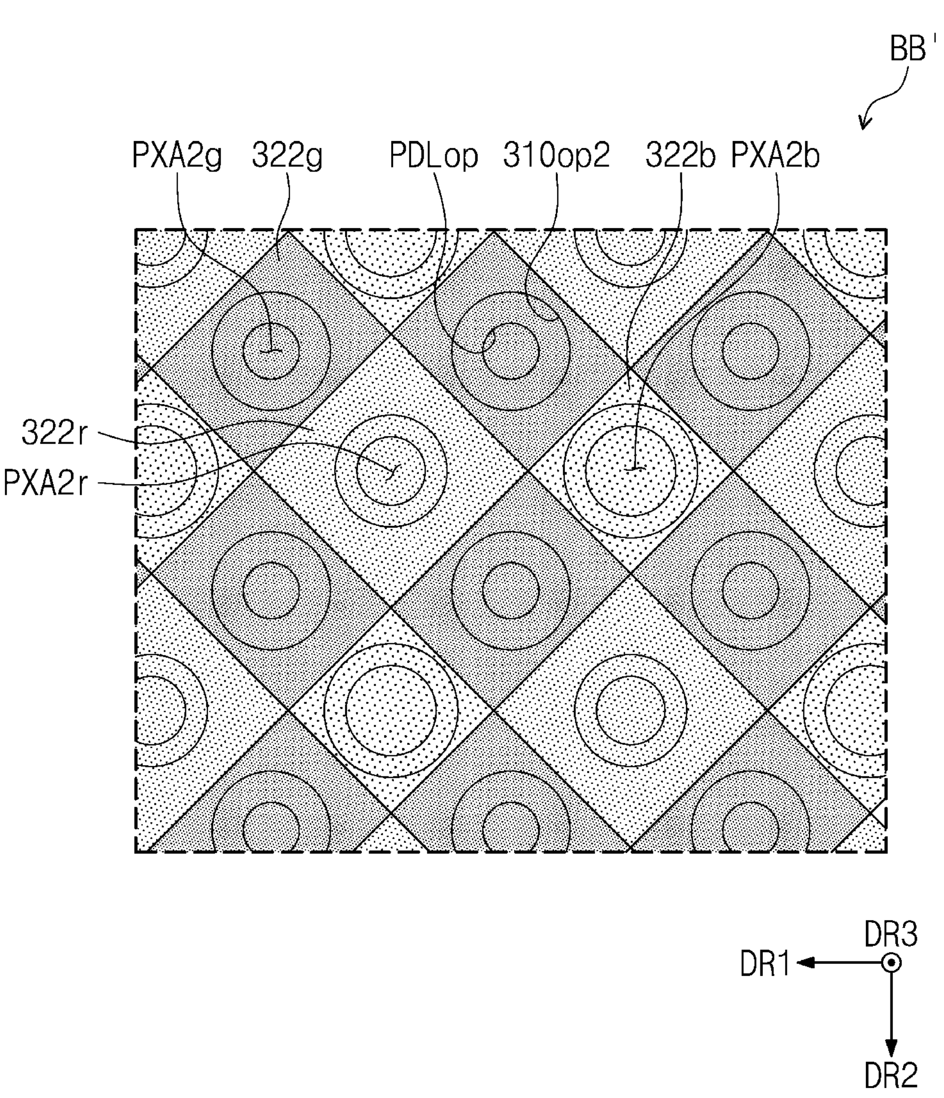
FIG. 19B is a schematic enlarged plan view of a portion of a display panel according to an embodiment.

FIG. 19B is a schematic enlarged plan view of a portion of the display panel according to an embodiment. FIG. 19B is a schematic enlarged plan view of a portion BB' shown in FIG. 18.

Referring to FIGS. 7B and 19B, the color filters 320 may include a first color filter 322*r*, a second color filter 322*g*, and a third color filter 322*b*, which are disposed in the second area A2. The first, second, and third color filters 322*r*, 322*g*, and 322*b* may overlap the second division openings 310*op*2 of the division layer 310 in a one-to-one correspondence.

A shape of each of the second division openings 310*op*2 may be different from a shape of each of the first, second, and third color filters 322*r*, 322*g*, and 322*b*. For example, a shape of the opening PDLop of the pixel definition film PDL2 may be different from the shape of each of the first, second, and third color filters 322*r*, 322*g*, and 322*b*. As an example, the opening PDLop may have a circular shape when viewed in the plane, and the second division openings 310*op*2 may have a circular shape when viewed in the plane. The second division opening 310*op*2 may have a shape surrounding the opening PDLop. Each of the first, second, and third color filters 322*r*, 322*g*, and 322*b* may have a quadrangular shape.

The second light emitting areas PXA2*r*, PXA2*g*, and PXA2*b* may include a second-first light emitting area PXA2*r*, a second-second light emitting area PXA2*g*, and a second-third light emitting area PXA2*b*. Among the second light emitting areas PXA2*r*, PXA2*g*, and PXA2*b*, the second-second light emitting area PXA2*g* may have the smallest size, and the second-third light emitting area PXA2*b* may have the largest size. Among the first, second, and third color filters 322*r*, 322*g*, and 322*b*, the first color filter 322*r* may have the largest size, and the third color filter 322*b* may have the smallest size.

A single second-first light emitting area PXA2*r*, two second-second light emitting areas PXA2*g*, and a single second-third light emitting area PXA2*b* may form a repeating unit. For example, in the repeating unit, the size occupied by the two second color filters 322*g* may be the largest, the size occupied by the single first color filter 322*r* may be the next largest, and the size occupied by the single third color filter 322*b* may be the smallest. As an example, a size ratio of the first color filter 322*r*, the second color filters 322*g*, and the third color filter 322*b* in the repeating unit may be 29:54:17.

The size of each of the first, second, and third color filters 322*r*, 322*g*, and 322*b* may be determined according to a color of reflected light of the electronic device EDE (refer to FIG. 1A). Accordingly, the size of the light emitting area may not be in proportion with the size of the color filter corresponding to the light emitting area.

Figure 19C:
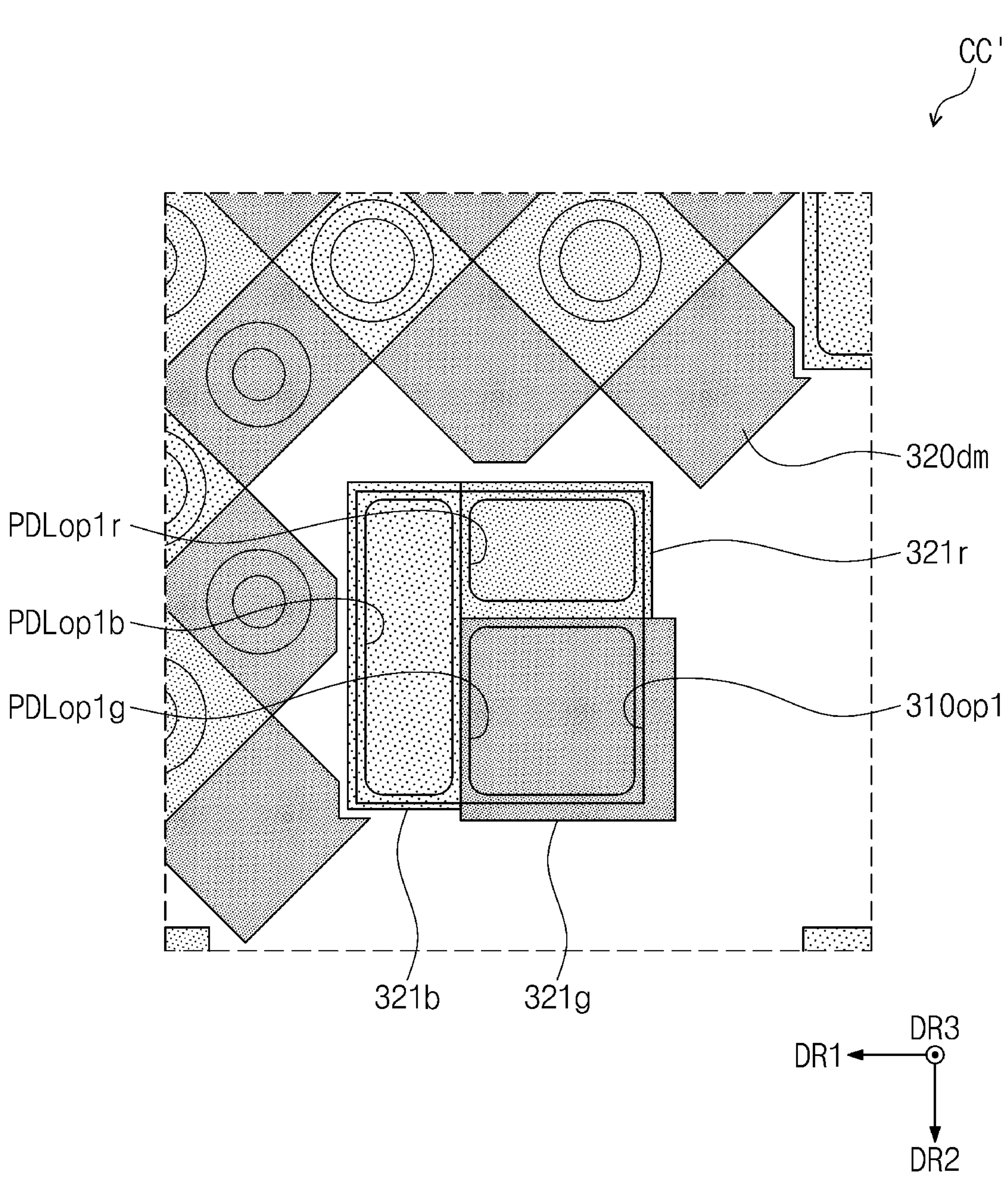
FIG. 19C is a schematic enlarged plan view of a portion of a display panel according to an embodiment.

FIG. 19C is a schematic enlarged plan view of a portion of the display panel according to an embodiment. FIG. 19C is a schematic enlarged plan view of a portion CC' shown in FIG. 18.

Referring to FIGS. 18 and 19C, the color filters 320 (refer to FIG. 7A) may further include a dummy color filters 320*dm* disposed at a boundary area between the first area A1 and the intermediate area AM or disposed adjacent to the boundary area between the first area A1 and the intermediate area AM. The dummy color filters 320*dm* may have the same color as the second color filter 321*g*. The dummy color filters 320*dm* may be provided to optimize the color of reflected light of the electronic device EDE (refer to FIG. 1A), and the dummy color filters 320*dm* may be omitted.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. An electronic device comprising:

a display panel comprising a first area comprising a transmission area and an element area and a second area spaced apart from the first area, the display panel comprising:

a base layer;

a barrier layer disposed on the base layer, the barrier layer comprising:

a first lower light blocking layer disposed in the first area, and a second lower light blocking layer disposed in the second area, the first lower light blocking layer and the second lower light blocking layer disposed on a same layer;

a circuit layer disposed on the barrier layer, the circuit layer comprising:

a first pixel circuit disposed in the first area, and a second pixel circuit disposed in the second area;

an element layer disposed on the circuit layer, the element layer comprising:

a first light emitting element electrically connected to the first pixel circuit, and a second light emitting element electrically connected to the second pixel circuit; and an encapsulation layer disposed on the element layer, wherein the circuit layer further comprises a plurality of conductive layers, a plurality of inorganic layers, and a plurality of organic layers, the plurality of organic layers comprises a common organic layer commonly disposed in the transmission area and the element area, and a first thickness of the common organic layer in the transmission area is smaller than a second thickness of the common organic layer in the element area.

2. The electronic device of claim 1, wherein the first lower light blocking layer is electrically insulated from the second lower light blocking layer.

3. The electronic device of claim 1, wherein a constant voltage having a certain voltage level is provided to the first lower light blocking layer, and a power source voltage provided to the second pixel circuit is provided to the second lower light blocking layer.

4. The electronic device of claim 1, wherein the barrier layer further comprises:

a first sub-barrier layer disposed on the base layer;

a second sub-barrier layer disposed on the first sub-barrier layer;

a third sub-barrier layer disposed on the second sub-barrier layer;

a fourth sub-barrier layer disposed on the third sub-barrier layer;

a fifth sub-barrier layer disposed on the fourth sub-barrier layer, and the first lower light blocking layer and the second lower light blocking layer are disposed between the fourth sub-barrier layer and the fifth sub-barrier layer.

5. The electronic device of claim 4, wherein the fifth sub-barrier layer has a thickness greater than a sum of a thickness of the first sub-barrier layer, a thickness of the second sub-barrier layer, a thickness of the third sub-barrier layer, and a thickness of the fourth sub-barrier layer.

6. The electronic device of claim 1, wherein each of the first lower light blocking layer and the second lower light blocking layer comprises molybdenum.

7. The electronic device of claim 1, wherein each of the first lower light blocking layer and the second lower light blocking layer comprises:

a first sub-lower light blocking layer comprising titanium; and a second sub-lower light blocking layer disposed on the first sub-lower light blocking layer and comprising molybdenum.

8. The electronic device of claim 1, wherein the display panel further comprises an intermediate area defined between the first area and the second area, the circuit layer further comprises a third pixel circuit disposed in the intermediate area, the element layer further comprises a third light emitting element electrically connected to the third pixel circuit and a copy light emitting element electrically connected to the third pixel circuit, and the first lower light blocking layer and the second lower light blocking layer do not overlap the copy light emitting element.

9. The electronic device of claim 8, wherein the copy light emitting element comprises a pixel electrode that is connected to a pixel electrode of the third light emitting element and is integral with the pixel electrode of the third light emitting element.

10. The electronic device of claim 8, wherein the copy light emitting element is disposed closer to the first light emitting element than the third light emitting element is.

11. The electronic device of claim 1, wherein the first thickness of the common organic layer in the transmission area is equal to or greater than about 40% and smaller than about 100% of the second thickness of the common organic layer in the element area.

12. The electronic device of claim 1, wherein the first thickness of the common organic layer in the transmission area is equal to or greater than about 6,000 angstroms and equal to or smaller than about, 10,000 angstroms, and the second thickness of the common organic layer in the element area is about 15,000 angstroms.

13. The electronic device of claim 1, wherein the plurality of inorganic layers does not overlap the transmission area.

14. The electronic device of claim 1, wherein the display panel further comprises:

a buffer layer disposed between the base layer and the circuit layer, wherein the buffer layer does not overlap the transmission area.

15. The electronic device of claim 1, wherein the display panel further comprises:

an intermediate area defined between the first area and the second area;

a pixel definition layer disposed on the circuit layer, the pixel definition layer including a plurality of pixel definition openings defined therethrough to define a plurality of light emitting areas;

a first spacer disposed on the pixel definition layer and disposed in the second area and the intermediate area;

a plurality of first protruded spacers disposed on the first spacer and disposed in the second area;

a second spacer disposed on the pixel definition layer and disposed in the first area; and a second protruded spacer disposed on the second spacer, and the plurality of first protruded spacers does not overlap the intermediate area.

16. An electronic device comprising:

a display panel comprising a first area comprising a transmission area and an element area and a second area spaced apart from the first area, the display panel comprising:

a base layer;

a barrier layer disposed on the base layer, the barrier layer comprising:

a first lower light blocking layer disposed in the first area, and a second lower light blocking layer disposed in the second area, the first lower light blocking layer and the second lower light blocking layer disposed on a same layer;

a circuit layer disposed on the barrier layer, the circuit layer comprising:

a first pixel circuit disposed in the first area, and a second pixel circuit disposed in the second area;

an element layer disposed on the circuit layer, the element layer comprising:

a first light emitting element electrically connected to the first pixel circuit, and a second light emitting element electrically connected to the second pixel circuit; and an encapsulation layer disposed on the element layer, wherein the barrier layer further comprises a plurality of sub-barrier layers comprising an upper sub-barrier layer closest to the circuit layer, the upper sub-barrier layer of the plurality of sub-barrier layers has a thickness greater than a thickness of each other sub-barrier layer of the plurality of sub-barrier layers, and the first lower light blocking layer and the second lower light blocking layer are disposed under the upper sub-barrier layer.

* * * * *